US008288783B2

(12) United States Patent
Kinomoto

(10) Patent No.: US 8,288,783 B2
(45) Date of Patent: Oct. 16, 2012

(54) LIGHT EMITTING DEVICE AND IMAGE DISPLAY DEVICE

(75) Inventor: Junichi Kinomoto, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 205 days.

(21) Appl. No.: 12/839,132

(22) Filed: Jul. 19, 2010

(65) Prior Publication Data

US 2011/0101387 A1 May 5, 2011

(30) Foreign Application Priority Data

Aug. 7, 2009 (JP) ................................ 2009-184837

(51) Int. Cl.
*H01L 29/20* (2006.01)

(52) U.S. Cl. ............... 257/89; 257/98; 257/99; 438/116

(58) Field of Classification Search .................... 257/89, 257/98, 99; 438/116
See application file for complete search history.

(56) References Cited

U.S. PATENT DOCUMENTS

| | | | | |
|---|---|---|---|---|
| 7,029,935 | B2 * | 4/2006 | Negley et al. | 438/29 |
| 7,679,277 | B2 * | 3/2010 | Morioka et al. | 313/486 |
| 7,687,800 | B1 * | 3/2010 | Kar et al. | 257/14 |
| 7,733,571 | B1 * | 6/2010 | Li | 359/630 |
| 7,819,539 | B2 * | 10/2010 | Kim et al. | 362/84 |
| 2007/0096128 | A1 | 5/2007 | Fukudome et al. | |
| 2010/0140641 | A1 * | 6/2010 | Kinomoto et al. | 257/98 |

FOREIGN PATENT DOCUMENTS

| | | | |
|---|---|---|---|
| JP | 2006-83259 | A | 3/2006 |
| JP | 2006-83260 | A | 3/2006 |
| JP | 2006-310131 | A | 11/2006 |
| JP | 2006-321966 | A | 11/2006 |
| JP | 2007-103512 | A | 4/2007 |
| JP | 2007-146154 | A | 6/2007 |

* cited by examiner

*Primary Examiner* — Jarrett Stark
*Assistant Examiner* — Nicholas Tobergte
(74) *Attorney, Agent, or Firm* — Birch, Stewart, Kolasch & Birch, LLP

(57) ABSTRACT

By a light emitting device including a light emitting element, and a semiconductor phosphor microparticle having a core/shell structure having a shell part absorbing at least a part of the light emitted by the light emitting element, and an image display device including a light emitting element, and a semiconductor phosphor microparticle having a core/shell structure having a shell part that absorbs at least a part of the light emitted by the light emitting element, a light emitting device and an image display device having high luminous efficiency are provided.

25 Claims, 28 Drawing Sheets

LIGHT EMITTING DEVICE AND IMAGE DISPLAY DEVICE

This nonprovisional application is based on Japanese Patent Application No. 2009-184837 filed on Aug. 7, 2009 with the Japan Patent Office, the entire contents of which are hereby incorporated by reference.

BACKGROUND OF THE INVENTION

1. Field of the Invention

The present invention relates to a light emitting device and an image display device having a light emitting element and a phosphor. The semiconductor light emitting device and image display device in the present invention may be used for various use applications including a light source for display, an alternate light source for a small bulb, a backlight light source for a liquid crystal display panel, general illumination, decorative illumination, a luminescence display device, a display, and a projector.

2. Description of the Background Art

In recent years, the light emitting diode (LED) element that is formed of a gallium nitride-based compound semiconductor material attracts a great deal of interest. The light emitting diode element is characterized by small size, light weight, energy saving, long product life time, resistance to repeated ON/OFF lighting and so on. Therefore, by combining a light emitting diode element radiating blue light or ultraviolet light with various phosphors emitting part of light radiated from the light emitting diode device as an excitation source, light emitting devices outputting light of the colors including white that are different from that of the light emitting by the LED chip are developed. Such a light emitting device is a promising illumination device alternative to an incandescent lamp, a fluorescent lamp and the like.

As a phosphor used in such a light emitting device, a semiconductor phosphor microparticle attracts interests as an alternative to a conventionally used rare earth activated phosphor. The semiconductor phosphor microparticle allows arbitrary control of emission wavelength that was not realized by conventional phosphors. Therefore, a light emitting device using such a semiconductor phosphor microparticle is able to have various emission spectrums. This technique is a promising technique that enables fabrication of a light emitting device having a high color rendering property and high efficiency.

Fabrication of a light emitting device including a semiconductor light emitting element and a semiconductor phosphor microparticle as described above is currently studied and disclosed, for example, in Japanese Patent Laying-Open No. 2007-103512 (Patent document 1). Patent document 1 discloses a light emitting device wherein rare earth activated phosphors are used as blue and green phosphors, and semiconductor phosphor microparticles are used as yellow and red phosphors.

On the other hand, an organic electric-field light emitting element using an organic substance is greatly expected for applications as a surface light emitting element and a large area full color display device, and developed actively. However, the conventional organic electric-field light emitting element is difficult to be brought into practical use because of its low luminous efficiency.

SUMMARY OF THE INVENTION

However, the light emitting device described in Patent document 1 was difficult to realize high luminous efficiency because of concentration quenching of a semiconductor phosphor microparticle.

The present invention was devised in light of the aforementioned circumstances, and it is an object of the present invention to provide a light emitting device and an image display device having high luminous efficiency.

As a result of diligent efforts about a light emitting device having high luminous efficiency, the inventors of the present invention revealed that a light emitting device having high luminous efficiency can be provided by having a light emitting element, and a semiconductor phosphor microparticle of a core/shell structure having a shell part that absorbs at least a part of the light emitted by the light emitting element.

According to the present invention, it is possible to provide a light emitting device having high luminous efficiency, and an image display device using the same.

A light emitting device of the present invention includes a light emitting element, and a semiconductor phosphor microparticle having a core/shell structure having a core part and a shell part that covers the core part and absorbs at least a part of the light emitted by the light emitting element.

Preferably, in the light emitting device of the present invention, bandgap energy of the shell part of the semiconductor phosphor microparticle is smaller than light energy emitted from the light emitting element.

Preferably, in the light emitting device of the present invention, bandgap energy of the shell part of the semiconductor phosphor microparticle is larger than bandgap energy of the core part.

Preferably, the light emitting device of the present invention includes two or more kinds of semiconductor phosphor microparticles having different peak wavelengths of an emission spectrum. In this case, more preferably, bandgap energy of the shell part of the semiconductor phosphor microparticle is larger than bandgap energy of the core part of any of the semiconductor phosphor microparticles.

Preferably, in the light emitting device of the present invention, a half-value width of an emission spectrum of the core part of the semiconductor phosphor microparticle is 80 nm or more.

Further preferably, in the light emitting device of the present invention, standard deviation of particle diameter distribution of the core part of the semiconductor phosphor microparticle is 20% or more of mean particle diameter of the core part of the semiconductor phosphor microparticle.

Preferably, in the light emitting device of the present invention, the core part of the semiconductor phosphor microparticle is a group II-VI semiconductor material or a group III-V semiconductor material. In this case, more preferably, the core part of the semiconductor phosphor microparticle is formed of ternary or higher mixed crystal. Further preferably, the core part of the semiconductor phosphor microparticle is either of InP, InGaP, InN, and InGaN.

Preferably, in the light emitting device of the present invention, the shell part of the semiconductor phosphor microparticle is ZnSe or SiC.

Preferably, in the light emitting device of the present invention, the semiconductor phosphor microparticle has a plurality of shell parts.

Preferably, in the light emitting device of the present invention, the semiconductor phosphor microparticle is covered with a translucent member.

Preferably, in the light emitting device of the present invention, the light emitting element is a semiconductor light emitting diode element or a semiconductor laser diode element. In this case, preferably, the semiconductor light emitting diode element or the semiconductor laser diode element is formed of a GaN-based material.

In the light emitting device of the present invention, the light emitting element may be an organic electroluminescence element.

Preferably, in the light emitting device of the present invention, an emission spectrum of the light emitting element has a peak wavelength in the range of 420 to 480 nm.

Further, in the light emitting device of the present invention, an emission spectrum of the light emitting element may have a peak wavelength in the range of 350 to 420 nm.

Preferably, the light emitting device of the present invention includes a blue luminescent light emitting element, and a red luminescent semiconductor phosphor microparticle and a green luminescent semiconductor phosphor microparticle.

Further, the light emitting device of the present invention may include a UV to blue-violet luminescent light emitting element, a blue luminescent semiconductor phosphor microparticle, a green luminescent semiconductor phosphor microparticle and a red luminescent semiconductor phosphor microparticle.

The present invention also provides an image display device including: a light emitting element, and a semiconductor phosphor microparticle having a core/shell structure having a core part and a shell part that covers the core part and absorbs at least a part of light emitted by the light emitting element.

Preferably, in the image display device of the present invention, a half-value width of an emission spectrum of the core part of the semiconductor phosphor microparticle is 40 nm or less.

Preferably, in the image display device of the present invention, standard deviation of particle diameter distribution of the core part of the semiconductor phosphor microparticle is 15% or less of mean particle diameter of the core part of the semiconductor phosphor microparticle.

Preferably, the image display device of the present invention includes a white light emitting device including the light emitting element and the semiconductor phosphor microparticle, and a color filter.

Preferably, the image display device of the present invention also includes the light emitting element, and a wavelength conversion member including the semiconductor phosphor microparticle.

The foregoing and other objects, features, aspects and advantages of the present invention will become more apparent from the following detailed description of the present invention when taken in conjunction with the accompanying drawings.

DETAILED DESCRIPTION OF THE INVENTION

<Light Emitting Device>

A light emitting device in the present invention basically includes a light emitting element, and a semiconductor phosphor microparticle having a core/shell structure, and is characterized in that excitation light of a light source is absorbed in a shell part of the semiconductor phosphor microparticle. With such a configuration, the present invention is able to provide an excellent light emitting device realizing both color rendering property and luminous efficiency.

In the light emitting device of the present invention, as a light emitting element, a semiconductor light emitting element such as a semiconductor light emitting diode element or a semiconductor light emitting laser diode element, an organic electroluminescence element, an inorganic electroluminescence element, a discharge lamps such as xenon lamp, a fluorescent lamp and the like may be used. In the light emitting device of the present invention, at least a part of luminescence from the light emitting element is absorbed by a shell part of the semiconductor phosphor microparticle. The semiconductor phosphor microparticle having absorbed the light emits light having a wavelength different from that of the absorbed light from a core part. As a result, the light emitting device emits light in which transmitted light of the light emitting element and fluorescent light of the semiconductor phosphor microparticle are mixed.

Figure 1:
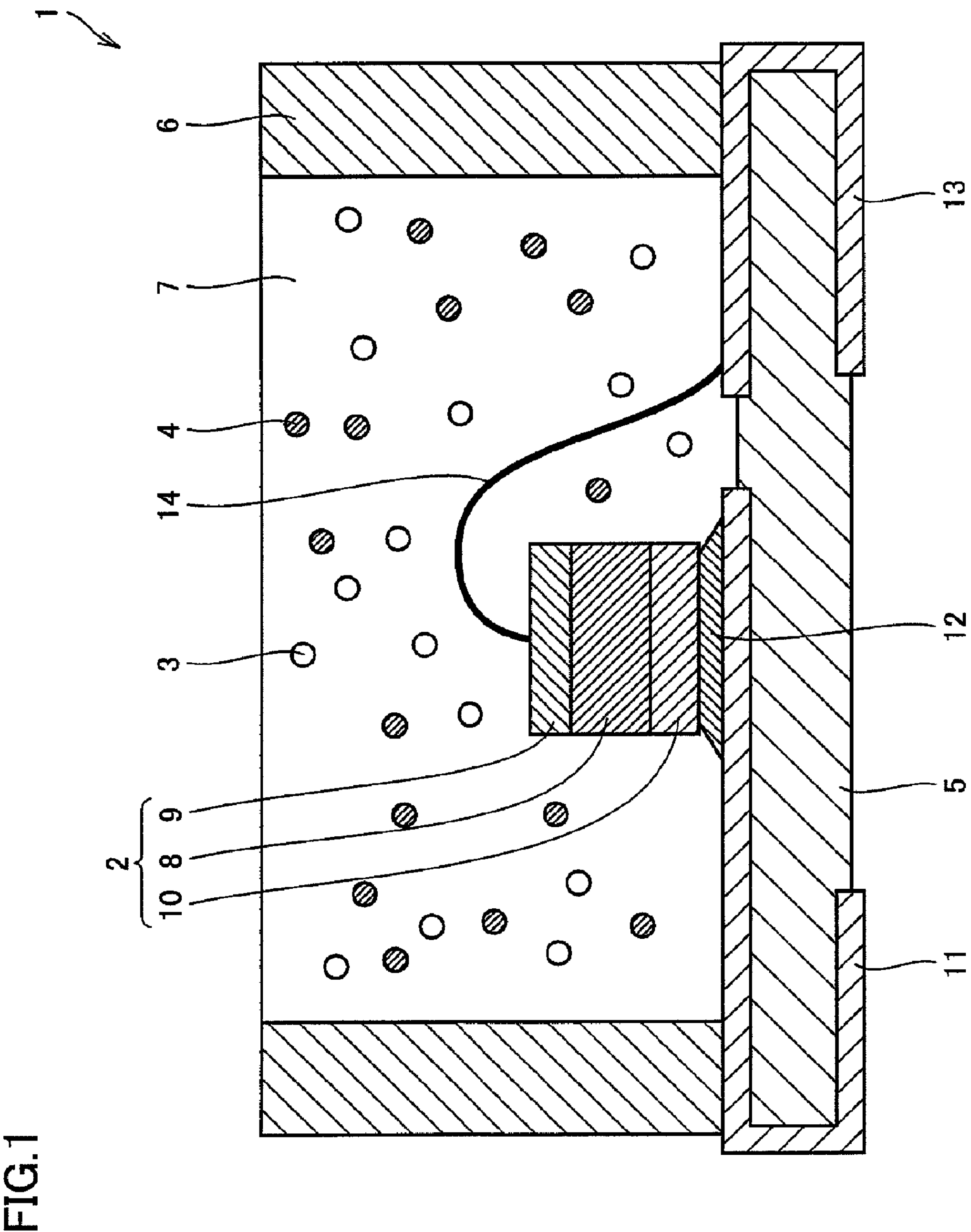
FIG. 1 is a section view schematically showing a light emitting device 1 according to a first preferred example of the present invention.

FIG. 1 is a section view schematically showing a light emitting device 1 of a preferred first example of the present invention. The light emitting device 1 in the example shown in FIG. 1 shows an example in which combination of a semiconductor light emitting diode element 2 as a light emitting element, and semiconductor phosphor microparticles 3, 4 are used. In light emitting device 1 in the example shown in FIG. 1, semiconductor light emitting diode element 2 and a resin frame 6 are placed on a printed circuit board 5 serving as a base. Inside resin frame 6, a mold resin 7 of a translucent resin in which a plurality of semiconductor phosphor microparticles 3, 4 are dispersed is packed to form a translucent member, and semiconductor light emitting diode element 2 is sealed by this mold resin 7. At least a part of the light emitted from semiconductor light emitting diode element 2 is absorbed by shell parts of semiconductor phosphor microparticles 3, 4. Semiconductor phosphor microparticles 3, 4 having absorbed the light will emit light having a wavelength different from that of the absolved light from core parts. As a result, light emitting device 1 emits the light in which transmitted light of semiconductor light emitting diode element 2 and fluorescent light of semiconductor phosphor microparticles 3, 4 are mixed.

Semiconductor light emitting diode element 2 in the example shown in FIG. 1 is one of the elements that utilize luminescence characteristics of a semiconductor material having a property of emitting light at the time of rebinding of an electron and a hole. As shown in FIG. 1, for example, semiconductor light emitting diode element 2 has such a structure that a p-side electrode 9 is disposed on the upper face side of a semiconductor active layer 8 and a n-side electrode 10 is disposed on the lower face side of semiconductor active layer 8 in such a manner that they sandwich semiconductor active layer 8. N-side electrode 10 is electrically connected to an n electrode part 11 extending from the top face to the back face of printed circuit board 5 via an adhesive 12 having conductivity. Also p-side electrode 9 is electrically connected to a p electrode 13 extending from the top face to the back face of printed circuit board 5 separately from n electrode part 11 as described above, via a metal wire 14.

Figure 2:
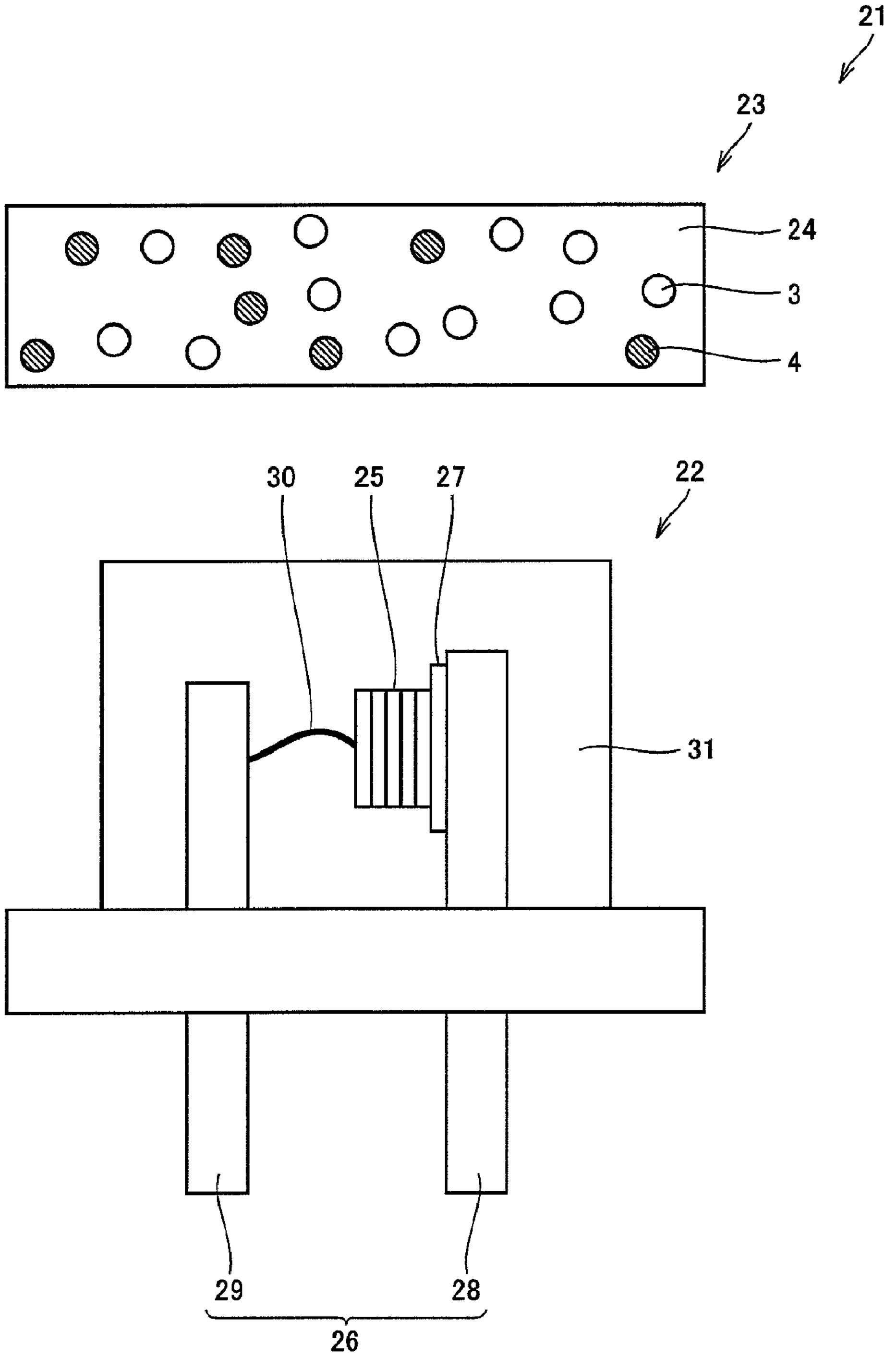
FIG. 2 is a section view schematically showing a light emitting device 21 according to a second preferred example of the present invention.

FIG. 2 is a section view schematically showing a light emitting device 21 of a second preferred example of the present invention. The part having a configuration similar to that of light emitting device 1 in the example shown in FIG. 2 is denoted by the same reference numeral, and description thereof will be omitted. Light emitting device 21 in the example shown in FIG. 2 shows an example in which combination of a semiconductor light emitting laser diode element 22 as a light emitting element and semiconductor phosphor microparticles 3, 4 is used. In the example shown in FIG. 2, a wavelength conversion member 23 is disposed on a light outgoing face of packaged semiconductor light emitting laser diode element 22. Wavelength conversion member 23 includes a plurality of semiconductor phosphor microparticles 3, 4 dispersed in a translucent member 24. At least a part of the light emitted from semiconductor light emitting laser diode element 22 is absorbed in shell parts of semiconductor phosphor microparticles 3, 4. Semiconductor phosphor microparticles 3, 4 having absorbed light will emit light having a wavelength different from that of the absorbed light from core parts. As a result, light emitting device 21 emits light in which transmitted light of semiconductor light emitting laser diode element 22 and fluorescent light of semiconductor phosphor microparticles 3, 4 are mixed.

Likewise the semiconductor light emitting diode element described above, semiconductor light emitting laser diode element 22 in the example shown in FIG. 2 is one of the elements that utilize luminous characteristics of a semiconductor material having a property of emitting light at the time of rebinding of an electron and a hole. As shown in FIG. 2, in semiconductor light emitting laser diode element 22, a semiconductor laser chip 25 is disposed on a heat sink system 26. Semiconductor laser chip 25 has such a structure that a semiconductor active layer which is a light emitting part is disposed in such a manner that semiconductor laser chip 25 is sandwiched between a p-type semiconductor and a n-type semiconductor, and further between a p-type electrode and a n-type electrode. Semiconductor laser chip 25 is jointed to heat sink system 26 via a Si submount 27. A solder is used for joining semiconductor laser chip 25 and Si submount 27, and a silver paste or a solder is used for joining Si submount 27 and heat sink system 26. Thereafter, an electrode of semiconductor laser chip 25 is electrically connected to terminal pins 28, 29 of the heat sink system via a gold wire 30. Then a wind cap 31 having a glass window through which laser light outgoes is joined to heat sink system 26.

As the semiconductor light emitting element such as semiconductor light emitting diode element 2 (FIG. 1) or semiconductor light emitting laser diode element 22 (FIG. 2) as described above, those conventionally known and having general compositions, for example, a GaN-based semiconductor light emitting element, a ZnSe-based semiconductor light emitting element, a SiC-based semiconductor light emitting element and the like may be used. Among these, a GaN-based semiconductor light emitting element is particularly preferably used because a light emitting device having high luminous efficiency and high practicability is realizable.

In the light emitting device of the present invention, it is preferred to use a semiconductor light emitting element having a peak wavelength of an emission spectrum in a wavelength range of 420 to 480 nm. This is because when the peak wavelength of the emission spectrum of the semiconductor light emitting element falls within a wavelength range of 420 to 480 nm, transmitted light of the light emitting element can be used directly as blue light of the light emitting device (and an image display device as will be described later). In the present invention, it is preferred to use a semiconductor light emitting element having a peak wavelength of an emission spectrum in a wavelength range of 440 to 460 nm. The semiconductor light emitting element having the peak wavelength of the emission spectrum in a wavelength range of 440 to 460 nm realizes an image display device having improved color reproducibility and luminous efficiency because wavelength integrity with the blue color filter (see FIG. 7) is high when it is applied to in an image display device as will be described later.

The semiconductor light emitting element in the present invention may have a peak wavelength of an emission spectrum in a wavelength range of 390 to 420 nm. A GaN-based semiconductor light emitting element which is a preferred semiconductor light emitting element in the present invention is excellent in that a light emitting element having high luminous efficiency in a wavelength range of 390 to 420 nm can be easily fabricated.

Figure 3:
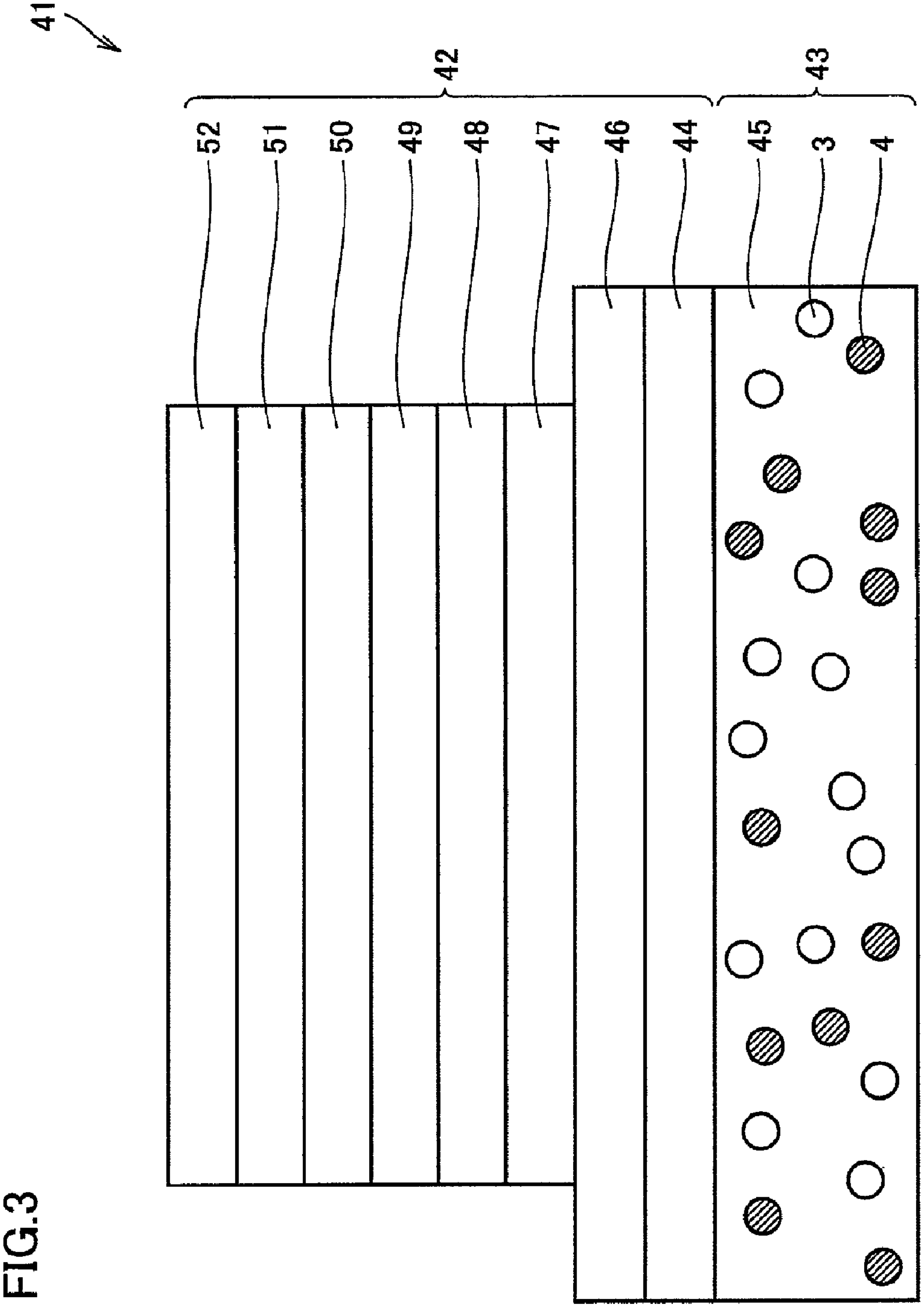
FIG. 3 is a section view schematically showing a light emitting device 41 according to a third preferred example of the present invention.

FIG. 3 is a section view schematically showing a light emitting device 41 of a third preferred example of the present invention. The part having a similar configuration as that of light emitting devices 1, 21 in the examples shown in FIG. 1 and FIG. 2 is denoted by the same reference numeral, and description thereof will be omitted. Light emitting device 41 in the example shown in FIG. 3 shows an example in which combination of an organic electroluminescence element 42 as a light emitting element and semiconductor phosphor microparticles 3, 4 is used. Light emitting device 41 in the example shown in FIG. 3 includes organic electroluminescence element 42 fabricated on a substrate 44, and a wavelength conversion member 43 fabricated on the back face of substrate 44. Wavelength conversion member 43 is formed of a translucent member 45 in which semiconductor phosphor microparticles 3, 4 are dispersed. At least a part of the light emitted from organic electroluminescence element 42 is absorbed by shell parts of semiconductor phosphor microparticles 3, 4. Semiconductor phosphor microparticles 3, 4 having absorbed light will emit light having a wavelength different from that of absorbed light from core parts. As a result, light emitting device 41 emits light in which transmitted light of organic electroluminescence element 42 and fluorescent light of semiconductor phosphor microparticles 3, 4 are mixed.

Organic electroluminescence element 42 in the example shown in FIG. 3 has such a structure that an anode 46 is disposed on substrate 44, and a hole injection layer 47, a hole transport layer 48, a light emitting layer 49, an electron transport layer 50, an electron injection layer 51, and a cathode 52 are sequentially formed on anode 46.

Light emitting layer 49 in organic electroluminescence element 42 is a layer having a function of emitting light by rebinding of a hole and an electron by receiving a hole from hole transport layer 48 and an electron from electron transport layer 50 at the time of application of voltage. Light emitting layer 49 preferably contains a host material, and a dopant formed of a phosphorescence material. As the host material, a charge transport material (generic term of electron transport material and hole transport material) is preferred, and further preferably a hole transport material and an electron transport material are contained.

Energy level of the lowest multiplet excited state of the host material is preferably larger than energy level of the lowest multiplet excited state of a dopant material. By co-vapor deposition of the host material and the dopant material, it is possible to suitably form a light emitting layer in which the host material is doped with the dopant material. Concrete examples of the host material include those having a pyrene skeleton, those having a carbazole skeleton, those having a diarylamine skeleton, those having a pyridine skeleton, those having a pyrazine skeleton, those having a triazine skeleton, and those having an arylsilane skeleton.

Generally, the phosphorescence material contained in the light emitting layer is preferably a complex containing a transition metal atom or a lanthanoid atom. One kind or combination of two or more kinds of phosphorescence materials may be used. Examples of the transition metal atom include, but are not limited to, preferably ruthenium, rhodium, palladium, tungsten, rhenium, osmium, iridium and platinum, and more preferably rhenium, iridium and platinum. As a lanthanoid atom, lanthanum, cerium, praseodymium, neodymium, samarium, europium, cadolinium, terbium, dysprosium, holmium, erbium, thulium, ytterbium and lutecium are recited. Among these lanthanoid atoms, neodymium, europium and cadolinium are preferred. Concrete examples of a phosphorescence material satisfying the above condition include FIrpic: bis[2-(4,6-difluorophenyl)pyridinato]picolinato irridium (III), FIr6: bis[2-(4', 6'-difluorophenyl)pyridinate-N,C2']tetrakis (1-pyrazolyl)borate, and Ir(ppy)3: trisphenyl pyridinato irridium (III).

Hole injection layer 47 and hole transport layer 48 are layers having a function of receiving a hole from an anode or anode side and transporting it to the cathode side. Hole injection layer 47 and hole transport layer 48 are preferably layers that include concretely as a hole transport material, carbazole derivative, triazole derivative, oxazole derivative, oxadiazole derivative, imidazole derivative, polyaryl alkane derivative, pyrazoline derivative, pyrazolone derivative, phenylene diamine derivative, aryl amine derivative, amine substituted chalcone derivative, stylyl anthracene derivative, fluorenone derivative, hydrazone derivative, stilbene derivative, silazane derivative, aromatic tertiary amine compound, styryl amine compound, aromatic dimethylidene-based compound, porphyrin-based compound, organic silane derivative, carbon and the like.

Electron injection layer 51 and electron transport layer 50 are layers having a function of receiving an electron from a cathode or a cathode side and transporting it to the anode side. The electron injection layer and the electron transport layer are preferably layers containing, concretely as an electron transport material, various metal complexes represented by metal complexes of triazole derivative, oxazole derivative, oxadiazole derivative, imidazole derivative, fluorenone derivative, anthraquinodimethane derivative, anthorone derivative, diphenylquinone derivative, thiopyran dioxide derivative, carbodiimide derivative, fluorenylidene methane derivative, distyryl pyrazine derivative, aromatic tetracarbonate anhydride such as naphthalene and perylene, phthalocyanine derivative, 8-quinolinol derivative, and metal phthalocyanine, metal complexes having a ligand of benzoxazole or benzothiazole, organic silane derivative and so on. Among these, an electron transport layer containing an aromatic hetero cyclic compound having at least one hetero atom in the molecule as an electron transport material is preferred. The aromatic hetero cyclic compound refers to a hetero compound having aromaticity, and pyridine, pyrazine, pyrimidine, pyridazine, triazine, pyrazole, imidazole, benzimidazole, triazole, thiazole, benzothiazole, isothiazole, benzisothiazole and thiadiazole or condensed rings thereof are recited.

Usually, shape, structure, size and the like of anode 46 are not particularly limited as far as a function as an electrode that supplies hole injection layer 47 with a hole is realized, and a known electrode material may be appropriately selected depending on use application and purpose of the organic electroluminescence element. Material of anode 46 is preferably a transparent material. In this case, luminescence of light emitting layer 49 from the anode side can be taken out without any loss.

As a material forming anode 46, for example, metal, alloy, metal oxide, and conductive compound or mixtures thereof are preferably recited, a material having a work function of 4.0 eV or higher is preferred. Concrete examples of the anode material include tin oxide doped with antimony or fluorine (ATO, FTO), conductive metal oxides such as tin oxide, zinc oxide, indium oxide, indium tin oxide (ITO), and indium zinc oxide (IZO), metals such as gold, silver, chromium and nickel, mixtures or laminates of such metal and conductive metal oxide, inorganic conductive substances such as copper iodide and copper sulfide, organic conductive materials such as polyaniline, polythiophene and polypyrrole, and laminates of these and ITO. Among these, conductive metal oxides are preferred, and in particular, from the view points of productivity, high conductivity, transparency and the like, ITO is preferred.

Also, a thin film transistor (TFT) may be incorporated in anode 46. This case is preferred in fabricating an image display device using an organic electroluminescence element because ON/OFF can be controlled using the TFT.

Usually, shape, structure, size and the like of cathode 52 are not particularly limited as far as a function as an electrode that injects an electron into electron injection layer 51 is realized, and a known electrode material may be appropriately selected depending on use application and purpose of the light emitting element.

As a material forming cathode 52, for example, metal, alloy, metal oxide, and conductive compound or mixtures thereof are recited, a material having a work function of 4.5 eV or lower is preferred. Concrete examples include alkaline metals (e.g., Li, Na, K, Cs and so on), alkaline earth metals (e.g., Mg, Ca and so on), gold, silver, lead, aluminum, sodium-potassium alloy, lithium-aluminum alloy, magnesium-silver alloy, and rare earth metals such as indium and ytterbium. These may be used singly, however, two or more kinds are preferably used from the view point of realizing both stability and electron injection property.

Substrate 44 has a function as a supporting base body of the organic electroluminescence element. Also substrate 44 is preferably a substrate that will not scatter or attenuate the light emitted from light emitting layer 49. Concrete examples include inorganic materials such as yttrium stabilized zirconia (YSZ) and glass, and organic materials including polyesters such as polyethylene terephthalate, polybutylene terephthalate and polyethylene naphtharate, polystyrene, polycarbonate, polyethersulfone, polyarylate, polyimide, polycyclooleofine, norbornene resin, and poly(chlorotrifluoro ethylene).

In the light emitting device of the present invention, from the view point of ability of efficiently exciting green to red luminescent semiconductor phosphor microparticles, the emission wavelength of the organic electroluminescence element is preferably 520 nm or less. From the view point that transmitted light of the light emitting element can be directly used as blue light of the light emitting device (and later-described image display device), the emission wavelength of the organic electroluminescence element is preferably 420 nm or higher. This case is advantageous in that the structure of the light emitting device is simplified and production is facilitated. More preferably, as an organic electroluminescence element in the present invention, it is preferred to have a peak wavelength of an emission spectrum in a wavelength range of 440 to 460 nm. This realizes an image display device having improved color reproducibility and luminous efficiency because wavelength integrity with the blue color filter (see FIG. 7) is high when it is applied in an image display device as will be described later.

Next, a semiconductor phosphor microparticle used in the present invention will be described in detail.

The term semiconductor phosphor microparticle in the present invention refers to that having a function of absorbing at least a part of excitation light and emitting light having a wavelength different from that of the excitation light. The semiconductor phosphor microparticle in the present invention is formed of a semiconductor microcrystal having a particle size of a core part which is a light emitting part of about several nanometers. Such a semiconductor microparticle is also called a colloidal particle, nanoparticle, or quantum dot. In the following a semiconductor phosphor microparticle in the present invention will be described.

Figure 4:
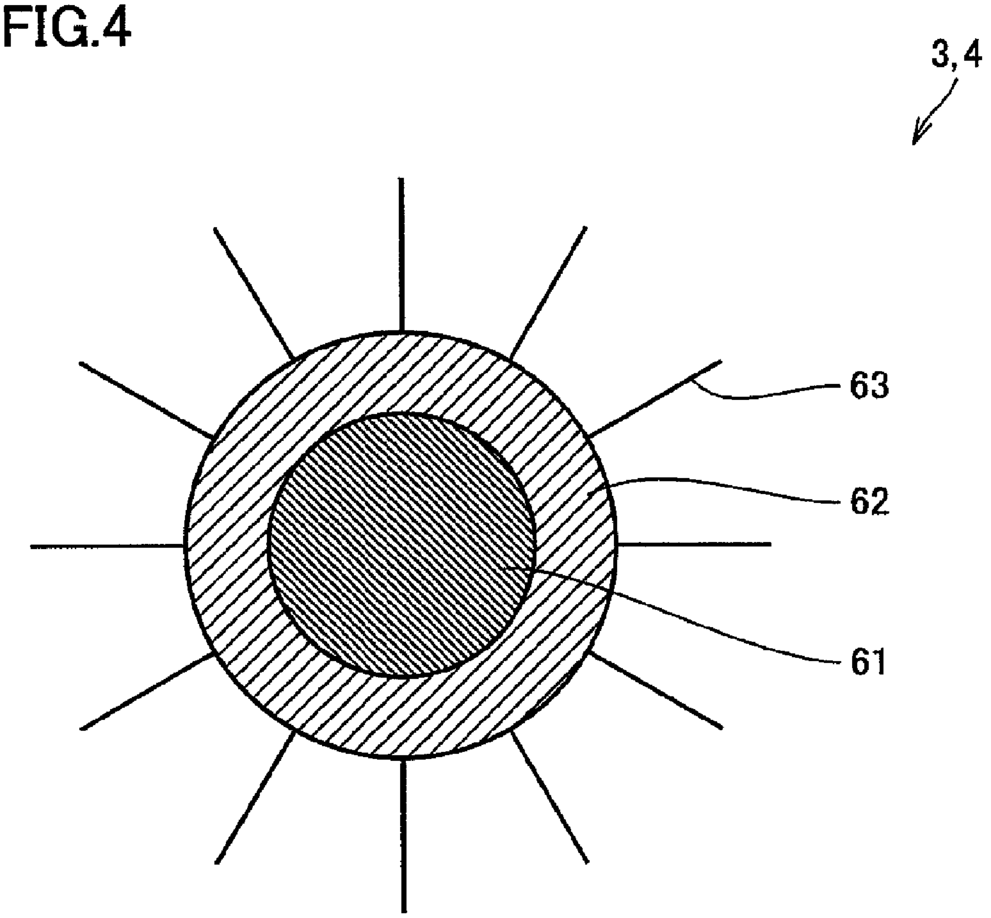
FIG. 4 is a section view schematically showing one example of semiconductor phosphor microparticles 3, 4 having a core/shell structure in the present invention.

The semiconductor phosphor microparticle in the present invention has a core/shell structure and is characterized by absorbing excitation light in a shell part. Here, the term core/shell structure refers to a structure in which at least a part of a surface of a core part is covered with a shell part. FIG. 4 is a section view schematically showing one example of semiconductor phosphor microparticles 3, 4 having a core/shell structure in the present invention. The semiconductor phosphor microparticle having a core/shell structure has such a structure that at least a part of a surface of a core part 61 formed of a semiconductor material is covered with a shell part 62. Here, core part 61 is a light emitting part emitting light as a result of rebinding of an electron and a hole. Shell part 62 is formed of a material different from that of core part 61. The semiconductor phosphor microparticle in the present invention absorbs excitation light in shell part 62 upon irradiation with excitation light. An electron and a hole are generated as shell part 62 absorbs light. At least a part of the generated electrons and holes move to a core part where they rebind to emit light. Shell part 62 also has a protecting function for protecting adverse affect exerted on core part 61 from the external world. Preferably, shell part 62 has bandgap energy higher than that of core part 61, and has a function of confining an electron and a hole of a core part. This case is advantageous in that the loss of electrons and holes due to non-luminous transition can be reduced, and luminous efficiency is improved.

To the surface of the semiconductor phosphor microparticle in the present invention, an organic compound 63 may be bound. Organic compound 63 is excellent in that a function of controlling dispersibility in dispersing semiconductor microparticles into liquid or solid can be added. Organic compound 63 may further have a function of confining an electron inside a semiconductor microparticle, a function of protecting a semiconductor microparticle from adverse affect received from the external world, and a function of suppressing aggregation of semiconductor microparticles.

The core/shell structure of semiconductor phosphor microparticle in the present invention may have a multi-shell structure made up of a plurality of shell parts. As a concrete example of the multi-shell structure, a core/shell/shell structure in which another shell part B is formed on outer surface of shell part A covering the core part is exemplified. This case is preferred in that durability of the semiconductor phosphor microparticle having shell part B is further improved because shell part B protects shell part A. The core/shell structure of semiconductor phosphor microparticle in the present invention may have a shell/core/shell structure in which there is shell part A in the center, a core part is formed on the surface of shell part A, and shell part B is further formed on the outer surface of the core part. In this case, since the core part is surrounded by shell parts A, B, an electron confining effect is exerted more effectively than by a core/shell structure, and luminous efficiency can be further improved.

A method of examining a structure of the semiconductor phosphor microparticle may be any known method, and for example, direct observation by means of a transmission electron microscope (TEM) is exemplified.

Shape of the semiconductor phosphor microparticle in the present invention may be any shape, and for example, sphere, column, cube, regular tetrahedron and the like are exemplified. Among these, a sphere is particularly preferred because of a small proportion of surface area, relative to the volume. When the proportion of surface area is small, probability of non-luminous transition in the surface is small, so that a semiconductor phosphor microparticle having high luminous efficiency is obtained.

The semiconductor phosphor microparticle in the present invention is characterized by capability of controlling emission wavelength. This is because a quantum confining effect arising when a particle size of semiconductor crystal is reduced to twice or less the Bohr radius is utilized. As for a core part of a semiconductor phosphor microparticle, bandgap energy of the core part varies due to the quantum confining effect depending on the particle diameter. Therefore, it is advantageous in that emission wavelength can be controlled by controlling bandgap energy using particle diameter. Using a mixed crystal in the semiconductor microparticle core part is further preferred because emission wavelength can be controlled also by the mixed crystal ratio.

Luminous wavelength of the semiconductor phosphor microparticle in the present invention is not particularly limited, but is preferably in a visible light wavelength range. This is because when a semiconductor phosphor microparticle having an emission wavelength in a visible light wavelength range is used, a light emitting device (and image display device as will be described later) having excellent characteristics can be realized. As concrete examples of emission wavelength of the semiconductor phosphor microparticle, a wavelength range of 420 to 490 nm for a blue luminescent phosphor, a wavelength range of 500 to 565 nm for a green luminescent phosphor, a wavelength range of 565 to 585 nm for a yellow luminescent phosphor, and a wavelength range of 595 to 720 nm for a red luminescent phosphor are exemplified.

As a method of examining a peak wavelength of an emission spectrum of a semiconductor phosphor microparticle, a photoluminescence measurement, a cathode luminescence measurement, an electroluminescence measurement and the like are exemplified. By measuring the emission spectrum according to such measurement, a peak wavelength can be determined.

A half-value width of an emission spectrum of a semiconductor phosphor microparticle in the present invention is not particularly limited, but a wider half-value width is preferred from the view point of production of a light emitting device. This is because when the half-value width of the emission spectrum is large, a light emitting device having high color rendering property can be realized with less kinds of semiconductor phosphor microparticles. Concretely, the half-value width of the emission spectrum is preferably 40 nm or more, more preferably 60 nm or more, and particularly preferably 80 nm or more.

As a method of examining the half-value width of the emission spectrum of a semiconductor phosphor microparticle, photoluminescence measurement, cathode luminescence measurement, electroluminescence measurement and the like are exemplified. By the measuring the emission spectrum according to such measurement, a half-value width of an emission peak can be calculated.

The semiconductor phosphor microparticle in the present invention absorbs at least a part of the excitation light emitted from a light source, in a shell part. As a result, the semiconductor phosphor microparticle emits light. As a method of examining absorption characteristics of the semiconductor phosphor microparticle, measurement of an absorption spectrum by a spectrophotometer or the like is exemplified.

Band gap of a core part of the semiconductor phosphor microparticle of the present invention can assume any value, but is preferably 2.9 eV or less. When the bandgap of the core part of the semiconductor phosphor microparticle exceeds 2.9 eV, luminosity factor of human greatly decreases, to lead a problem that characteristics of the light emitting device and the image display device are impaired. As a method of examining bandgap of a core part, a method of determining by calculation from the material and mean particle diameter of the core part, and a method of determining from emission and absorption characteristics are recited.

Mean particle diameter (diameter) of a core part of the semiconductor phosphor microparticle in the present invention is preferably twice or less the Bohr radius. When the mean particle diameter (diameter) of the core part is twice or less the Bohr radius, quantum confining effect is obtained, and bandgap energy can be varied. Here, Bohr radius of InP, InN and CdSe is 8.3 nm, 7.0 nm, and 4.9 nm, respectively.

As a method of determining a mean particle diameter of a core part of the semiconductor phosphor microparticle, dynamic scattering method (DLS), a method of measuring by a powder X-ray diffraction (XRD: X-ray diffraction) apparatus, and direct observation by a transmission electron microscope are exemplified. In the powder X-ray diffraction apparatus, mean particle diameter of crystal can be determined from the obtained half-value width of diffraction peak of the crystal using a Scherrer formula. In a transmission electron microscope, mean particle diameter of crystals can be examined by measuring particle diameters of arbitrary 20 particles, and calculating a mean particle diameter through statistical processing.

As a method of adjusting mean particle diameter of a core part of the semiconductor phosphor microparticle, a conventionally known classification method may be used, and as such a classification method, for example, electrophoresis method, size selection precipitation method, light-assisted etching method and so on are recited.

Variation in mean particle diameter of a core part of the semiconductor phosphor microparticle in the present invention will largely influence on the half-value width of the emission spectrum. Concretely, when the variation in mean particle diameter is large, the half-value width of the emission spectrum increases. Therefore, it is necessary to control the particle diameter distribution so that requested the half-value width of the emission spectrum is achieved.

From the view point of improving the color rendering property of the light emitting device of the present invention, standard deviation of particle diameter distribution of a core part of the semiconductor phosphor microparticle is preferably 15% or higher, and more preferably 20% or higher of the mean particle diameter of the core part of the semiconductor phosphor microparticle. This is because when standard deviation of the particle diameter distribution of the core part of the semiconductor phosphor microparticle is large, an emission spectrum becomes continuous, and the color rendering property tends to increase.

As the method of examining particle diameter distribution of a core part of the semiconductor phosphor microparticle, any appropriate known method may be used without any limitation, and dynamic scattering method, and direct observation by means of a transmission electron microscope can be exemplified. As a method of measuring particle diameter distribution using a transmission electron microscope, standard deviation of mean particle diameter of a core part can be examined by measuring particle diameters of for example, 20 particles.

As a method of adjusting particle diameter distribution of the core part of the semiconductor phosphor microparticle, a conventionally known classification method can be used as is the case with control of mean particle diameter.

Band gap energy of a shell part of the semiconductor phosphor microparticle in the present invention is preferably smaller than light energy of light emitted from the light emitting element (excitation light). This is because the excitation light is absorbed in the shell part.

Band gap energy of the shell part of the semiconductor phosphor microparticle in the present invention is preferably larger than bandgap energy of the core part. This allows efficient transport of electrons and holes to the core part and suppression of reabsorption of fluorescence emitted from the core part by the shell part. When the shell part absorbs fluorescence emitted from the core part, loss of fluorescence by self absorption arises to cause deterioration in luminous efficiency.

As a method of examining bandgap of the shell part of the semiconductor phosphor microparticle, a method of calculating from the material of the core part, a method of determining from emission-absorption characteristics and the like are recited.

A shape of the shell part of the semiconductor phosphor microparticle in the present invention may be any shape, but it is preferred to cover the entire surface of the core part. This is because high luminous efficiency is realized in a semiconductor phosphor microparticle having a core/shell structure in which the entire surface of the core part is covered. This is because a defect existing in the surface of the core part is inactivated by being covered with the shell part.

The core part of the semiconductor phosphor microparticle in the present invention is characterized by being formed of a semiconductor material. As a material of such a core part of the semiconductor phosphor microparticle, for example group IV semiconductor material, group IV-IV semiconductor material, group III-V semiconductor material, group II-VI semiconductor material, group I-VIII semiconductor material, and group IV-VI semiconductor material are exemplified. Among these, the core part of the semiconductor phosphor microparticle is preferably formed of a group II-VI semiconductor material or a group III-V semiconductor material because of the high chemical stability and excellent environmental resistance.

As the number of crystals mixed in a core part of the semiconductor phosphor microparticle in the present invention, a simple substance semiconductor formed of one kind of element, a binary compound semiconductor formed of two kinds of elements, and a mixed crystal semiconductor formed of three or more kinds of elements may be used. However, from the view point of improving the luminous efficiency of the light emitting device, the core part of the semiconductor phosphor microparticle is preferably formed of a direct transition-type semiconductor material. A core part of the semiconductor phosphor microparticle is preferably the one that emits visible light. More preferably, a core part of the semiconductor phosphor microparticle is formed of a mixed crystal semiconductor material because the peak wavelength of the emission spectrum can be readily controlled. On the other hand, from the view point of easiness of production, a core part of the semiconductor phosphor microparticle is preferably formed of quaternary or less mixed crystal. From the view point of controllability of the peak wavelength of the emission spectrum, the core part of the semiconductor phosphor microparticle in the present invention is particularly preferably a semiconductor phosphor microparticle formed of ternary or more mixed crystal.

As a semiconductor phosphor microparticle formed of a binary compound used as the core part of the semiconductor phosphor microparticle, for example, InP, InN, InAs, GaAs, CdSe, CdTe, ZnSe, ZnTe, PbS, PbSe, PbTe, CuCl and so on can be recited. However, from the view point of safety on human body and environmental load, InP or InN is more preferred used. From the view point of easiness of production, CdSe or CdTe is preferably used. As a ternary mixed crystal semiconductor phosphor microparticle, for example, InGaP, AlInP, InGaN, AlInN, ZnCdSe, ZnCdTe, PbSSe, PbSTe, PbSeTe and so on can be recited, and from the view point of capability of fabricating a semiconductor phosphor microparticle which is environment-friendly material and is unsusceptible to the external world, it is preferred to use a group III-V mixed crystal semiconductor phosphor microparticle formed of InGaP or InGaN.

The shell part of the semiconductor phosphor microparticle in the present invention is characterized by being formed of a semiconductor material. As such a shell part material, for example, a group IV semiconductor material, a group IV-IV semiconductor material, a group III-V compound semiconductor material, a group II-VI compound semiconductor material, a group I-VIII compound semiconductor material, a group IV-VI compound semiconductor material and the like are exemplified. As for the number of mixed crystals, a simple substance semiconductor formed of one kind of element, a binary compound semiconductor formed of two kinds of elements, and a mixed crystal semiconductor formed of three or more kinds of elements may be used. However, from the view point of improving the luminous efficiency of the light emitting device, a semiconductor material having higher bandgap energy than the core part is preferred as a material of the shell part. From the view point of the protecting function of the core part, a group III-V compound semiconductor material having strong bonding power of atoms and high chemical stability is preferred. On the other hand, from the view point of easiness of production, it is preferred to use a semiconductor phosphor microparticle formed of quaternary or less mixed crystal.

As a semiconductor phosphor microparticle formed of a binary compound used as such a semiconductor phosphor microparticle shell part, for example, AlP, GaP, AlN, GaN, AlAs, ZnO, ZnS, ZnSe, ZnTe, MgO, MgS, MgSe, MgTe, CuCl and so on can be recited. However, from the view point of safety on human body and environmental load, it is preferred to use AlP, GaP, AlN, GaN, ZnO, ZnS, ZnSe, ZnTe, MgO, MgS, MgSe, MgTe, CuCl, or SiC. As a semiconductor phosphor microparticle shell part of ternary mixed crystal, for example, AlGaN, GaInN, ZnOS, ZnOSe, ZnOTe, ZnSSe, ZnSTe, ZnSeTe and so on are recited, and from the view point of capability of fabricating a semiconductor phosphor microparticle which is environment-friendly material and is unsusceptible to the external world, it is preferred to use AlGaN, GaInN, ZnOS, ZnOTe, or ZnSTe.

As a method of measuring a material constituting the core part and the shell part of the semiconductor phosphor microparticle, powder X-ray diffraction method, electron beam diffraction method, X-ray photoelectron spectrometry and the like are exemplified.

Outside the shell part of the semiconductor phosphor microparticle in the present invention may be covered with an organic compound. This case is advantageous in that a function such as dispersibility may be imparted to the semiconductor phosphor microparticle by the organic compound. Also the organic compound may have a function of confining an electron inside a semiconductor phosphor microparticle, a function of protecting a semiconductor phosphor microparticle from adverse affect received from the external world, and a function of suppressing aggregation of semiconductor phosphor microparticles. As such an organic compound, an organic compound consisting of an alkyl group which is a functional part, and a binding part for a shell part of a semiconductor phosphor microparticle is preferred, and as concrete examples, an amine compound, phosphine compound, phosphine oxide compound, thiol compound, fatty acid and the like are exemplified. Examples of the phosphine compound include tributylphosphine, trihexylphosphine, and trioctylphosphine. Examples of the phosphine oxide compound include 1-dichlorophosphinol heptane, 1-dichlorophosphinol nonane, t-butyl phosphonic acid, tetradecyl phosphonic acid, dodecyldimethylphosphine oxide, dioctylphosphine oxide, didecylphosphine oxide, tributylphosphine oxide, tripentylphosphine oxide, trihexylphosphine oxide, and trioctylphosphine oxide. Examples of the thiol compound include tributyl sulfide, trihexyl sulfide, trioctyl sulfide, 1-heptyl thiol, 1-octyl thiol, 1-nonane thiol, 1-decane thiol, 1-undecane thiol, 1-dodecane thiol, 1-tridecane thiol, 1-tetradecane thiol, 1-pentadecane thiol, 1-hexadecane thiol, 1-octadecane thiol, dihexyl sulfide, diheptyl sulfide, dioctyl sulfide, and dinonyl sulfide. Examples of the amine compound include heptyl amine, octyl amine, nonyl amine, decyl amine, undecyl amine, dodecyl amine, tridecyl amine, tetradecyl amine, hexadecyl amine, octadecyl amine, oleyl amine, dioctyl amine, tributyl amine, tripentyl amine, trihexyl amine, triheptyl amine, trioctyl amine, and trinonyl amine. Examples of the fatty acid include lauric acid, myristic acid, palmitic acid, stearic acid and oleic acid.

As a method of examining an organic compound material covering the semiconductor phosphor microparticle, infrared spectrometry (IR), nuclear magnetic resonance (NMR) and the like are exemplified.

A method of synthesizing a semiconductor phosphor microparticle in the present invention may be a conventionally known method, and for example, a vapor phase synthetic method, a liquid phase synthetic method, a solid phase synthetic method, and a vacuum synthetic method are recited. From the view point of applicability for mass production, a liquid phase synthetic method is more preferred, and in the liquid phase synthetic method, from the view point of capability of synthesizing a semiconductor phosphor microparticle having high luminous efficiency, in particular, synthetic methods such as a hot soap method, an inverse micelle method, solvothermal method, a coprecipitation method and the like is more preferably used.

The light emitting device of the present invention preferably contains two or more kinds of semiconductor phosphor microparticles from the view point of color reproducibility. On the other hand, from the view point of the luminous efficiency, the number of kinds of the semiconductor phosphor microparticles contained in the light emitting device of the present invention is preferably four or less. Therefore, the number of kinds of the semiconductor phosphor microparticles contained in the light emitting device of the present invention is particularly preferably two or more and four or less. On the other hand, from the view point of luminous efficiency and easiness of production, the semiconductor phosphor microparticle contained in the light emitting device is preferably one kind. When the number of kind of the semiconductor phosphor microparticle contained in the light emitting device is one, there arises a problem that color reproducibility is impaired because only part of wavelength range of visible light can be reproduced. However, when only one kind of semiconductor phosphor microparticle is contained in the light emitting device, reabsorption of fluorescence does not occur between phosphors, so that the luminous efficiency increases. Containing only one kind is advantageous in that production is facilitated because chromaticity adjustment by adjusting the amount of phosphor is facilitated. On the other hand, when the number of kinds of the semiconductor phosphor microparticles is four or more, there arises a problem that deterioration in luminous efficiency is significant due to absorption of fluorescence between phosphors.

A translucent member in the light emitting device of the present invention represents the one that has a function of not absorbing luminescence of the light emitting element and the semiconductor phosphor microparticle. A material not allowing permeation of moisture and oxygen is more preferred. In this case, since the influence that the semiconductor phosphor microparticle receives from moisture and oxygen can be alleviated by the translucent material, the light emitting device (and later-described image display device) using the translucent material has improved durability. As a material of the translucent member satisfying the aforementioned condition, for example, translucent resins such as silicone resin, epoxy resin, acryl resin, fluorine resin, polycarbonate resin, polyimide resin and urea resin, and translucent inorganic materials such as aluminum oxide, silicon oxide and yttria can be exemplified. As a method of identifying the material of the translucent member, X-ray photoelectron spectrometry or the like is exemplified.

As a preferred combination between the light emitting element and the semiconductor phosphor microparticle in the light emitting device of the present invention, a light emitting device having a blue luminescent light emitting element (more preferably, a blue luminescent semiconductor light emitting element) and one kind of semiconductor phosphor microparticle (for example, yellow luminescent semiconductor phosphor microparticle) is exemplified. This case is advantageous in that a light emitting device having luminous efficiency can be realized.

As a preferred combination, a light emitting device having a blue luminescent light emitting element (more preferably, a blue luminescent semiconductor light emitting element) and two kinds of semiconductor phosphor microparticles (for example, red luminescent semiconductor phosphor microparticle and green luminescent semiconductor phosphor microparticle) is also exemplified. This case is advantageous in that a light emitting device having high color reproducibility and high luminous efficiency can be realized.

Further, as a preferred combination, a light emitting device having a UV to blue-violet luminescent light emitting element (more preferably, a UV to blue-violet light emitting semiconductor light emitting element) and three kinds of semiconductor phosphor microparticles (for example, blue luminescent semiconductor phosphor microparticle, green luminescent semiconductor phosphor microparticle and red luminescent semiconductor phosphor microparticle) may be recited. This case is advantageous in that a light emitting device having high luminous efficiency can be realized because a UV to blue-violet light emitting light emitting element having high luminous efficiency can be used.

Also the light emitting device of the present invention may have a combination of a blue luminescent organic electroluminescence element and one kind of semiconductor phosphor microparticle (for example, yellow luminescent semiconductor phosphor microparticle), or a combination of a blue luminescent organic electroluminescence element and two kinds of semiconductor phosphor microparticles (for example, green luminescent semiconductor phosphor microparticle and red luminescent semiconductor phosphor microparticle). This case is advantageous in that a surface luminescent light emitting device can be readily fabricated.

Preferably, the light emitting device of the present invention has an emission spectrum containing light of blue wavelength of 420 to 480 nm, green wavelength of 500 to 550 nm, and red wavelength 580 to 650 nm. In the case of a later-described image display device, having a wavelength characteristic in conformance with a color filter is further preferred because an image display device having high color reproducibility and high luminous efficiency can be realized.

As an index for evaluating hue of the light emitting device, a color rendering property index is known. The color rendering property index refers to a quantitatively evaluated value of degree of difference in color of the emission spectrum of the light emitting device, based on the standard light defined by HS. For evaluating general hue averagely, an average color rendering property index (Ra) which is an average value of color rendering property indexes in several test colors is used. In the light emitting device of the present invention, the average color rendering property index (Ra) is preferably 70 or higher, and more preferably 75 or higher. Color rendering property index of the light emitting device may be determined by measuring the emission spectrum of the light emitting device.

Also as an index for evaluating brightness of a light emitting device, luminous efficiency is known. Luminous efficiency is a value calculated by output light quantity, with respect to input electric power, and is represented in lm/W. High luminous efficiency is preferred because bright illumination is achieved with small electric power. The light emitting device of the present invention preferably has a luminous efficiency of 15 lm/W or higher, and more preferably has a luminous efficiency of 20 lm/W or higher. As a method of measuring luminous efficiency of a light emitting device, a method of using a total luminous flux measuring apparatus or the like is exemplified.

The light emitting device of the present invention is not limited to the configurations as described above, and a conventionally known general structure may also be employed, and a similar effect is obtained by using a conventionally known light emitting element or structure.

<Image Display Device>

The present invention also provides an image display device having a feature similar to that of the light emitting device of the present invention as described above. The image display device of the present invention is characterized by having a light emitting element, and a semiconductor phosphor microparticle of a core/shell structure having a shell part that absorbs at least a part of the light emitted by the light emitting element.

The image display device of the present invention may be implemented to have a light emitting device of the present invention including a light emitting element and a semiconductor phosphor microparticle of a core/shell structure as described above, and a wavelength conversion part that converts wavelength of light emitted from the light emitting device of the present invention. This case is advantageous in that the structure is simple and production is easy. The image display device of the present invention may be implemented to have a light emitting element, and a wavelength conversion part including a wavelength conversion member containing a semiconductor phosphor microparticle of a core/shell structure as described above. This case is advantageous in that conversion loss is small and efficiency is high. The wavelength conversion part in the present invention refers to the one having a function of outputting only light of a specific wavelength upon incidence of light. As a method of realizing such a function, for example, a method of allowing certain wavelengths of input light to transmit, or a method of outputting light having a wavelength different from that of the input light is exemplified.

In the image display device of the present invention, output light emitted from the light emitting element is converted into light of each color by the semiconductor phosphor microparticle and the wavelength conversion part, and color tone of each pixel is expressed by this converted light. The image display device of the present invention is characterized in that excitation light of the light emitting element is absorbed in a shell part of the semiconductor phosphor microparticle. In the present invention, by having such a configuration, an image display device achieving both color reproducibility and screen brightness at high level can be realized.

Figure 5:
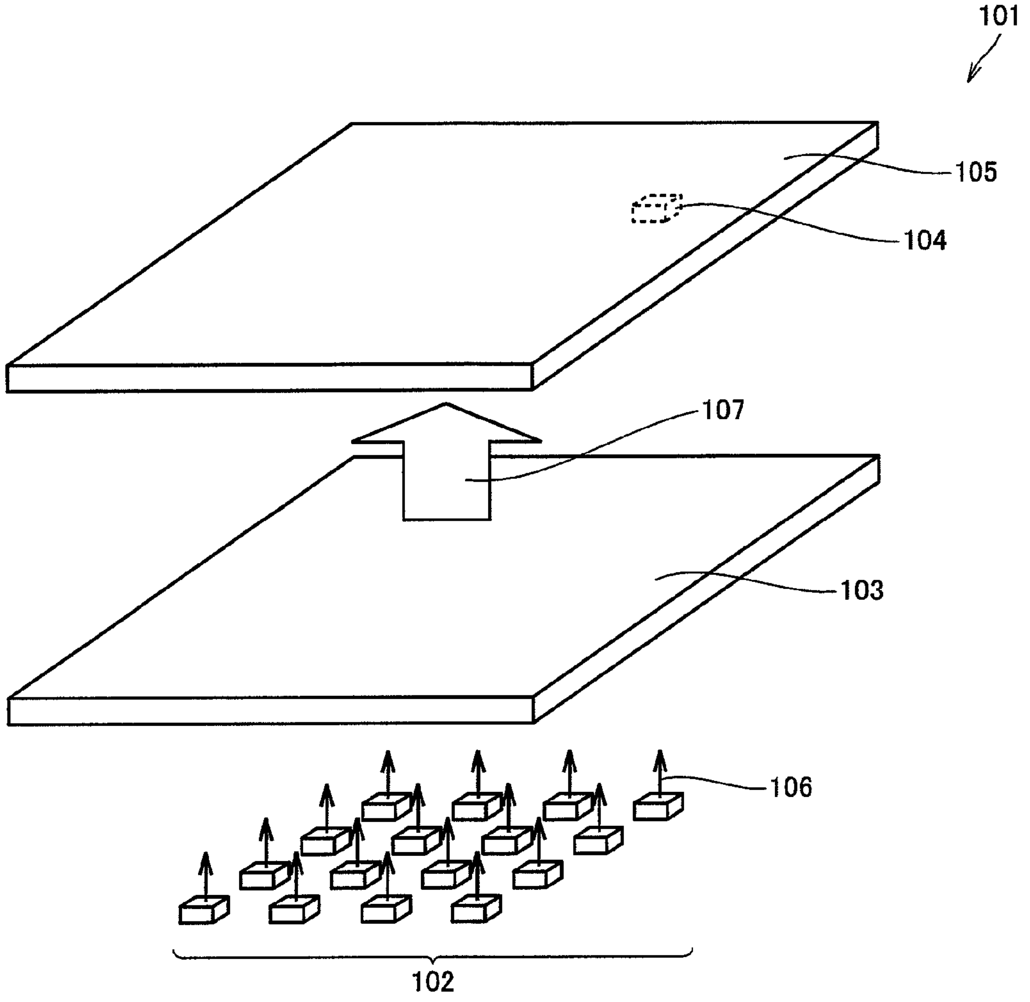
FIG. 5 is an exploded perspective view conceptually showing an image display device 101 of a first preferred example of the present invention.

FIG. 5 is an exploded perspective view schematically showing an image display device 101 of a first preferred example of the present invention. In image display device 101 in the example shown in FIG. 5, a plurality (16 in FIG. 5) of light emitting devices 102 (preferably, light emitting device 1 in the example shown in FIG. 1, or light emitting device 21 in the example shown in FIG. 2) are arranged as a light source on a lateral face of a transparent or translucent light conductive plate 103, and an image display part 105 made up of a plurality of wavelength conversion parts 104 is disposed adjacent to the top face of light conductive plate 103. In image display device 101 in the example shown in FIG. 5, output light 106 from light emitting device 102 is adapted to pass through light conductive plate 103, and applied to the entire surface of image display part 105 as light 107. Here, in image display device 101, light emitting device 102 exhibiting white light is used as a light source, and for display of each pixel, a color filter inside wavelength conversion part 104 is used, and for ON/OFF of each pixel, a thin-film transistor inside wavelength conversion part 104 is used. As light emitting device 102, light emitting devices 1, 21, 41 of the present invention having the configurations as shown in FIG. 1 to FIG. 3, for example, may be suitably used.

Figure 6:
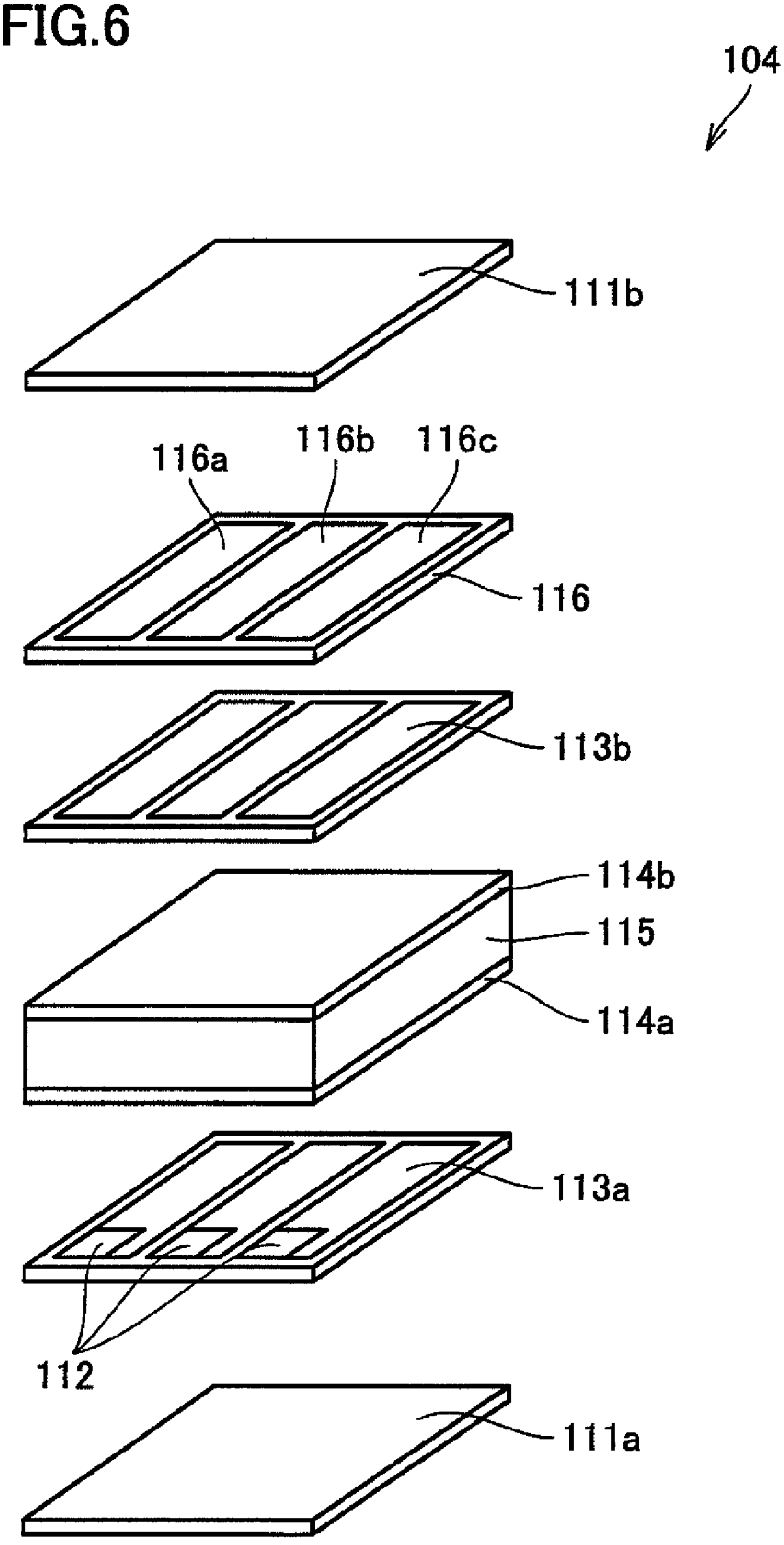
FIG. 6 is an exploded perspective view showing a wavelength conversion part 104 in an image display device 101 in the example shown in FIG. 5 in an enlarged manner.

Here, FIG. 6 is an exploded perspective view showing wavelength conversion part 104 in image display device 101 in the example shown in FIG. 5 in an enlarged manner. Wavelength conversion part 104 in the example shown in FIG. 6 is made up of a lower polarizing plate 111*a*, a transparent conductive film 113*a* (having thin-film transistor 112), an oriented film 114*a*, a liquid crystal layer 115, an oriented film 114*b*, an upper thin-film electrode 113*b*, a color filter 116, and an upper polarizing plate 111*b* that are laminated in this order. Color filter 116 consists of multiple kinds of color filters (three kinds of color filters 116*a*, 116*b*, 116*c* in FIG. 6), and each color filter allows transmission of light of a specific wavelength range. And each section of color filter is separated into a size corresponding to transparent conductive film 113*a*. In wavelength conversion part 104 in the example shown in FIG. 6, ON/OFF display is enabled by controlling light transmission from lower polarizing plate 111*a* to upper polarizing plate 111*b* by thin-film transistor 112. The wavelength conversion part having such a structure is also called a liquid crystal display.

Here, the color filter in the present invention refers to the one having a function of allowing transmission of light in a specific wavelength of input light. As a raw material of the color filter having such a function, dyes and pigments are exemplified. The color filter in the present invention preferably has three or more sections. This is because three sections allow reproduction of most of naturally occurring color tones in the image display part. For the three sections, color filters respectively allowing transmission of red, green and blue light can be suitably used.

Figure 7:
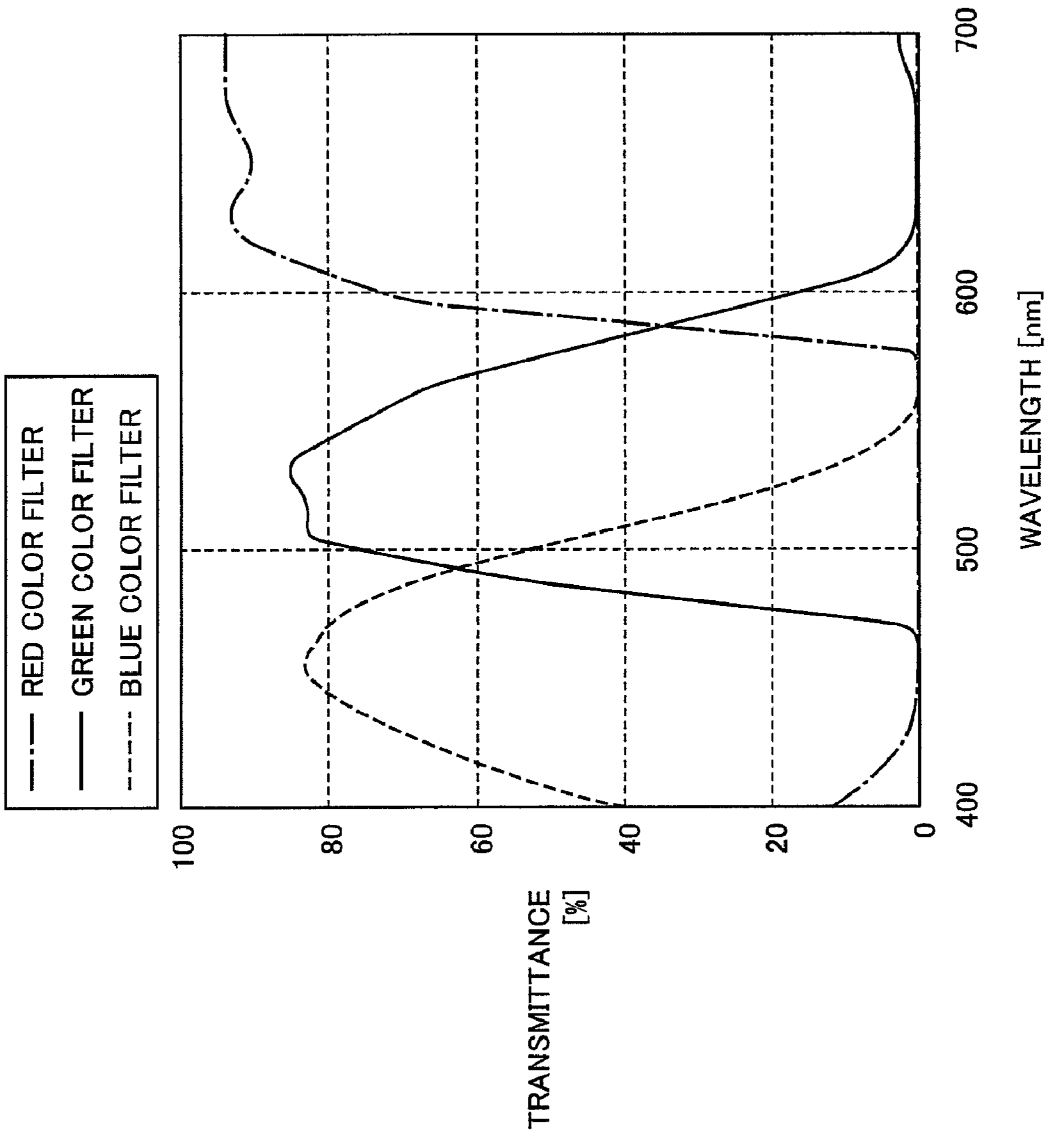
FIG. 7 is a graph showing a transmission spectrum of a red color filter, a transmission spectrum of a green color filter, and a transmission spectrum of a blue color filter of color filters used in the image display device of the present invention.

FIG. 7 is a graph showing a transmission spectrum of red color filter, a transmission spectrum of green color filter, and a transmission spectrum of blue color filter in color filters used in the image display device of the present invention, wherein the vertical axis represents transmissivity (%) and the horizontal axis represents wavelength (nm). Transmission spectrums of respective colors of the color filters used in the image display device of the present invention are not limited to those shown in the graph of FIG. 7, but conventionally known general color filters may also be used.

The light conductive plate used in the present invention, as is the example shown in FIG. 5 refers to the one having a function of alleviating the nonuniformity of in-plane brightness of light applied from the light source on the image display part. When there is nonuniformity in brightness in an in-plane direction in the light source of the image display device, brightness of the image display part becomes uneven in the in-plane direction. Therefore, by using the light conductive plate, light having uniform in-plane intensity can enter the image display part. As a light conductive plate having such a function, an acryl resin plate processed to have a surface asperity is exemplified. In such an acryl resin plate, since light is scattered by the surface asperity, light having uniform brightness in the in-plane direction can be outputted.

Figure 8:
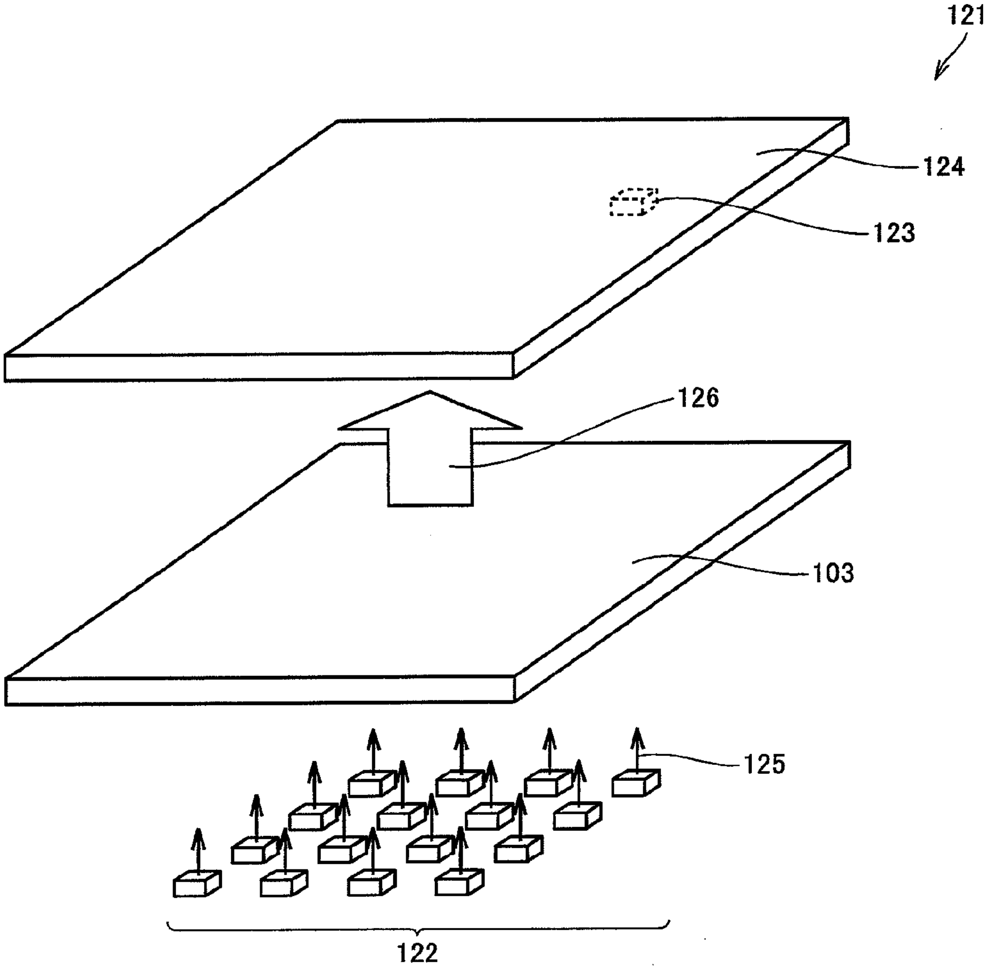
FIG. 8 is an exploded perspective view schematically showing an image display device 121 according to a second preferred example of the present invention.

FIG. 8 is an exploded perspective view schematically showing an image display device 121 according to a second preferred example of the present invention. The part having a similar configuration as that of image display device 101 in the example shown in FIG. 5 is denoted by the same reference numeral, and description thereof will be omitted. Image display device 121 in the example shown in FIG. 8 has almost the same configuration as image display device 101 in the example shown in FIG. 5, but is different in that a light emitting element 122 is used as a light source, and an image display part 124 is formed from a wavelength conversion part 123. In image display device 121 in the example shown in FIG. 8, on a lateral face of transparent or translucent light conductive plate 103, a plurality (16 in FIG. 8) of light emitting elements 122 are arranged as a light source, and image display part 124 made up of a plurality of wavelength conversion parts 123 are provided adjacently to the top face of light conductive plate 103. In image display device 121 of the example shown in FIG. 8, output light 125 from light emitting element 122 is adapted to pass through light conductive plate 103, and applied on the entire surface of image display part 124 as light 126. In image display device 121 in the example shown in FIG. 8, the semiconductor light emitting element as described above may suitably be used as light emitting element 122 which is a light source, and for display of each pixel, a wavelength conversion member inside wavelength conversion part 123 is used, and for ON/OFF of each pixel, a thin-film transistor inside wavelength conversion part 123 is used.

Figure 9:
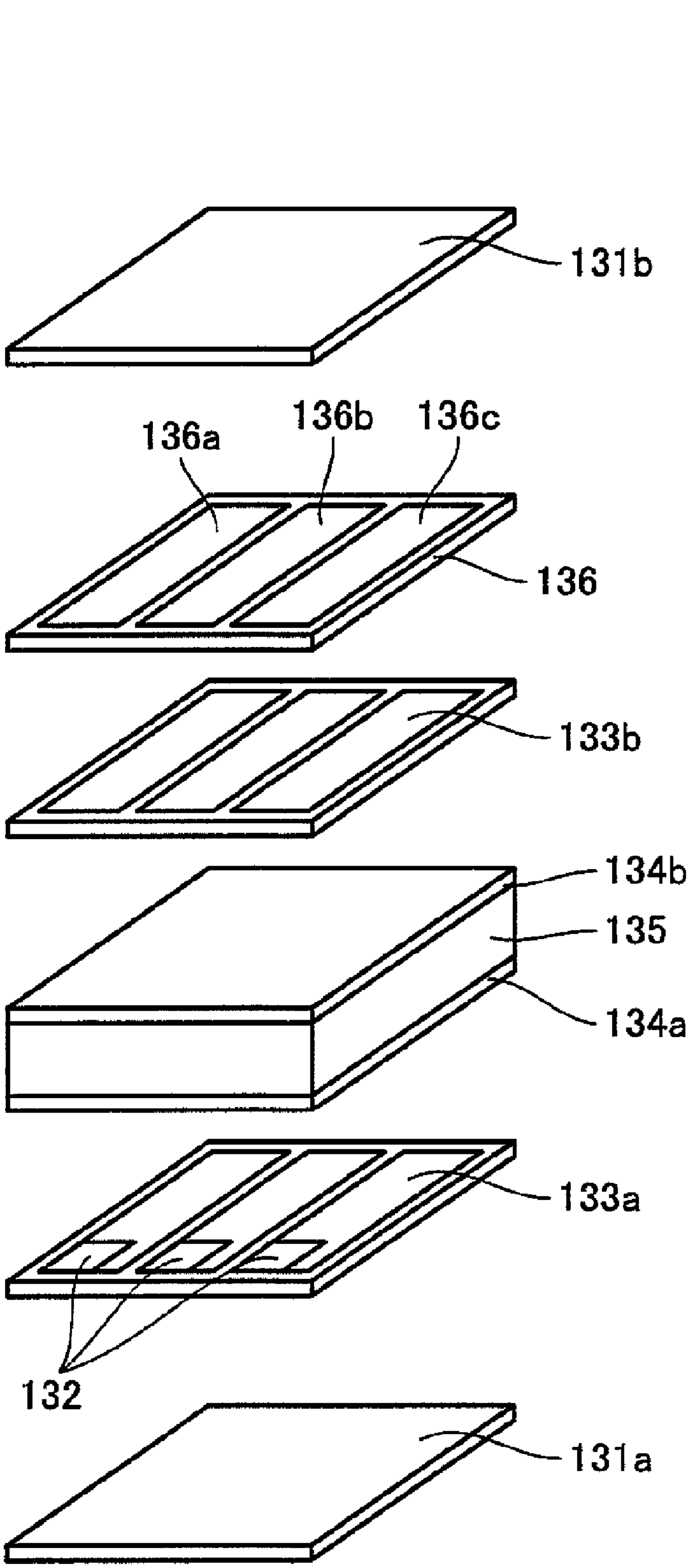
FIG. 9 is an exploded perspective view showing a wavelength conversion part 123 in image display device 121 in the example shown in FIG. 8 in an enlarged manner.

Here, FIG. 9 is an exploded perspective view showing wavelength conversion part 123 in image display device 121 in the example shown in FIG. 8 in an enlarged manner. Wavelength conversion part 123 in the example shown in FIG. 9 has almost the same configuration as wavelength conversion part 104 in the example shown in FIG. 6, but is different in that there is a wavelength conversion member 136 in place of color filter 116. Here, the wavelength conversion member in the present invention refers to the one having a function of absorbing at least a part of input light and radiating light having a wavelength different from that of the input light. As a raw material of the wavelength conversion member having such a function, a semiconductor phosphor microparticle is exemplified. Wavelength conversion part 123 in the example shown in FIG. 9 includes a lower polarizing plate 131*a*, a transparent conductive film 133*a* (having thin-film transistor 132), an oriented film 134*a*, a liquid crystal layer 135, an oriented film 134*b*, an upper thin-film electrode 133*b*, a wavelength conversion member 136, and an upper polarizing plate 131*b* that are laminated in this order. Wavelength conversion member 136 is made up of multiple kinds of wavelength conversion members (three kinds of wavelength conversion members 136*a*, 136*b*, 136*c* in FIG. 9), and each wavelength conversion member emits light of a specific wavelength range. Each wavelength conversion member is divided into sections each corresponding to the size of transparent conductive film 133*a*.

Figure 10:
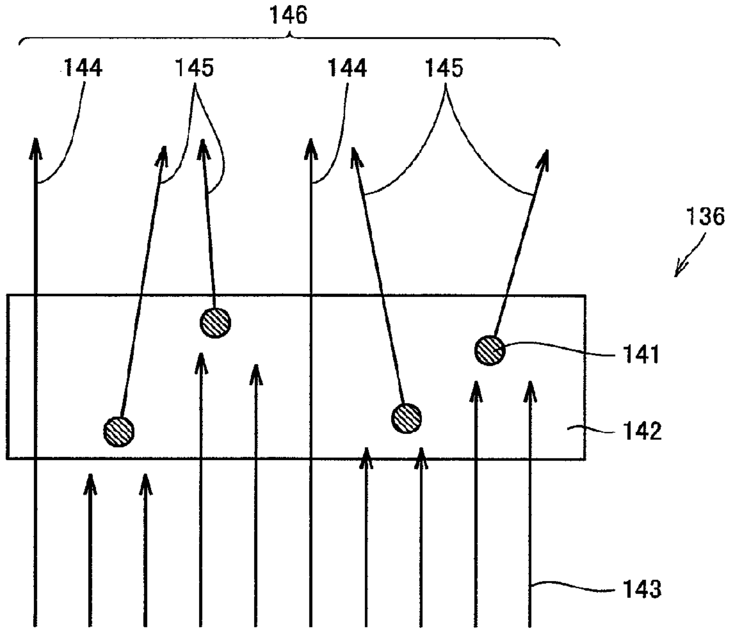
FIG. 10 is a schematic view schematically showing a wavelength conversion member 136 in the example shown in FIG. 9.

FIG. 10 is a section view schematically showing wavelength conversion member 136 in the example shown in FIG. 9. Wavelength conversion member 136 has such a form that a semiconductor phosphor microparticle 141 having a core/shell structure is dispersed in a translucent member 142. A part of light 143 inputted into wavelength conversion member 136 penetrates translucent member 142, and is absorbed in a shell part of semiconductor phosphor microparticle 141. Semiconductor phosphor microparticle 141 having absorbed the light emits fluorescence 145 having a wavelength different from that of the input light from a core part. Part of light 143 inputted into wavelength conversion member 136 turns into transmitted light 144. As a result, when wavelength conversion member 136 is irradiated with light 143, mixed light 146 of fluorescence 145 and transmitted light 144 is emitted.

Figure 11:
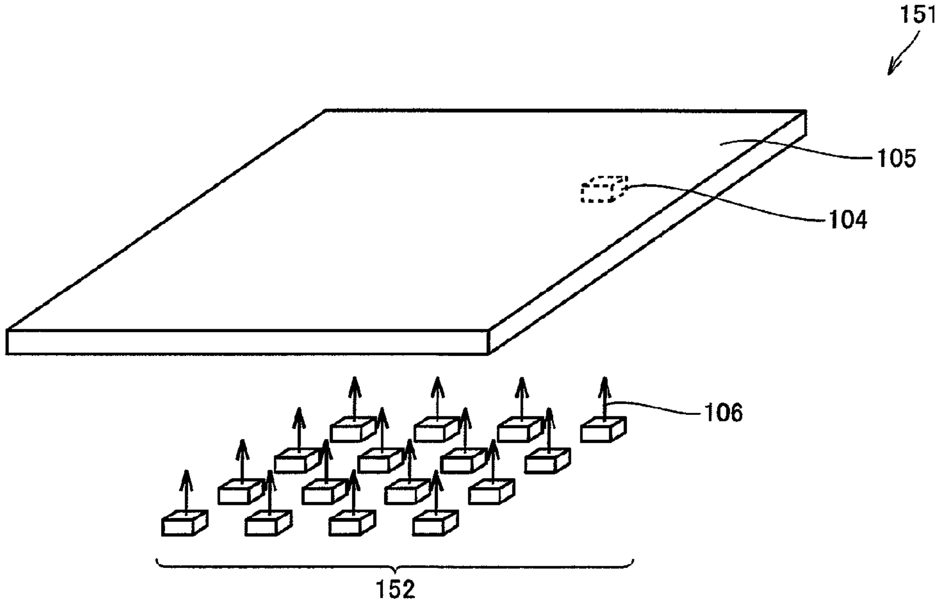
FIG. 11 is an exploded perspective view schematically showing an image display device 151 in a third preferred example of the present invention.

FIG. 11 is an exploded perspective view schematically showing an image display device 151 in a third preferred example of the present invention. The part having a similar configuration as that of image display device 101 in the example shown in FIG. 5 is denoted by the same reference numeral, and description thereof will be omitted. Image display device 151 in the example shown in FIG. 11 has almost the same configuration as image display device 101 in the example shown in FIG. 5, but is different in that a light emitting device 152 (preferably, light emitting device 41 in the example shown in FIG. 3) using an organic electroluminescence element is provided as a light emitting element, and a light conductive plate is not used. That is, in image display device 151 in the example shown in FIG. 11, output light 106 from light emitting device 102 is adapted to be applied to the entire surface of image display part 105. Here in image display device 151 in the example shown in FIG. 11, light emitting device 102 exhibiting white light is used as a light source, and for display of each pixel, color filter 116 inside wavelength conversion part 104 as shown in FIG. 6 is used, and for ON/OFF of each pixel, thin-film transistor 112 inside wavelength conversion part 104 is used.

Figure 12:
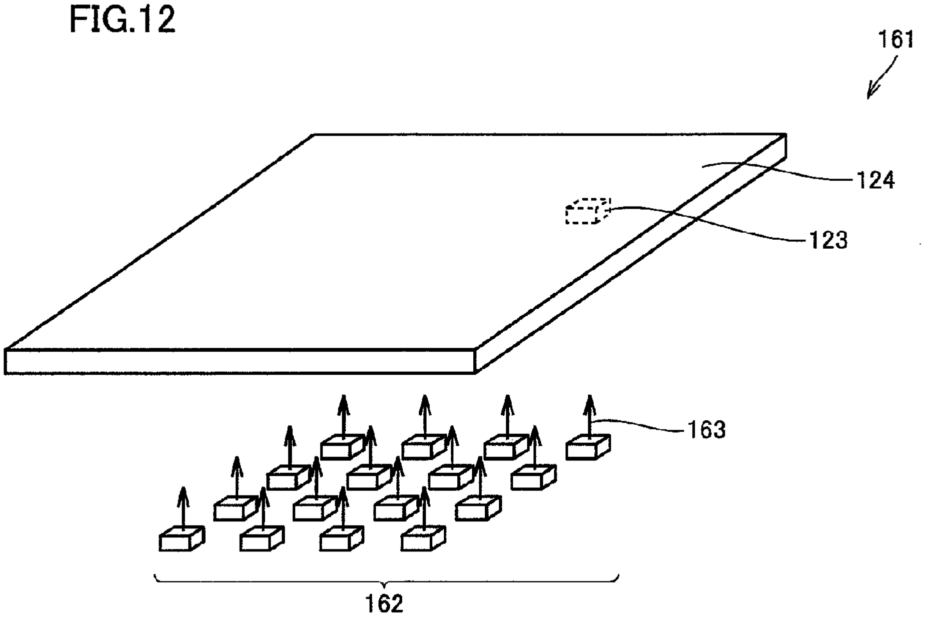
FIG. 12 is an exploded perspective view schematically showing an image display device 161 in a fourth preferred example of the present invention.

FIG. 12 is an exploded perspective view schematically showing an image display device 161 in a fourth preferred example of the present invention. The part having a similar configuration as that of image display device 121 in the example shown in FIG. 8 is denoted by the same reference numeral, and description thereof will be omitted. Image display device 161 in the example shown in FIG. 12 has almost the same configuration as image display device 121 in the example shown in FIG. 8, but is different in that an organic electroluminescence element is used as light emitting element 162 for a light source, and a light conductive plate is not used. That is, in image display device 161 in the example shown in FIG. 12, output light 163 from light emitting device 162 is adapted to be applied on the entire face of image display part 124. In image display device 161 in the example shown in FIG. 12, for display of each pixel, wavelength conversion member 136 inside wavelength conversion part 123 as shown in FIG. 9 and FIG. 10 is used, and for ON/OFF of each pixel, thin-film transistor 132 inside wavelength conversion part 123 is used.

Figure 13:
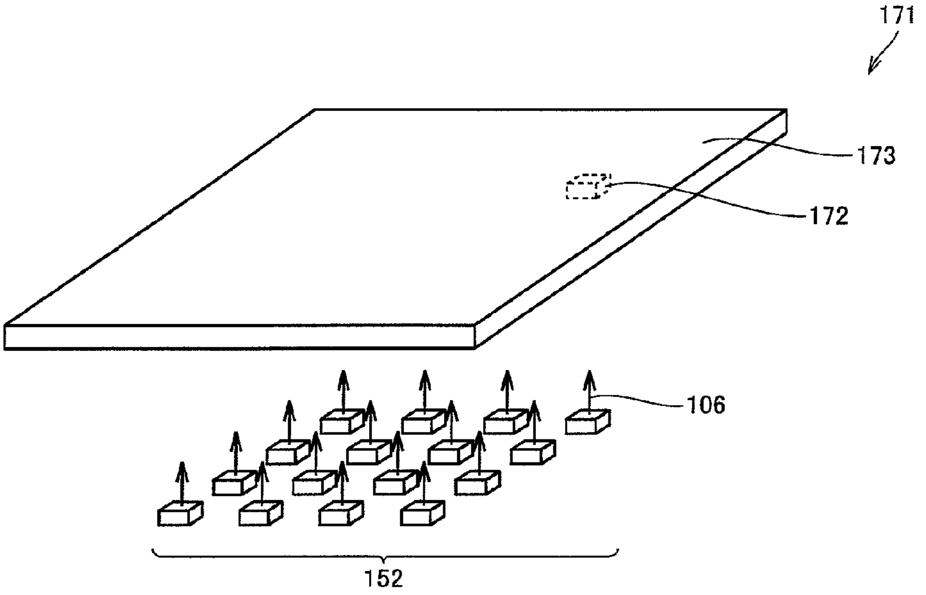
FIG. 13 is an exploded perspective view schematically showing an image display device 171 in a fifth preferred example of the present invention.
Figure 14:
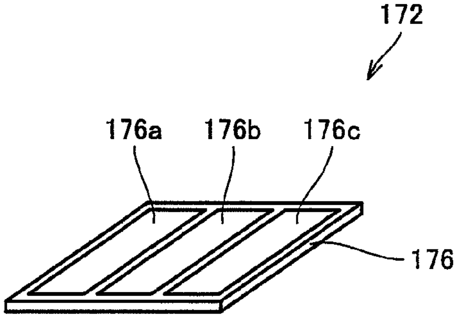
FIG. 14 is a perspective view showing a wavelength conversion part 172 in an image display part 173 in image display device 171 in the example shown in FIG. 13 in an enlarged manner.

FIG. 13 is an exploded perspective view schematically showing an image display device 171 in a fifth preferred example of the present invention. The part having a similar configuration as that of image display device 151 in the example shown in FIG. 11 is denoted by the same reference numeral, and description thereof will be omitted. Image display device 171 in the example shown in FIG. 13 has almost the same configuration as image display device 151 in the example shown in FIG. 11, but is different in that an image display part 173 is formed from a wavelength conversion part 172. Here, FIG. 14 is a perspective view showing wavelength conversion part 172 in image display part 173 in image display device 171 in the example shown in FIG. 13 in an enlarged manner. Wavelength conversion part 172 in the example shown in FIG. 14 is made up of multiple kinds of color filters 176 (three kinds of color filters 176*a*, 176*b*, 176*c* in the example shown in FIG. 14), and each color filter allows transmission of light of a specific wavelength range. In image display device 171 in the example shown in FIG. 13, light emitting device 152 exhibiting white light using an organic electroluminescence element as a light emitting element is used, and for display of each pixel, color filter 176 inside wavelength conversion part 172 as shown in FIG. 14 is used, and for ON/OFF of each pixel, a thin-film transistor fabricated inside light emitting device 152 is used.

Figure 15:
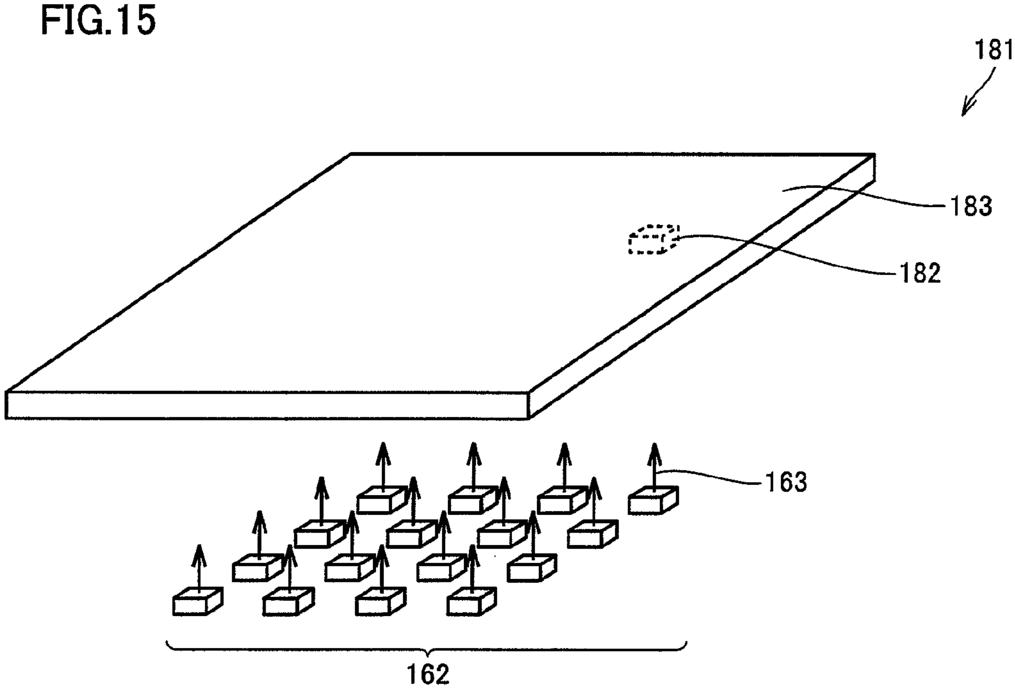
FIG. 15 is an exploded perspective view schematically showing an image display device 181 in a sixth preferred example of the present invention.
Figure 16:
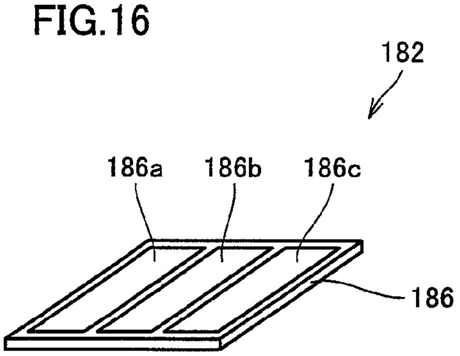
FIG. 16 is a perspective view showing a wavelength conversion part 182 in an image display part 183 in image display device 181 in the example shown in FIG. 15 in an enlarged manner.

FIG. 15 is an exploded perspective view schematically showing an image display device 181 in a sixth preferred example of the present invention. The part having a similar configuration as that of image display device 161 in the example shown in FIG. 12 is denoted by the same reference numeral, and description thereof will be omitted. Image display device 181 in the example shown in FIG. 15 has almost the same configuration as image display device 161 in the example shown in FIG. 12, but is different in that an image display part 183 is formed from a wavelength conversion part 18. Here, FIG. 16 is a perspective view showing wavelength conversion part 182 in image display part 183 in image display device 181 in the example shown in FIG. 15 in an enlarged manner. Wavelength conversion part 182 in the example shown in FIG. 16 is made up of multiple kinds of wavelength conversion members 186 (three kinds of wavelength conversion members 186*a*, 186*b*, 186*c* in the example shown in FIG. 16), and each wavelength conversion member emits light of a specific wavelength range. Here, in image display device 181 in the example shown in FIG. 15, an organic electroluminescence element is used as light emitting element 162 which is a light source, and for display of each pixel, wavelength conversion member 186 inside wavelength conversion part 182 is used, and for ON/OFF of each pixel, a thin-film transistor fabricated inside light emitting element 162 is used.

As one of performances of the image display device of the present invention, color reproducibility is recited. Color reproducibility represents the size of the color area where the image display device is able to display, and is evaluated by using an NTSC ratio. In the image display device of the present invention, an NTSC ratio is preferably 100% or higher. The NTSC ratio is calculated by an area ratio of an triangle obtained by connecting chromaticity coordinates of each color of red, green and blue in chromaticity coordinates (u', v') in a CIE1976 chromaticity chart, with respect to the area of the triangle obtained by connecting chromaticity coordinates (u', v') in CIE1976 chromaticity chart of each color (red (0.498, 0.519), green (0.076, 0.576), blue (0.152, 0.196)) of red, green and blue defined by NTSC (National Television System Committee).

As one of performances of the image display device of the present invention, screen brightness is recited. Brightness represents intensity of light emitted from the image display device. Brightness in the present invention is calculated as screen brightness when RGB pixels are fully opened and displayed in white.

In the image display device of the present invention, from the view point of increasing the NTSC ratio, standard deviation of particle diameter distribution of a core part of the semiconductor phosphor microparticle is preferably 20% or less, and more preferably 15% or less of mean particle diameter of a core part of the semiconductor phosphor microparticle.

Also in the image display device of the present invention, a half-value width of an emission spectrum of semiconductor phosphor microparticle is preferably narrow. This is because a narrow half-value width of an emission spectrum realizes an image display device having high color reproducibility. In this case, as a concrete example, the half-value width of the emission spectrum is preferably 80 nm or less, more preferably 60 nm or less, and particularly preferably 40 nm or less.

As for the image display device of the present invention, conventionally known general structures may also be employed without limited to the configurations as described above.

In the following, the present invention will be described in more detail by way of Examples and Comparative examples, however, the present invention will not be limited to these examples.

<Synthesis of Semiconductor Phosphor Microparticle Core Part>

In the following, a synthetic method of a core part of a semiconductor phosphor microparticle wherein a material of the core part is InP, GaInP, InN, GaInN, CdSe, or ZnCdSe will be described. In the following synthetic example, for measurement of a crystal structure of a semiconductor phosphor microparticle, powder X-ray diffraction measuring apparatus Ultima IV (available from Rigaku Corporation) was used, and for measurement of particle diameter and particle diameter distribution of a semiconductor phosphor microparticle, a transmission electron microscope JEM-2100 (available from JEOL Ltd.) was used.

Synthetic Example A1

Synthesis of InP Core Part

In Synthetic example A1, a core part formed of InP microcrystal was synthesized.

First, in a glove box in a dry nitrogen atmosphere, 200 mL of trioctylphosphine and 17.3 g of trioctylphosphine oxide were weighed, and mixed, and stirred for 10 minutes to obtain Mixed solvent A.

Then Mixed solvent A in the glove box was added and mixed with 2.2 g (10.0 mmol) of indium trichloride which is a group III metal element material, and 2.5 g (10.0 mmol) of tris(trimethylsilyl)phosphine which is a group V element material of semiconductor microparticle, and then stirred for 10 minutes at 20° C., to obtain Material solution B.

Next, Material solution B was stirred under heating for 72 hours in a pressure container of nitrogen atmosphere, to allow synthesis of the materials contained in Material solution B, to obtain Synthetic solution C. Synthetic solution C after end of synthetic reaction was cooled to room temperature by allowing it to dissipate the heat naturally, and Synthetic solution C was collected in a dry nitrogen atmosphere.

This Synthetic solution C was subjected to a classification step in which an operation of adding 200 mL of dehydrated methanol which is a poor solvent to make a semiconductor phosphor microparticle precipitate, an operation of making a semiconductor phosphor microparticle precipitate by centrifugation at 4000 rpm for 10 minutes, and an operation of dissolving the semiconductor phosphor microparticle by adding dehydrated toluene are respectively repeated for 10 times, to obtain Dehydrated toluene solution D containing a semiconductor phosphor microparticle having a specific particle diameter. And by evaporation of the dehydrated toluene solvent from Dehydrated toluene solution D, Solid powder E was collected.

Diffraction peak of Solid powder E was observed by powder X-ray diffraction, and it was found that Solid powder E was InP crystal because a diffraction peak was observed in the position of InP. Further, Solid powder E was directly observed under a transmission electron microscope, and particle diameters of 20 particles were measured, and mean particle diameter was calculated from the average value of the values of respective particle diameters, and thus mean particle diameter of InP crystal was determined.

Synthetic Example A2

Synthesis of InP Core Part

In Synthetic example A1, a core part formed of InP microcrystal of Synthetic example A2 was synthesized in a production method similar to that of Synthetic example A1 except that a classification step was changed. That is, while the steps of precipitation and redissolution were respectively repeated 10 times in Synthetic example A1, the steps of precipitation and redissolution were respectively repeated 5 times in Synthetic example A2. A core part formed of InP microcrystal of Synthetic example A2 was synthesized in a production method similar to that of Synthetic example A1 except for the classification step.

Solid powder E was measured by XRD, and it was found that Solid powder E was InP crystal because a diffraction peak was observed in the position of InP. Further, by directly observing Solid powder E using TEM, mean particle diameter and particle diameter distribution of InP were determined. Particle diameter distribution of an InP core part obtained in Synthetic example A2 was larger than particle diameter distribution of an InP core part of Synthetic example A1.

Synthetic example A3

Synthesis of InP Core Part

In Synthetic example A1, a core part formed of InP microcrystal of Synthetic example A3 was synthesized in a production method similar to that of Synthetic example A1 except that a classification step was changed. That is, while the steps of precipitation and redissolution were respectively repeated 10 times in Synthetic example A1, the steps of precipitation and redissolution were respectively repeated twice in Synthetic example A3. A core part formed of InP microcrystal of Synthetic example A3 was synthesized in a production method similar to that of Synthetic example A1 except for the classification step.

Solid powder E was measured by XRD, and it was found that Solid powder E was InP crystal because a diffraction peak was observed in the position of InP. Further, by directly observing Solid powder E using TEM, mean particle diameter and particle diameter distribution of InP can be determined. Particle diameter distribution of an InP core part obtained in Synthetic example A3 was larger than particle diameter distribution of an InP core part of Synthetic examples A1, A2.

Synthetic Example A4

Synthesis of $In_{0.5}Ga_{0.5}P$ Core Part

A core part formed of InGaP microcrystal of Synthetic example A4 was synthesized in a production method similar to that of Synthetic example A1 except that part of the group III metal element material added to Mixed solution A in Synthetic example A1 was changed to gallium trichloride. That is, while 2.2 g (10.0 mmol) of indium trichloride was used as a group III metal element material of a core part in Synthetic example A1, 1.1 g (5.0 mmol) of indium trichloride and 0.88 g (5.0 mmol) of gallium trichloride were used as the group III metal element material in Synthetic example A4. A core part formed of InGaP microcrystal of Synthetic example A4 was synthesized in a production method similar to that of Synthetic example A1 except for the difference in group III metal element material.

Solid powder E was measured by XRD, and it was found that Solid powder E was $In_{0.5}Ga_{0.5}P$ crystal because a diffraction peak was observed in the position of $In_{0.5}Ga_{0.5}P$. Further, by directly observing Solid powder E using TEM, mean particle diameter and particle diameter distribution of $In_{0.5}Ga_{0.5}P$ crystal were determined.

Synthetic Example A5

Synthesis of $In_{0.3}Ga_{0.7}P$ Core Part

A core part formed of InGaP microcrystal of Synthetic example A5 was synthesized in a production method similar to that of Synthetic example A4 except that a ratio of the group III metal element material added to Mixed solution A in Synthetic example A4 was changed. That is, while 1.1 g (5.0 mmol) of indium trichloride and 0.88 g (5.0 mmol) of gallium trichloride were used as the group III metal element material of a core part in Synthetic example A4, 1.5 g (7.0 mmol) of indium trichloride and 0.53 g (3.0 mmol) of gallium trichloride were used as the group III metal element material in Synthetic example A5. A core part formed of InGaP microcrystal of Synthetic example A5 was synthesized in a production method similar to that of Synthetic example A4 except for the difference in group III metal element material.

Solid powder E was measured by XRD, and it was found that Solid powder E was $In_{0.3}Ga_{0.7}P$ crystal because a diffraction peak was observed in the position of $In_{0.3}Ga_{0.7}P$. Further, by directly observing Solid powder E using TEM, mean particle diameter and particle diameter distribution of $In_{0.3}Ga_{0.7}P$ crystal were determined.

Synthetic Example A6

Synthesis of InN Core Part

A core part formed of InN microcrystal of Synthetic example A6 was synthesized in a production method similar to that of Synthetic example A1 except that a group V element material added to Mixed solution A in Synthetic example A1 was changed to bis(trimethylsilyl)amine. That is, while tris(trimethylsilyl)phosphine was used as the group V element material in Synthetic example A1, 1.6 g (10.0 mmol) of bis(trimethylsilyl)amine was used as a group V element material in Synthetic example A6. Solid powder E of semiconductor phosphor microparticle was obtained in a production method similar to that of Synthetic example A1 except for the difference in condition of the group V element material.

Solid powder E was measured by XRD, and it was found that Solid powder E was InN crystal because a diffraction peak was observed in the position of InN. Further, by directly observing Solid powder E using TEM, mean particle diameter (diameter) and particle diameter distribution of InN were determined.

Synthetic Example A7

Synthesis of InN Core Part

In Synthetic example A6, a core part formed of InN microcrystal of Synthetic example A7 was synthesized in a production method similar to that of Synthetic example A6 except that a classification step was changed. That is, while the steps of precipitation and redissolution were respectively repeated 10 times in Synthetic example A6, the steps of precipitation and redissolution were respectively repeated 5 times in Synthetic example A7. A core part formed of InN microcrystal of Synthetic example A7 was synthesized in a production method similar to that of Synthetic example A6 except for the classification step.

Solid powder E was measured by XRD, and it was found that Solid powder E was InN crystal because a diffraction peak was observed in the position of InN. Further, by directly observing Solid powder E using TEM, mean particle diameter and particle diameter distribution of InN were determined. Particle diameter distribution of an InN core part obtained in Synthetic example A7 was larger than particle diameter distribution of an InN core part of Synthetic example A6.

Synthetic Example A8

Synthesis of InN Core Part

In Synthetic example A6, a core part formed of InN microcrystal of Synthetic example A8 was synthesized in a production method similar to that of Synthetic example A6 except that a classification step was changed. That is, while the steps of precipitation and redissolution were respectively repeated 10 times in Synthetic example A6, the steps of precipitation and redissolution were respectively repeated twice in Synthetic example A8. A core part formed of InN microcrystal of Synthetic example A8 was synthesized in a production method similar to that of Synthetic example A6 except for the classification step.

Solid powder E was measured by XRD, and it was found that Solid powder E was InN crystal because a diffraction peak was observed in the position of InN, Further, by directly observing Solid powder E using TEM, mean particle diameter and particle diameter distribution of InN were determined. Particle diameter distribution of an InN core part obtained in Synthetic example A8 was larger than particle diameter distribution of an InN core part of Synthetic example A6, A7.

Synthetic Example A9

Synthesis of $In_{0.6}Ga_{0.4}N$ Core Part

A core part formed of InGaN microcrystal of Synthetic example A9 was synthesized in a production method similar to that of Synthetic example A6 except that part of the group III metal element material added to Mixed solution A in Synthetic example A6 was changed to gallium trichloride. That is, while 2.2 g (10.0 mmol) of indium trichloride was used as the group III metal element material in Synthetic example A6, 1.3 g (6.0 mmol) of indium trichloride and 0.7 g (4.0 mmol) of gallium trichloride were used as the group III metal element material in Synthetic example A9. A core part formed of InGaN microcrystal of Synthetic example A9 was synthesized in a production method similar to that of Synthetic example A6 except that the group III metal element material differs.

Solid powder E was measured by XRD, and it was found that Solid powder E was $In_{0.6}Ga_{0.4}N$ crystal because a diffraction peak was observed in the position of $In_{0.6}Ga_{0.4}N$. Further, by directly observing Solid powder E using TEM, mean particle diameter and particle diameter distribution of $In_{0.6}Ga_{0.4}N$ were determined.

Synthetic Example A10

Synthesis of $In_{0.8}Ga_{0.2}N$ Core Part

A core part formed of InGaN microcrystal of Synthetic example A10 was synthesized in a production method similar to that of Synthetic example A9 except that a ratio of the group III metal element material added to Mixed solution A in Synthetic example A9 was changed. That is, while 1.3 g (6.0 mmol) of indium trichloride and 0.7 g (4.0 mmol) of gallium trichloride were used as the group III metal element material in Synthetic example A9, 1.7 g (8.0 mmol) of indium trichloride and 0.35 g (2.0 mmol) of gallium trichloride were used as the group III metal element material in Synthetic example A9. A core part formed of InGaN microcrystal of Synthetic example A10 was synthesized in a production method similar to that of Synthetic example A9 except for the difference in group III metal element material.

Solid powder E was measured by XRD, and it was found that Solid powder E was $In_{0.8}Ga_{0.2}N$ crystal because a diffraction peak was observed in the position of $In_{0.8}Ga_{0.2}N$. Further, by directly observing Solid powder E using TEM, mean particle diameter and particle diameter distribution of $In_{0.8}Ga_{0.2}N$ can be determined.

Synthetic Example A11

Synthesis of CdSe Core Part

A core part formed of CdSe microcrystal of Synthetic example A11 was synthesized in a production method similar to that of Synthetic example A1 except that the group III metal element material added to Mixed solution A in Synthetic example A1 was changed to a group II metal element material, and the group V element material was changed to a group VI element material. That is, in Synthetic example A11, as a material, 1.4 g (10.0 mmol) of dimethylcadmium which is a group II metal element material and 4.5 g (10.0 mmol) of trioctyl phosphine sulfide which is a group VI element material were used. Solid powder E of semiconductor phosphor microparticle was obtained in a production method similar to that of Synthetic example A1 except for the difference in material.

Solid powder E was measured by XRD, and it was found that Solid powder E was CdSe crystal because a diffraction peak was observed in the position of CdSe. Further, by directly observing Solid powder E using TEM, mean particle diameter and particle diameter distribution of CdSe were determined.

Synthetic Example A12

Synthesis of $Zn_{0.1}Cd_{0.9}Se$ Core Part

A core part formed of ZnCdSe microcrystal of Synthetic example A12 was synthesized in a production method similar to that of Synthetic example A11 except that the group II metal element material added to Mixed solution A was changed to two kinds of group H metal element materials. That is, in Synthetic example A12, 0.14 g (1.0 mmol) of dimethylcadmium and 1.1 g (9.0 mmol) of zinc diethyl were used as the group II metal element material. Solid powder E of semiconductor phosphor microparticle was obtained in a production method similar to that of Synthetic example A5 except for the difference in group II metal element material.

Solid powder E was measured by XRD, and it was found that Solid powder E was $Zn_{0.1}Cd_{0.9}Se$ crystal because a diffraction peak was observed in the position of $Zn_{0.1}Cd_{0.9}Se$. Further, by directly observing Solid powder E using TEM, mean particle diameter and particle diameter distribution of $Zn_{0.1}Cd_{0.9}Se$ can be determined.

<Synthesis of Semiconductor Phosphor Microparticle Shell Part>

In the following, a synthetic method of a semiconductor phosphor microparticle having a core/shell structure wherein the material of the shell part is ZnSe, SiC, GaInN, ZnSTe, GaP, $SiO_2$, ZnS, or GaN will be described.

Synthetic Example B1

Synthesis of ZnSe Shell Part

In Synthetic example B1, a semiconductor phosphor microparticle having a core/shell structure having a ZnSe shell part was synthesized.

First, in a glove box in a dry nitrogen atmosphere, semiconductor phosphor microparticle core part, 200 mL of trioctylphosphine and 17.3 g of trioctylphosphine oxide were weighed, and mixed, and stirred for 10 minutes to obtain Mixed solvent A.

Then, in the condition that Mixed solvent A was heated to a shell growth temperature under stirring in a flask, 1.2 g (10.0 mmol) of zinc diethyl which is a group II metal element material of a semiconductor microparticle shell part, and 4.5 g (10.0 mmol) of trioctylphosphine selenide which is a group VI element material of a semiconductor microparticle shell part were separately added dropwise gradually over 8 hours, to obtain Synthetic solution C.

This Synthetic solution C was subjected to a classification step in which an operation of adding 200 mL of dehydrated methanol which is a poor solvent to make a semiconductor phosphor microparticle precipitate, an operation of making a semiconductor phosphor microparticle precipitate by centrifugation at 4000 rpm for 10 minutes, and an operation of dissolving the semiconductor phosphor microparticle by adding dehydrated toluene are respectively repeated for 10 times, to obtain Dehydrated toluene solution D containing a semiconductor phosphor microparticle having a specific particle diameter. And by evaporation of the dehydrated toluene solvent from Dehydrated toluene solution D, Solid powder E was collected. This Solid powder E was directly observed under a transmission electron microscope, and a semiconductor phosphor microparticle having a core/shell structure in which the surface of the core part is covered with a ZnSe shell was observed.

Synthetic Example B2

Synthesis Of SiC Shell Part

A semiconductor phosphor microparticle having a core/shell structure having a SiC shell part of Synthetic example B2 was synthesized in a production method similar to that of Synthetic example B1 except that the material added to Mixed solution A in Synthetic example B1 was changed to two kinds of group IV metal element materials. That is, in Synthetic example B2, 5.0 g of polycarbosilane was used as the group IV element material. Solid powder E of semiconductor phosphor microparticle was obtained in a production method similar to that of Synthetic example B1 except for the difference in group II metal element material. By direct observation of this Solid powder E under a transmission electron microscope, a semiconductor phosphor microparticle having a core/shell structure in which the surface of the core part is covered with SiC shell part was observed.

Synthetic Example B3

Synthesis of $In_{0.25}Ga_{0.75}N$ Shell Part

A semiconductor phosphor microparticle having a core/shell structure having an InGaN shell part of Synthetic example B3 was synthesized in a production method similar to that of Synthetic example B1 except that the group II metal element material added to Mixed solution A in Synthetic example B1 was changed to two kinds of group III metal element material and the group VI element material was changed to a group V element material. That is, in Synthetic example B3, 0.54 g (2.5 mmol) of indium trichloride and 1.3 g (7.5 mmol) of gallium trichloride were used as the group III metal element material, 1.6 g (10.0 mmol) of bis(trimethylsilyl)amine was used as the group V element material. Solid powder E of semiconductor phosphor microparticle was obtained in a production method similar to that of Synthetic example B1 except for the differences in group III metal element material and group V element material. By direct observation of this Solid powder E under a transmission electron microscope, a semiconductor phosphor microparticle having a core/shell structure in which the surface of the core part is covered with an $In_{0.25}Ga_{0.75}N$ shell part was observed.

Synthetic Example B4

Synthesis of $ZnS_{0.35}Te_{0.65}$ Shell Part

A semiconductor phosphor microparticle having a core/shell structure having a ZnSTe shell part of Synthetic example B4 was synthesized in a production method similar to that of Synthetic example B1 except that the group II metal element material added to Mixed solution A in Synthetic example B1 was changed to group V element material. That is, in Synthetic example B4, 1.2 g (10.0 mmol) of zinc diethyl was used as the group II metal element material, 1.4 g (3.5 mmol) of trioctylphosphine sulfide and 3.2 g (6.5 mmol) of trioctylphosphineterenide were used as the group VI element material. Solid powder E of semiconductor phosphor microparticle was obtained in a production method similar to that of Synthetic example B1 except for the difference in group II metal element material and group VI element material. By direct observation of this Solid powder E under a transmission electron microscope, a semiconductor phosphor microparticle having a core/shell structure in which the surface of the core part is covered with a $ZnS_{0.35}Te_{0.65}$ shell part was observed.

Synthetic Example B5

Synthesis of GaP Shell Part

A semiconductor phosphor microparticle having a core/shell structure having a GaP shell part of Synthetic example B5 was synthesized in a production method similar to that of Synthetic example B1 except that the group II metal element material added to Mixed solution A in Synthetic example B1 was changed to a group III metal element material, and the group VI element material was changed to a group V element material. That is, in Synthetic example B5, 1.8 g (10.0 mmol) of gallium trichloride was used as the group III metal element material, and 2.5 g (10.0 mmol) of tris(trimethylsilyl)phosphine was used as the group V element material. Solid powder E of semiconductor phosphor microparticle was obtained in a production method similar to that of Synthetic example B1 except for the differences in group III metal element material and group V element material. By direct observation of this Solid powder E under a transmission electron microscope, a semiconductor phosphor microparticle having a core/shell structure in which the surface of the core part is covered with a GaP shell part was observed.

Synthetic Example B6

Synthesis of $SiO_2$ Shell Part

A semiconductor phosphor microparticle having a core/shell structure having a $SiO_2$ shell part of Synthetic example B6 was synthesized in a production method similar to that of Synthetic example B1 except that the material added to Mixed solution A in Synthetic example B1 was changed. That is, in Synthetic example B6, 2.2 g (10.0 mmol) of aminopropyltrimethoxysilane and 0.92 g (10.0 mmol) of thioglycolic acid were used. Solid powder E of semiconductor phosphor microparticle was obtained in a production method similar to that of Synthetic example B1 except for the difference in material. By direct observation of this Solid powder E under a transmission electron microscope, a semiconductor phosphor microparticle having a core/shell structure in which the surface of the core part is covered with a SiO shell part was observed.

Synthetic Example B7

Synthesis of ZnS Shell Part

A semiconductor phosphor microparticle having a core/shell structure having a ZnS shell part of Synthetic example B7 was synthesized in a production method similar to that of Synthetic example B1 except that the group W element material added to Mixed solution A in Synthetic example B1 was changed. That is, in Synthetic example B7, 4.0 g (10.0 mmol) of trioctylphosphine sulfide was used as the group VI element material. Solid powder E of semiconductor phosphor microparticle was obtained in a production method similar to that of Synthetic example B1 except for the difference in group VI element material. By direct observation of this Solid powder E under a transmission electron microscope, a semiconductor phosphor microparticle having a core/shell structure in which the surface of the core part is covered with a ZnS shell part was observed.

Synthetic Example B8

Synthesis of GaN Shell Part

A semiconductor phosphor microparticle having a core/shell structure having a GaN shell part of Synthetic example B8 was synthesized in a production method similar to that of Synthetic example B1 except that the group II metal element material added to Mixed solution A in Synthetic example B1 was changed to a group III metal element material and the group VI element material was changed to a group V element material. That is, in Synthetic example B8, 1.75 g (10.0 mmol) of gallium trichloride was used as the group III metal element material and, 1.6 g (10.0 mmol) of bis(trimethylsilyl)amine was used as the group V element material. Solid powder E of semiconductor phosphor microparticle was obtained in a production method similar to that of Synthetic example B1 except for the differences in group III metal element material and group V element material. By direct observation of this Solid powder E under a transmission electron microscope, a semiconductor phosphor microparticle having a core/shell structure in which the surface of the core part is covered with a GaN shell part was observed.

<Production of Semiconductor Phosphor Microparticle>

In the following, a method of producing a semiconductor phosphor microparticle having a core/shell structure wherein a material of a core part is selected from the group consisting of InP, InGaP, InN, InGaN, CdSe, and ZnCdSe, and a material of a shell part is selected from ZnSe, SiC, InGaN, ZnSTe, GaP, $SiO_2$, ZnS, and GaN will be described. In the following production example, a fluorescence spectrophotometer FluoroMax-4 (available from JOBIN YVON) was used for measurement of luminous characteristics of a semiconductor phosphor microparticle, and a spectrophotometer U-4100 (available from Hitachi High-Technologies Corporation) was used for measurement of an absorption spectrum of a semiconductor phosphor microparticle.

Production Example 1r

Production of InP/ZnSe Red Luminescent Semiconductor Phosphor Microparticle

In Production example 1r, an InP/ZnSe semiconductor phosphor microparticle showing red luminescence was produced.

First, an InP core part was synthesized using the method shown in Synthetic example A1. By means of a transmission electron microscope, it was proved that mean particle diameter of the InP core part was 3.8 nm, and particle diameter distribution was 14.8%. Then using the method shown in Synthetic example B1, a ZnSe shell part was synthesized on the surface of the InP core part. By means of a transmission electron microscope, it was determined that film thickness of the shell part was 0.8 nm. In this manner, an InP/ZnSe semiconductor phosphor microparticle was produced. The produced InP/ZnSe semiconductor phosphor microparticle was proved to emit red light upon irradiation by a UV lamp.

The obtained InP/ZnSe semiconductor phosphor microparticle was proved to have a emission peak wavelength of 629.2 nm and an emission half-value width of 39.3 nm by conducting photoluminescence measurement. Also by conducting an absorption spectrum measurement, it was proved that the absorption wavelength was 459.2 nm. Also it was proved that the luminous efficiency was 51.8%.

Production Examples 2r to 22r

Productions of Various Red Luminescent Semiconductor Phosphor Microparticles

Using a method similar to that of Production example 1r, various red luminescent semiconductor phosphor microparticles of Production examples 2r to **22*r*** were produced using Synthetic examples A1 to A12, and Synthetic examples B1 to B10, as shown in Table 1. As shown in Table 1, semiconductor phosphor microparticles of Comparative production examples 1r to 6r were also produced. Luminescence and absorption characteristics of these semiconductor phosphor microparticle are shown in Table 2.

TABLE 1

| Production example | | | | | | | Structure of semiconductor |
|---|---|---|---|---|---|---|---|
| Red phosphor | Yellow phosphor | Green phosphor | Blue phosphor | Core part | Shell part 1 | Shell part 2 | phosphor microparticle |
| Production example 1r | Production example 1y | Production example 1g | Production example 1b | Synthetic example A1 | Synthetic example B1 | — | InP/ZnSe |
| Production example 2r | Production example 2y | Production example 2g | Production example 2b | Synthetic example A2 | Synthetic example B1 | — | InP/ZnSe |
| Production example 3r | Production example 3y | Production example 3g | Production example 3b | Synthetic example A3 | Synthetic example B1 | — | InP/ZnSe |
| Production example 4r | Production example 4y | Production example 4g | Production example 4b | Synthetic example A1 | Synthetic example B1 | Synthetic example B6 | $InP/ZnSe/SiO_2$ |
| Production example 5r | Production example 5y | Production example 5g | Production example 5b | Synthetic example A4 | Synthetic example B1 | — | $Ga_{0.5}In_{0.5}P/ZnSe$ |
| Production example 6r | Production example 6y | Production example 6g | Production example 6b | Synthetic example A5 | Synthetic example B1 | — | $Ga_{0.3}In_{0.7}P/ZnSe$ |
| Production example 7r | Production example 7y | Production example 7g | Production example 7b | Synthetic example A6 | Synthetic example B1 | — | InN/ZnSe |
| Production example 8r | Production example 8y | Production example 8g | Production example 8b | Synthetic example A7 | Synthetic example B1 | — | InN/ZnSe |
| Production example 9r | Production example 9y | Production example 9g | Production example 9b | Synthetic example A8 | Synthetic example B1 | — | InN/ZnSe |
| Production example 10r | Production example 10y | Production example 10g | Production example 10b | Synthetic example A6 | Synthetic example B1 | Synthetic example B6 | $InN/ZnSe/SiO_2$ |
| Production example 11r | Production example 11y | Production example 11g | Production example 10b | Synthetic example A11 | Synthetic example B1 | — | CdSe/ZnSe |
| Production example 12r | Production example 12y | Production example 12g | Production example 12b | Synthetic example A12 | Synthetic example B1 | — | $Zn_{0.1}Cd_{0.9}Se/ZnSe$ |
| Production example 13r | Production example 13y | Production example 13g | Production example 13b | Synthetic example A1 | Synthetic example B3 | — | $InP/Ga_{0.75}In_{0.25}N$ |
| Production example 14r | Production example 14y | Production example 14g | Production example 14b | Synthetic example A6 | Synthetic example B3 | — | $InN/Ga_{0.75}In_{0.25}N$ |
| Production example 15r | Production example 15y | Production example 15g | Production example 15b | Synthetic example A9 | Synthetic example B3 | — | $Ga_{0.4}In_{0.6}N/Ga_{0.75}In_{0.25}N$ |
| Production example 16r | Production example 16y | Production example 16g | Production example 16b | Synthetic example A10 | Synthetic example B3 | — | $Ga_{0.2}In_{0.8}N/Ga_{0.75}In_{0.25}N$ |
| Production example 17r | Production example 17y | Production example 17g | Production example 17b | Synthetic example A1 | Synthetic example B4 | — | $InP/ZnS_{0.35}Te_{0.65}$ |
| Production example 18r | Production example 18y | Production example 18g | Production example 18b | Synthetic example A6 | Synthetic example B4 | — | $InN/ZnS_{0.35}Te_{0.65}$ |
| Production example 19r | Production example 19y | Production example 19g | Production example 19b | Synthetic example A1 | Synthetic example B2 | — | InP/SiC |
| Production example 20r | Production example 20y | Production example 20g | Production example 20b | Synthetic example A6 | Synthetic example B2 | — | InN/SiC |
| Production example 21r | Production example 21y | — | — | Synthetic example A1 | Synthetic example B5 | — | InP/GaP |
| Production example 22r | Production example 22y | — | — | Synthetic example A6 | Synthetic example B5 | — | InN/GaP |
| Comparative production example 1r | Comparative production example 1y | Comparative production example 1g | Comparative production example 1b | Synthetic example A1 | Synthetic example B7 | — | InP/ZnS |

TABLE 1-continued

| Production example | | | | | | | Structure of semiconductor |
|---|---|---|---|---|---|---|---|
| Red phosphor | Yellow phosphor | Green phosphor | Blue phosphor | Core part | Shell part 1 | Shell part 2 | phosphor microparticle |
| Comparative production example 2r | Comparative production example 2y | Comparative production example 2g | Comparative production example 2b | Synthetic example A4 | Synthetic example B7 | — | $Ga_{0.5}In_{0.5}P/ZnS$ |
| Comparative production example 3r | Comparative production example 3y | Comparative production example 3g | Comparative production example 3b | Synthetic example A11 | Synthetic example B7 | — | CdSe/ZnS |
| Comparative production example 4r | Comparative production example 4y | Comparative production example 4g | Comparative production example 4b | Synthetic example A12 | Synthetic example B7 | — | $Zn_{0.1}Cd_{0.9}Se/ZnS$ |
| Comparative production example 5r | Comparative production example 5y | Comparative production example 5g | Comparative production example 5b | Synthetic example A6 | Synthetic example B8 | — | InN/GaN |
| Comparative production example 6r | Comparative production example 6y | Comparative production example 6g | Comparative production example 6b | Synthetic example A9 | Synthetic example B8 | — | $Ga_{0.4}In_{0.6}N/GaN$ |

TABLE 2

| Production example | Luminescent color | Emission peak wavelength [nm] | Emission half-value width [nm] | Luminous efficiency | Shell absorption wavelength [nm] | Core particle diameter [nm] | Distribution of core particle diameter [%] | Core part bandgap energy [eV] | Shell part band gap energy [eV] | Chromaticity chart u' | Chromaticity chart v' |
|---|---|---|---|---|---|---|---|---|---|---|---|
| Production example 1r | Red | 629.2 | 39.3 | 0.518 | 459.2 | 3.8 | 14.6 | 1.97 | 2.70 | 0.5071 | 0.5239 |
| Production example 2r | Red | 627.2 | 60.4 | 0.506 | 457.5 | 3.8 | 27.3 | 1.98 | 2.70 | 0.4476 | 0.5328 |
| Production example 3r | Red | 627.5 | 81.4 | 0.495 | 459.4 | 3.8 | 48.5 | 1.98 | 2.70 | 0.3976 | 0.5401 |
| Production example 4r | Red | 628.3 | 38.1 | 0.515 | 458.2 | 3.8 | 15.2 | 1.97 | 2.70 | 0.5063 | 0.5240 |
| Production example 5r | Red | 626.3 | 38.4 | 0.375 | 458.4 | 6.1 | 13.9 | 1.98 | 2.70 | 0.4979 | 0.5253 |
| Production example 6r | Red | 634.6 | 41.6 | 0.392 | 458.7 | 5.4 | 16.3 | 1.95 | 2.70 | 0.5209 | 0.5218 |
| Production example 7r | Red | 630.5 | 39.0 | 0.177 | 459.2 | 2.0 | 13.9 | 1.97 | 2.70 | 0.5125 | 0.5231 |
| Production example 8r | Red | 633.8 | 58.6 | 0.210 | 458.4 | 2.0 | 28.4 | 1.96 | 2.70 | 0.4755 | 0.5286 |
| Production example 9r | Red | 627.1 | 80.6 | 0.219 | 460.1 | 2.0 | 42.6 | 1.98 | 2.70 | 0.3980 | 0.5400 |
| Production example 10r | Red | 632.1 | 40.1 | 0.195 | 458.8 | 2.0 | 16.1 | 1.96 | 2.70 | 0.5156 | 0.5226 |
| Production example 11r | Red | 629.8 | 38.8 | 0.793 | 458.8 | 5.2 | 16.0 | 1.97 | 2.70 | 0.5104 | 0.5234 |
| Production example 12r | Red | 628.6 | 40.3 | 0.609 | 457.9 | 6.3 | 17.6 | 1.97 | 2.70 | 0.5026 | 0.5246 |
| Production example 13r | Red | 629.1 | 37.6 | 0.520 | 457.1 | 3.8 | 15.4 | 1.97 | 2.72 | 0.5106 | 0.5234 |
| Production example 14r | Red | 630.3 | 41.5 | 0.201 | 456.0 | 2.0 | 16.1 | 1.97 | 2.72 | 0.5060 | 0.5240 |
| Production example 15r | Red | 630.8 | 39.0 | 0.085 | 455.7 | 6.0 | 14.0 | 1.97 | 2.72 | 0.5135 | 0.5229 |
| Production example 16r | Red | 633.2 | 41.9 | 0.119 | 457.5 | 3.4 | 16.7 | 1.96 | 2.72 | 0.5153 | 0.5227 |
| Production example 17r | Red | 633.6 | 39.1 | 0.500 | 458.1 | 3.8 | 15.7 | 1.96 | 2.72 | 0.5229 | 0.5215 |
| Production example 18r | Red | 631.5 | 38.1 | 0.191 | 455.7 | 2.0 | 13.9 | 1.96 | 2.72 | 0.5177 | 0.5223 |
| Production example 19r | Red | 634.6 | 42.4 | 0.483 | 434.2 | 3.8 | 16.2 | 1.95 | 2.86 | 0.5188 | 0.5221 |
| Production example 20r | Red | 628.6 | 40.5 | 0.209 | 433.9 | 2.0 | 17.9 | 1.97 | 2.86 | 0.5020 | 0.5246 |
| Production example 21r | Red | 630.2 | 39.1 | 0.489 | 547.7 | 3.8 | 14.7 | 1.97 | 2.27 | 0.5110 | 0.5233 |
| Production example 22r | Red | 633.4 | 37.6 | 0.181 | 546.4 | 2.0 | 14.9 | 1.96 | 2.27 | 0.5255 | 0.5211 |
| Comparative production example 1r | Red | 630.7 | 38.2 | 0.497 | 347.9 | 3.8 | 15.0 | 1.97 | 3.56 | 0.5148 | 0.5227 |

TABLE 2-continued

| Production example | Luminescent color | Emission peak wavelength [nm] | Emission half-value width [nm] | Luminous efficiency | Shell absorption wavelength [nm] | Core particle diameter [nm] | Distribution of core particle diameter [%] | Core part bandgap energy [eV] | Shell part band gap energy [eV] | Chromaticity chart u' | v' |
|---|---|---|---|---|---|---|---|---|---|---|---|
| Comparative production example 2r | Red | 633.0 | 40.0 | 0.402 | 349.3 | 6.1 | 15.6 | 1.96 | 3.56 | 0.5190 | 0.5221 |
| Comparative production example 3r | Red | 626.0 | 38.2 | 0.808 | 347.3 | 5.2 | 16.2 | 1.98 | 3.56 | 0.4970 | 0.5254 |
| Comparative production example 4r | Red | 630.1 | 40.9 | 0.583 | 349.3 | 6.3 | 16.6 | 1.97 | 3.56 | 0.5069 | 0.5239 |
| Comparative production example 5r | Red | 634.6 | 40.5 | 0.192 | 366.5 | 2.0 | 17.4 | 1.95 | 3.39 | 0.5232 | 0.5215 |
| Comparative production example 6r | Red | 629.8 | 38.8 | 0.091 | 364.5 | 6.0 | 16.8 | 1.97 | 3.39 | 0.5103 | 0.5234 |

Production Examples 1y to 22y

Productions of Various Yellow Luminescent Semiconductor Phosphor Microparticles Using a method similar to that of Production example 1r, various yellow luminescent semiconductor phosphor microparticles of Production examples 1y to 22y were produced using Synthetic examples A1 to A12 and Synthetic examples B1 to B10, as shown in Table 1. As shown in Table 1, semiconductor phosphor microparticles of Comparative production examples 1y to 6y were also produced. Luminescence and absorption characteristics of these semiconductor phosphor microparticle are shown in Table 3.

TABLE 3

| Production example | Luminescent color | Emission peak wavelength [nm] | Emission half-value width [nm] | Luminous efficiency | Shell absorption wavelength [nm] | Core particle diameter [nm] | Distribution of core particle diameter [%] | Core part bandgap energy [eV] | Shell part band gap energy [eV] | Chromaticity chart u' | v' |
|---|---|---|---|---|---|---|---|---|---|---|---|
| Production example 1y | Yellow | 582.1 | 40.1 | 0.522 | 458.9 | 3.2 | 14.6 | 2.13 | 2.70 | 0.2673 | 0.5596 |
| Production example 2y | Yellow | 584.8 | 57.7 | 0.506 | 457.1 | 3.2 | 29.4 | 2.12 | 2.70 | 0.2707 | 0.5588 |
| Production example 3y | Yellow | 581.9 | 78.6 | 0.512 | 460.4 | 3.2 | 41.8 | 2.13 | 2.70 | 0.2474 | 0.5609 |
| Production example 4y | Yellow | 576.2 | 40.9 | 0.512 | 459.5 | 3.2 | 15.3 | 2.15 | 2.70 | 0.2366 | 0.5641 |
| Production example 5y | Yellow | 582.9 | 42.1 | 0.382 | 460.7 | 5.5 | 16.9 | 2.13 | 2.70 | 0.2705 | 0.5591 |
| Production example 6y | Yellow | 583.3 | 37.8 | 0.411 | 457.8 | 4.3 | 13.3 | 2.13 | 2.70 | 0.2748 | 0.5585 |
| Production example 7y | Yellow | 578.6 | 42.2 | 0.188 | 460.8 | 1.7 | 16.8 | 2.14 | 2.70 | 0.2485 | 0.5623 |
| Production example 8y | Yellow | 583.3 | 63.1 | 0.204 | 460.5 | 1.7 | 32.2 | 2.13 | 2.70 | 0.2608 | 0.5601 |
| Production example 9y | Yellow | 582.1 | 82.0 | 0.218 | 459.8 | 1.7 | 47.2 | 2.13 | 2.70 | 0.2463 | 0.5607 |
| Production example 10y | Yellow | 583.3 | 39.5 | 0.194 | 458.3 | 1.7 | 15.8 | 2.13 | 2.70 | 0.2742 | 0.5586 |
| Production example 11y | Yellow | 583.0 | 40.8 | 0.800 | 459.3 | 5.4 | 17.8 | 2.13 | 2.70 | 0.2721 | 0.5589 |
| Production example 12y | Yellow | 575.8 | 37.7 | 0.592 | 460.3 | 6.1 | 15.9 | 2.15 | 2.70 | 0.2350 | 0.5644 |
| Production example 13y | Yellow | 582.1 | 37.9 | 0.488 | 457.6 | 6.1 | 15.3 | 2.13 | 2.72 | 0.2683 | 0.5595 |
| Production example 14y | Yellow | 584.3 | 38.1 | 0.184 | 457.6 | 1.7 | 15.1 | 2.12 | 2.72 | 0.2802 | 0.5577 |
| Production example 15y | Yellow | 584.0 | 42.1 | 0.088 | 456.5 | 5.2 | 16.3 | 2.12 | 2.72 | 0.2765 | 0.5582 |
| Production example 16y | Yellow | 584.4 | 40.6 | 0.082 | 457.5 | 3.0 | 17.7 | 2.12 | 2.72 | 0.2797 | 0.5578 |
| Production example 17y | Yellow | 579.1 | 39.8 | 0.501 | 455.3 | 3.2 | 15.4 | 2.14 | 2.72 | 0.2519 | 0.5619 |
| Production example 18y | Yellow | 581.6 | 38.1 | 0.217 | 456.0 | 1.7 | 16.4 | 2.13 | 2.72 | 0.2654 | 0.5599 |

TABLE 3-continued

| Production example | Luminescent color | Emission peak wavelength [nm] | Emission half-value width [nm] | Luminous efficiency | Shell absorption wavelength [nm] | Core particle diameter [nm] | Distribution of core particle diameter [%] | Core part bandgap energy [eV] | Shell part band gap energy [eV] | Chromaticity chart u' | v' |
|---|---|---|---|---|---|---|---|---|---|---|---|
| Production example 19y | Yellow | 575.3 | 38.0 | 0.497 | 434.8 | 3.2 | 15.1 | 2.16 | 2.86 | 0.2325 | 0.5647 |
| Production example 20y | Yellow | 576.4 | 38.0 | 0.181 | 434.0 | 1.7 | 15.7 | 2.15 | 2.86 | 0.2382 | 0.5639 |
| Production example 21y | Yellow | 582.7 | 40.9 | 0.485 | 546.1 | 3.2 | 18.1 | 2.13 | 2.27 | 0.2700 | 0.5592 |
| Production example 22y | Yellow | 583.9 | 40.7 | 0.218 | 546.4 | 1.7 | 15.7 | 2.12 | 2.27 | 0.2767 | 0.5582 |
| Comparative production example 1y | Yellow | 580.1 | 39.2 | 0.506 | 347.0 | 3.2 | 14.6 | 2.14 | 3.56 | 0.2570 | 0.5611 |
| Comparative production example 2y | Yellow | 577.2 | 40.3 | 0.407 | 348.6 | 5.5 | 17.7 | 2.15 | 3.56 | 0.2419 | 0.5633 |
| Comparative production example 3y | Yellow | 577.2 | 37.9 | 0.786 | 349.3 | 5.4 | 14.6 | 2.15 | 3.56 | 0.2423 | 0.5633 |
| Comparative production example 4y | Yellow | 578.6 | 39.7 | 0.579 | 348.2 | 6.1 | 15.5 | 2.14 | 3.56 | 0.2492 | 0.5623 |
| Comparative production example 5y | Yellow | 577.5 | 42.2 | 0.208 | 367.2 | 1.7 | 16.5 | 2.15 | 3.39 | 0.2428 | 0.5632 |
| Comparative production example 6y | Yellow | 584.9 | 39.8 | 0.117 | 364.3 | 5.2 | 16.8 | 2.12 | 3.39 | 0.2828 | 0.5573 |

Production Examples 1g to 22g

Productions of Various Green Luminescent Semiconductor Phosphor Microparticles Using a method similar to that of Production example 1r, various green luminescent semiconductor phosphor microparticles of Production examples 1g to 22g were produced using Synthetic examples A1 to A12 and Synthetic examples B1 to B10, as shown in Table 1. As shown in Table 1, semiconductor phosphor microparticles of Comparative production examples 1g to 6g were also produced. Luminescence and absorption characteristics of these semiconductor phosphor microparticle are shown in Table 4.

TABLE 4

| Production example | Luminescent color | Emission peak wavelength [nm] | Emission half-value width [nm] | Luminous efficiency | Shell absorption wavelength [nm] | Core particle diameter [nm] | Distribution of core particle diameter [%] | Core part bandgap energy [eV] | Shell part 1 bandgap energy [eV] | Chromaticity chart u' | v' |
|---|---|---|---|---|---|---|---|---|---|---|---|
| Production example 1g | Green | 529.8 | 39.9 | 0.494 | 460.4 | 2.7 | 17.3 | 2.34 | 2.70 | 0.0663 | 0.5793 |
| Production example 2g | Green | 528.8 | 56.8 | 0.471 | 457.4 | 2.7 | 27.6 | 2.35 | 2.70 | 0.0806 | 0.5691 |
| Production example 3g | Green | 531.8 | 78.6 | 0.500 | 460.2 | 2.7 | 42.4 | 2.33 | 2.70 | 0.1104 | 0.5560 |
| Production example 4g | Green | 530.4 | 37.9 | 0.523 | 458.6 | 2.7 | 13.4 | 2.34 | 2.70 | 0.0661 | 0.5803 |
| Production example 5g | Green | 534.6 | 38.2 | 0.394 | 457.8 | 4.2 | 16.0 | 2.32 | 2.70 | 0.0771 | 0.5813 |
| Production example 6g | Green | 529.6 | 41.8 | 0.416 | 458.0 | 3.4 | 18.3 | 2.34 | 2.70 | 0.0675 | 0.5783 |
| Production example 7g | Green | 534.2 | 39.9 | 0.201 | 460.5 | 1.7 | 16.5 | 2.32 | 2.70 | 0.0772 | 0.5807 |
| Production example 8g | Green | 528.6 | 60.7 | 0.235 | 461.7 | 1.7 | 28.7 | 2.35 | 2.70 | 0.0845 | 0.5662 |
| Production example 9g | Green | 528.7 | 81.4 | 0.189 | 459.8 | 1.7 | 48.7 | 2.35 | 2.70 | 0.1079 | 0.5499 |
| Production example 10g | Green | 533.4 | 37.5 | 0.185 | 459.4 | 1.7 | 15.2 | 2.32 | 2.70 | 0.0734 | 0.5813 |
| Production example 11g | Green | 532.1 | 38.1 | 0.786 | 460.4 | 2.3 | 14.9 | 2.33 | 2.70 | 0.0704 | 0.5808 |
| Production example 12g | Green | 528.7 | 40.4 | 0.604 | 459.2 | 2.6 | 17.0 | 2.35 | 2.70 | 0.0641 | 0.5785 |

TABLE 4-continued

| Production example | Luminescent color | Emission peak wavelength [nm] | Emission half-value width [nm] | Luminous efficiency | Shell absorption wavelength [nm] | Core particle diameter [nm] | Distribution of core particle diameter [%] | Core part bandgap energy [eV] | Shell part 1 bandgap energy [eV] | Chromaticity chart u' | Chromaticity chart v' |
|---|---|---|---|---|---|---|---|---|---|---|---|
| Production example 13g | Green | 526.6 | 38.3 | 0.496 | 457.4 | 2.7 | 15.0 | 2.35 | 2.72 | 0.0575 | 0.5782 |
| Production example 14g | Green | 530.1 | 40.5 | 0.175 | 457.3 | 1.7 | 17.9 | 2.34 | 2.72 | 0.0675 | 0.5791 |
| Production example 15g | Green | 528.6 | 42.2 | 0.099 | 455.6 | 4.2 | 16.2 | 2.35 | 2.72 | 0.0656 | 0.5776 |
| Production example 16g | Green | 534.4 | 39.6 | 0.108 | 456.2 | 2.4 | 16.8 | 2.32 | 2.72 | 0.0775 | 0.5808 |
| Production example 17g | Green | 531.9 | 38.2 | 0.500 | 456.7 | 2.7 | 15.2 | 2.33 | 2.72 | 0.0700 | 0.5807 |
| Production example 18g | Green | 530.9 | 42.5 | 0.221 | 456.8 | 1.7 | 17.8 | 2.34 | 2.72 | 0.0711 | 0.5786 |
| Production example 19g | Green | 526.9 | 37.5 | 0.521 | 433.0 | 2.7 | 13.2 | 2.35 | 2.86 | 0.0577 | 0.5787 |
| Production example 20g | Green | 534.6 | 42.1 | 0.178 | 432.7 | 1.7 | 18.6 | 2.32 | 2.86 | 0.0801 | 0.5800 |
| Comparative production example 1g | Green | 533.8 | 39.5 | 0.498 | 346.8 | 2.7 | 15.3 | 2.32 | 3.56 | 0.0760 | 0.5807 |
| Comparative production example 2g | Green | 529.1 | 38.7 | 0.403 | 346.9 | 4.2 | 14.3 | 2.34 | 3.56 | 0.0637 | 0.5794 |
| Comparative production example 3g | Green | 527.6 | 40.6 | 0.808 | 348.6 | 2.3 | 15.7 | 2.35 | 3.56 | 0.0619 | 0.5777 |
| Comparative production example 4g | Green | 527.3 | 38.2 | 0.584 | 347.3 | 2.6 | 14.7 | 2.35 | 3.56 | 0.0591 | 0.5787 |
| Comparative production example 5g | Green | 526.9 | 38.0 | 0.190 | 364.4 | 1.7 | 16.3 | 2.35 | 3.39 | 0.0580 | 0.5785 |
| Comparative production example 6g | Green | 530.4 | 38.8 | 0.109 | 367.1 | 4.2 | 15.9 | 2.34 | 3.39 | 0.0668 | 0.5799 |

Production Examples 1b to 22b

Productions of Various Blue Luminescent Semiconductor Phosphor Microparticles Using a method similar to that of Production example 1r, various blue luminescent semiconductor phosphor microparticles of Production examples 1b to 22b were produced using Synthetic examples A1 to A12 and Synthetic examples B1 to B10, as shown in Table 1. As shown in Table 1, semiconductor phosphor microparticles of Comparative production examples 1b to 6b were also produced. Luminescence and absorption characteristics of these semiconductor phosphor microparticle are shown in Table 5.

TABLE 5

| Production example | Luminescent color | Emission peak wavelength [nm] | Emission half-value width [nm] | Luminous efficiency | Shell absorption wavelength [nm] | Core particle diameter [nm] | Distribution of core particle diameter [%] | Core part bandgap energy [eV] | Shell part band gap energy [eV] | Chromaticity chart u' | Chromaticity chart v' |
|---|---|---|---|---|---|---|---|---|---|---|---|
| Production example 1b | Blue | 477.6 | 42.1 | 0.512 | 458.9 | 2.1 | 16.7 | 2.60 | 2.70 | 0.1035 | 0.2698 |
| Production example 2b | Blue | 482.6 | 62.4 | 0.511 | 457.6 | 2.1 | 29.4 | 2.57 | 2.70 | 0.0889 | 0.3515 |
| Production example 3b | Blue | 479.4 | 81.2 | 0.495 | 459.4 | 2.1 | 47.8 | 2.59 | 2.70 | 0.1009 | 0.3563 |
| Production example 4b | Blue | 478.5 | 41.8 | 0.475 | 458.8 | 2.1 | 18.6 | 2.59 | 2.70 | 0.0996 | 0.2788 |
| Production example 5b | Blue | 477.2 | 38.0 | 0.419 | 458.1 | 3.3 | 15.5 | 2.60 | 2.70 | 0.1056 | 0.2581 |
| Production example 6b | Blue | 476.2 | 41.8 | 0.410 | 457.8 | 2.8 | 15.7 | 2.60 | 2.70 | 0.1097 | 0.2546 |
| Production example 7b | Blue | 477.9 | 38.3 | 0.192 | 458.0 | 1.4 | 14.3 | 2.59 | 2.70 | 0.1025 | 0.2660 |
| Production example 8b | Blue | 478.9 | 60.0 | 0.234 | 458.1 | 1.4 | 27.4 | 2.59 | 2.70 | 0.0986 | 0.3159 |

TABLE 5-continued

| Production example | Luminescent color | Emission peak wavelength [nm] | Emission half-value width [nm] | Luminous efficiency | Shell absorption wavelength [nm] | Core particle diameter [nm] | Distribution of core particle diameter [%] | Core part bandgap energy [eV] | Shell part band gap energy [eV] | Chromaticity chart u' | Chromaticity chart v' |
|---|---|---|---|---|---|---|---|---|---|---|---|
| Production example 9b | Blue | 479.3 | 78.6 | 0.210 | 460.6 | 1.4 | 49.5 | 2.59 | 2.70 | 0.1004 | 0.3516 |
| Production example 10b | Blue | 481.6 | 42.0 | 0.207 | 459.4 | 1.4 | 17.7 | 2.57 | 2.70 | 0.0862 | 0.3134 |
| Production example 11b | Blue | 483.4 | 41.8 | 0.820 | 458.7 | 1.9 | 18.6 | 2.57 | 2.70 | 0.0789 | 0.3325 |
| Production example 12b | Blue | 479.3 | 38.8 | 0.583 | 458.2 | 2.0 | 16.9 | 2.59 | 2.70 | 0.0958 | 0.2828 |
| Production example 13b | Blue | 480.2 | 42.4 | 0.498 | 457.7 | 2.1 | 18.1 | 2.58 | 2.72 | 0.0923 | 0.2983 |
| Production example 14b | Blue | 484.3 | 41.9 | 0.224 | 457.3 | 1.4 | 16.2 | 2.56 | 2.72 | 0.0754 | 0.3426 |
| Production example 15b | Blue | 477.8 | 39.7 | 0.077 | 455.8 | 3.3 | 15.2 | 2.60 | 2.72 | 0.1027 | 0.2678 |
| Production example 16b | Blue | 481.0 | 37.9 | 0.116 | 456.7 | 1.8 | 14.4 | 2.58 | 2.72 | 0.0881 | 0.3003 |
| Production example 17b | Blue | 484.5 | 41.8 | 0.509 | 455.9 | 2.1 | 18.1 | 2.56 | 2.72 | 0.0744 | 0.3450 |
| Production example 18b | Blue | 484.6 | 41.9 | 0.206 | 455.5 | 1.4 | 15.7 | 2.56 | 2.72 | 0.0741 | 0.3465 |
| Production example 19b | Blue | 478.4 | 41.8 | 0.481 | 433.6 | 2.1 | 17.9 | 2.59 | 2.86 | 0.1002 | 0.2773 |
| Production example 20b | Blue | 480.8 | 40.2 | 0.188 | 432.5 | 1.4 | 14.8 | 2.58 | 2.86 | 0.0896 | 0.3010 |
| Comparative production example 1b | Blue | 482.3 | 40.5 | 0.501 | 349.6 | 2.1 | 16.5 | 2.57 | 3.56 | 0.0828 | 0.3193 |
| Comparative production example 2b | Blue | 484.4 | 39.1 | 0.379 | 347.2 | 3.3 | 16.2 | 2.56 | 3.56 | 0.0736 | 0.3413 |
| Comparative production example 3b | Blue | 477.4 | 41.0 | 0.813 | 349.1 | 1.9 | 18.0 | 2.60 | 3.56 | 0.1046 | 0.2652 |
| Comparative production example 4b | Blue | 478.1 | 39.3 | 0.582 | 348.4 | 2.0 | 14.7 | 2.59 | 3.56 | 0.1017 | 0.2694 |
| Comparative production example 5b | Blue | 481.5 | 38.2 | 0.194 | 365.9 | 1.4 | 16.0 | 2.58 | 3.39 | 0.0856 | 0.3072 |
| Comparative production example 6b | Blue | 476.8 | 39.4 | 0.080 | 367.1 | 3.3 | 16.9 | 2.60 | 3.39 | 0.1072 | 0.2566 |

<<Variation in Absorption-Emission Spectrum Depending on Difference in Shell Part of Semiconductor Phosphor Microparticle>>

Figure 17:
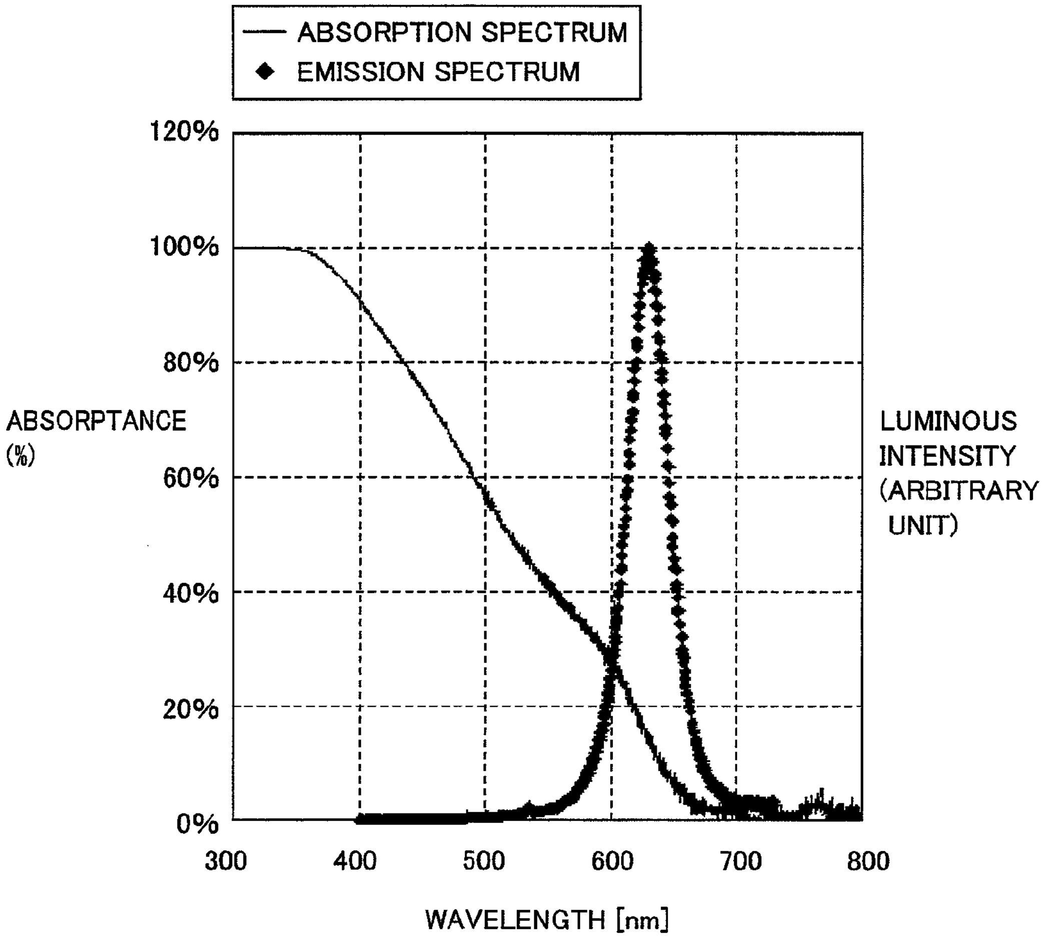
FIG. 17 is an absorption-emission spectrum of an InP/ZnS semiconductor phosphor microparticle synthesized in Comparative production example 1r.
Figure 18:
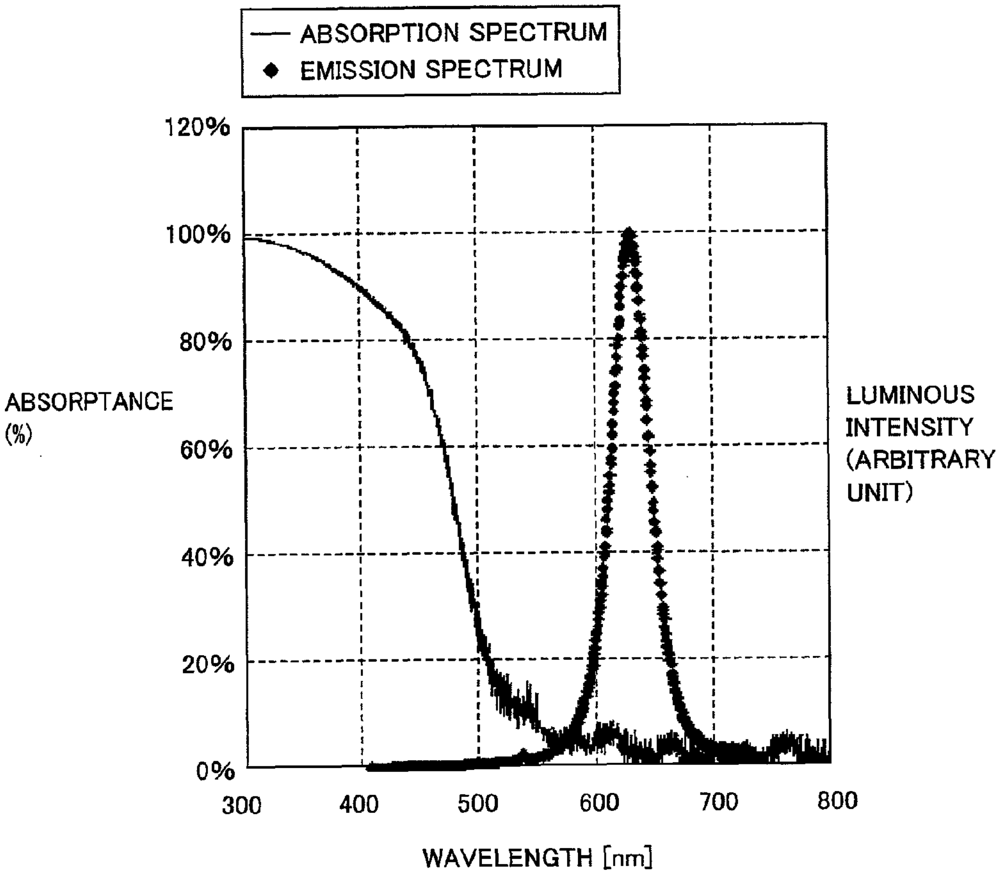
FIG. 18 is an absorption-emission spectrum of an InP/ZnS semiconductor phosphor microparticle synthesized in Production example 1r.

In the following, influence of the difference in shell part on the absorption-emission spectrum of the semiconductor phosphor microparticle will be examined. FIG. 17 shows an absorption-emission spectrum of an InP/ZnS semiconductor phosphor microparticle synthesized in Comparative production example 1r. FIG. 18 shows an absorption-emission spectrum of an InP/ZnSe semiconductor phosphor microparticle synthesized in Production example 1r. In both samples, measurement is conducted while concentration of the semiconductor phosphor microparticle is adjusted so that absorptance at 400 nm is about 90%.

FIG. 17 reveals that the InP/ZnS semiconductor phosphor microparticle synthesized in Comparative production example 1r shows an absorptance of 14.0% at 630.7 nm which is an emission peak of the InP core part, and an absorptance of 27.9% at 600 nm which is a skirt of the emission peak. On the other hand, FIG. 18 reveals that the InP/ZnSe semiconductor phosphor microparticle synthesized in Production example 1r shows an absorptance of 3.1% at 629.2 nm which is an emission peak of the InP core part, and an absorptance of 6.1% at 600 nm which is a skirt of the emission peak. In other words, it is found that the InP/ZnSe semiconductor phosphor microparticle has small absorptance at its own emission wavelength, in comparison with the InP/ZnS semiconductor phosphor microparticle.

This difference is considered to result from presence or absence of absorption of excitation light in the shell part. As shown in Table 2, bandgap of the ZnS shell part is 3.56 eV. Therefore, the ZnS shell part is able to absorb only the light having a wavelength smaller than 347.9 nm, and when excitation is caused with blue to UV light at 350 to 460 nm, the light needs to be absorbed in the InP core part. For this reason, it is necessary to increase the concentration of the InP core part, and absorptance in its own emission wavelength range increases. On the other hand, as shown in Table 2, bandgap of the ZnSe shell part is 2.70 eV. Therefore, the ZnSe shell part absorbs the light having a wavelength shorter than 459.2 nm. Therefore, when the InP/ZnS semiconductor phosphor microparticle is excited with blue to UV light at 350 to 450 nm, the light is absorbed in the shell part. As a result, it is possible to suppress the absorptance in the own emission wavelength range.

From the above, it is demonstrated that self absorption can be suppressed by making the shell part absorb the excitation light of the semiconductor phosphor microparticle. Less self absorption is preferred because susceptibility of concentration quenching decreases.

<<Examination of Influence of Absorptance of Semiconductor Phosphor Microparticle on Luminous Efficiency>>

In the following, influence of absorptance of the semiconductor phosphor microparticle on the luminous efficiency will be examined.

Figure 19:
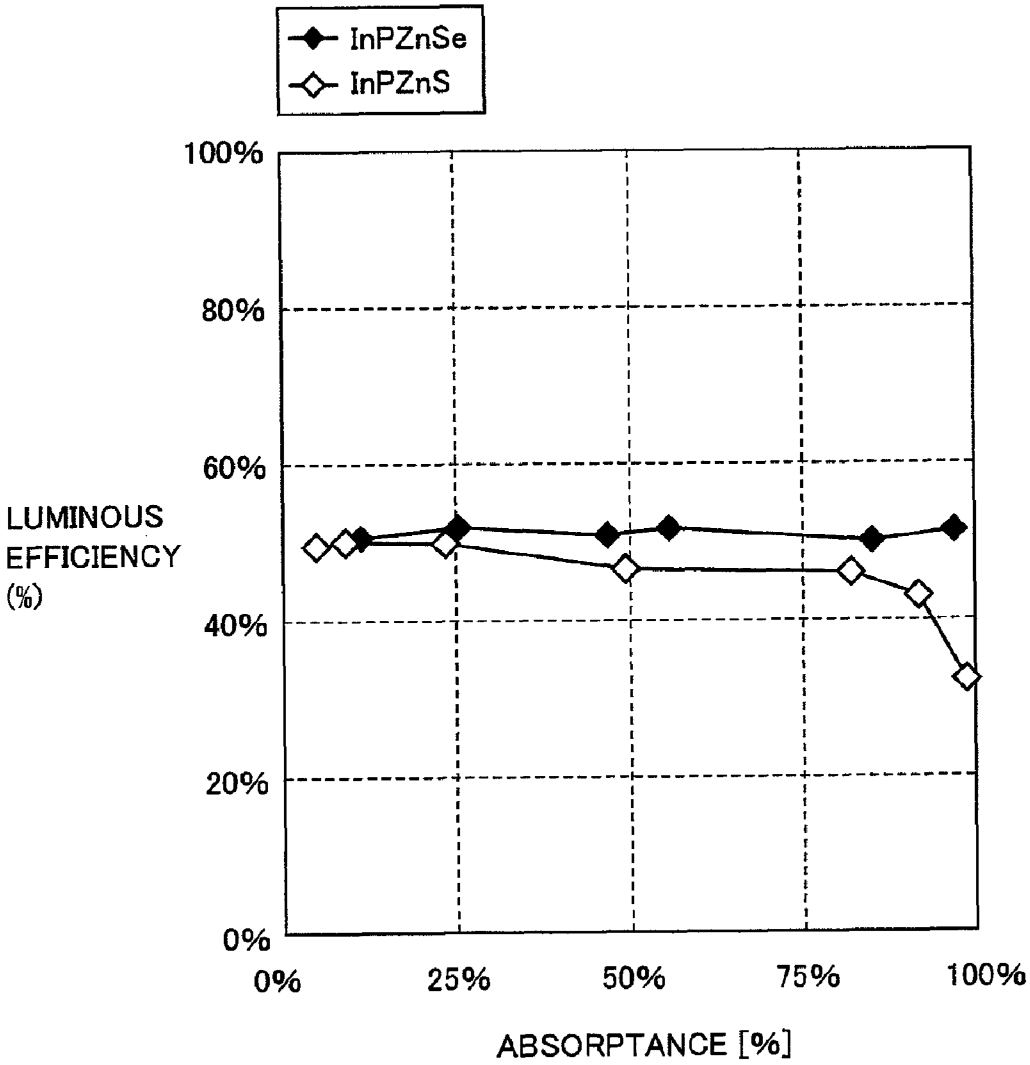
FIG. 19 is a graph showing dependency of luminous efficiency on absorptance of an InP/ZnS semiconductor phosphor microparticle synthesized in Comparative production example 1r and an InP/ZnSe semiconductor phosphor microparticle synthesized in Production example 1r.

FIG. 19 is a graph showing dependency of luminous efficiency on absorptance in the InP/ZnS semiconductor phosphor microparticle synthesized in Comparative production example 1r and in the InP/ZnSe semiconductor phosphor microparticle synthesized in Production example 1r. In FIG. 19, the horizontal axis represents absorptance at 405 nm of phosphor, and the vertical axis represents luminous efficiency of phosphor when excited at 405 nm.

According to FIG. 19, in the InP/ZnS semiconductor phosphor microparticle synthesized in Comparative production example 1r, the luminous efficiency that is 49.7% at an absorptance of 9.1% decreases to the luminous efficiency of 42.8% at an absorptance of 91.9%, and the tendency that the luminous efficiency decreases as the absorptance increases is observed. On the other hand, in the InP/ZnSe semiconductor phosphor microparticle synthesized in Production example 1r, the luminous efficiency that is 51.8% at an absorptance of 25.2% is still 50.1% at an absorptance of 84.9%, and decrease in luminous efficiency is not observed.

This difference is attributable to difference in self absorption. In the InP/ZnS semiconductor phosphor microparticle in which the shell part allows transmission of excitation light, the influence of the self absorption is large, and decrease in luminous efficiency due to concentration quenching appears significantly. On the other hand, in the InP/ZnSe semiconductor phosphor microparticle in which excitation light is absorbed in the shell part, almost no decrease in luminous efficiency due to concentration quenching is observed. In other words, it was found that by making the shell part absorb excitation light of the semiconductor phosphor microparticle, influence of concentration quenching can be reduced.

<<Examination of Semiconductor Phosphor Microparticle Having a Multi-Shell Structure>>

In the following, a semiconductor phosphor microparticle having a multi-shell structure will be examined.

First, comparison will be made between the semiconductor phosphor microparticles synthesized in Production example 1r and in Production example 4r. Semiconductor phosphor microparticles synthesized in Production example 1r and in Production example 4r are identical in the point that they are InP/ZnSe semiconductor phosphor microparticles. They differ from each other only in the point that in Production example 4r, a multi-shell structure in which a $SiO_2$ shell part is further provided outside the ZnSe shell part is employed.

The semiconductor phosphor microparticles synthesized in Production example 1r and in Production example 4r were aged for 30 days at 100° C. in an atmospheric environment, and decrease in luminous efficiency was observed. In the semiconductor phosphor microparticle of Production example 1r, decrease of 28.7% in luminous efficiency was observed after aging, while in the semiconductor phosphor microparticle of Production example 4r, decrease in luminous efficiency was only 7.4%. Similar tendency was observed also for the yellow phosphors of Production example 1y and Production example 4y, green phosphors of Production example 1g and Production example 4g, and blue phosphors of Production example 1b and Production example 4b.

Also comparison will be made between the semiconductor phosphor microparticles synthesized in Production example 7r and in Production example 10r. The semiconductor phosphor microparticles synthesized in Production example 7r and in Production example 10r are identical in the point that they are InN/ZnSe semiconductor phosphor microparticles. The semiconductor phosphor microparticles in production example 10r differs only in that it has a multi-shell structure in which a $SiO_2$ shell part is further provided outside the ZnSe shell part.

Semiconductor phosphor microparticles synthesized in Production example 7r and in Production example 10r were aged for 30 days at 100° C. in an atmospheric environment, and decrease in luminous efficiency was observed. In the semiconductor phosphor microparticle of Production example 7r, decrease of 43.2% in luminous efficiency was observed after aging, while in the semiconductor phosphor microparticle of Production example 10r, decrease in luminous efficiency was only 19.4%.

Similar tendency was observed also for the yellow phosphors of Production example 7y and Production example 10y, green phosphors of Production example 7g and Production example 10g, and blue phosphors of Production example 7b and Production example 10b.

This is attributable to the fact that by adding a chemically stable $SiO_2$ shell part, influence of water, oxygen and the like on the core part and the shell part is alleviated. From these results, it was confirmed that durability of a semiconductor phosphor microparticle can be improved by employing a multi-shell structure made up of a plurality of shell parts.

<<Effect of Using Mixed Crystal Semiconductor Material for Core Part of Semiconductor Phosphor Microparticle>>

In the following, a semiconductor phosphor microparticle using a mixed crystal material will be examined.

Production example 1r, Production example 5r and Production example 6r are synthesized in the same manner except for the core part. The difference is that in Production example 1r, an InP material having a particle diameter of 3.8 nm is used for the core part, while in Production example 5r, an $In_{0.5}Ga_{0.5}P$ mixed crystal material having a particle diameter of 6.1 nm is used, and in Production example 6r, an $In_{0.7}Ga_{0.3}P$ mixed crystal material having a particle diameter of 5.4 nm is used. From Table 2, it can be seen that in any of the semiconductor phosphor microparticles fabricated in these production methods, emission wavelength is 630 nm.

Production example 14r, Production example 15r, and Production example 16r are synthesized in the same manner except for the core part. The difference is that in Production example 14r, an InN material having a particle diameter of 2.0 nm is used for the core part, while in Production example 15r, an $In_{0.6}Ga_{0.4}N$ mixed crystal material having a particle diameter of 6.0 nm is used, and in Production example 16r, an $In_{0.8}Ga_{0.2}N$ mixed crystal material having a particle diameter of 3.4 nm is used. From Table 2, it can be seen that in any of the semiconductor phosphor microparticles fabricated in these production methods, emission wavelength is 630 nm.

Similar tendency was observed also in Production example 1y and Production example 5y and Production example 6y, Production example 1g and Production example 5g and Production example 6g, Production example 1b and Production example 5b and Production example 6y, Production example 14y and Production example 15y and Production example 16y, Production example 14g and Production example 15g and Production example 16g, Production example 14b and Production example 15b and Production example 16b. That is, it was found that by using a mixed crystal semiconductor material for a core part of the semiconductor phosphor microparticle, emission wavelength of the phosphor can be controlled not only by the particle diameter but also by the mixed crystal ratio.

<Fabrication of Light Emitting Device>

In the following, a method of producing a light emitting device including a light emitting element, and a semiconductor phosphor microparticle of a core/shell structure having a shell part absorbing at least a part of the light emitted from the light emitting element will be described. Further, in the following examples, for measuring chromaticity point, luminous efficiency and color rendering property index of a light emitting device, a luminescence measuring system MCPD-7000 (available from OTSUKA ELECTRONICS CO. LTD.) was used.

Examples A1

Light Emitting Device Including InP/ZnSe Red Phosphor, InP/ZnSe Green Phosphor, and Blue Luminescent Semiconductor Diode Element In Example A1, a method of producing a light emitting device including an InP/ZnSe red phosphor, an InP/ZnSe green phosphor, and a blue luminescent semiconductor diode element will be described.

First, a red phosphor fabricated by Production example A1, and a green phosphor fabricated by Production example B1 were mixed in such a weight ratio that the weight of green phosphor was 0.883, with respect to the weight of the red phosphor of 0.117, as shown in "Weight mixing ratio of various phosphors" in Table 6, to obtain a phosphor mixture.

This phosphor mixture was dispersed in silicone resin so that the red phosphor and the green phosphor were dispersed such that the weight of the silicone resin was 101.8, relative to 1 of the weight of the phosphor mixture, as shown in "Phosphor/resin weight mixing ratio" in Table 6, to obtain mold resin.

Next, using the mold resin obtained above, a blue semiconductor light emitting diode element having an InGaN semiconductor active layer having an emission peak wavelength at 450 was sealed, and a light emitting device of Example 1 having the structure as shown in FIG. 1 was fabricated.

Chromaticity point, luminous efficiency and color rendering property index of the light emitting device fabricated in Example A1 are shown in Table 7. The light emitting device fabricated in Example A1 was proved to exhibit white color of chromaticity point(u', v')=(0.1999, 0.3967). The color rendering property index was proved to be 46.4. Taking luminous efficiency of this light emitting device as a standard, luminous efficiency of a light emitting device fabricated hereinafter was determined as a relative value, relative to the luminous efficiency of this light emitting device as 100%.

TABLE 6

| | Configuration of light emitting device | | | | | |
|---|---|---|---|---|---|---|
| | | | Synthetic method of phosphor for use | | | |
| Example | Structure | Light-emitting element | Red phosphor | Yellow phosphor | Green phosphor | Blue phosphor |
| Example A1 | Light-emitting device 1 | Blue semiconductor light emitting diode element | Production example 1r | — | Production example 1g | — |
| Example A2 | Light-emitting device 1 | Blue semiconductor light emitting diode element | Production example 2r | — | Production example 2g | — |
| Example A3 | Light-emitting device 1 | Blue semiconductor light emitting diode element | Production example 3r | — | Production example 3g | — |
| Example A4 | Light-emitting device 1 | Blue semiconductor light emitting diode element | Production example 4r | — | Production example 4g | — |
| Example A5 | Light-emitting device 1 | Blue semiconductor light emitting diode element | Production example 5r | — | Production example 5g | — |
| Example A6 | Light-emitting device 1 | Blue semiconductor light emitting diode element | Production example 6r | — | Production example 6g | — |
| Example A7 | Light-emitting device 1 | Blue semiconductor light emitting diode element | Production example 7r | — | Production example 7g | — |
| Example A8 | Light-emitting device 1 | Blue semiconductor light emitting diode element | Production example 8r | — | Production example 8g | — |
| Example A9 | Light-emitting device 1 | Blue semiconductor light emitting diode element | Production example 9r | — | Production example 9g | — |
| Example A10 | Light-emitting device 1 | Blue semiconductor light emitting diode element | Production example 10r | — | Production example 10g | — |
| Example A11 | Light-emitting device 1 | Blue semiconductor light emitting diode element | Production example 11r | — | Production example 11g | — |
| Example A12 | Light-emitting device 1 | Blue semiconductor light emitting diode element | Production example 12r | — | Production example 12g | — |
| Example A13 | Light-emitting device 1 | Blue semiconductor light emitting diode element | Production example 13r | — | Production example 13g | — |
| Example A14 | Light-emitting device 1 | Blue semiconductor light emitting diode element | Production example 14r | — | Production example 14g | — |
| Example A15 | Light-emitting device 1 | Blue semiconductor light emitting diode element | Production example 15r | — | Production example 15g | — |
| Example A16 | Light-emitting device 1 | Blue semiconductor light emitting diode element | Production example 16r | — | Production example 16g | — |
| Example A17 | Light-emitting device 1 | Blue semiconductor light emitting diode element | Production example 17r | — | Production example 17g | — |
| Example A18 | Light-emitting device 1 | Blue semiconductor light emitting diode element | Production example 18r | — | Production example 18g | — |
| Example A19 | Light-emitting device 1 | Blue semiconductor light emitting diode element | Production example 21r | — | Production example 1g | — |

TABLE 6-continued

| | | | | | | |
|---|---|---|---|---|---|---|
| Example A20 | Light-emitting device 1 | Blue semiconductor light emitting diode element | Production example 22r | — | Production example 7g | — |
| Example A21 | Light-emitting device 1 | Blue semiconductor light emitting diode element | — | Production example 1y | — | — |
| Example A22 | Light-emitting device 1 | Blue semiconductor light emitting diode element | — | Production example 7y | — | — |
| Example A23 | Light-emitting device 1 | Blue semiconductor light emitting diode element | Production example 1r | Production example 1y | Production example 1g | — |
| Example A24 | Light-emitting device 1 | Blue semiconductor light emitting diode element | Production example 7r | Production example 7y | Production example 7g | — |
| Example A25 | Light-emitting device 1 | Blue semiconductor light emitting diode element | Production example 1r | — | Production example 1g | Production example 1b |
| Example A26 | Light-emitting device 1 | Blue semiconductor light emitting diode element | Production example 7r | — | Production example 7g | Production example 7b |
| Example A27 | Light-emitting device 1 | Blue semiconductor light emitting diode element | Production example 1r | — | Production example 7g | — |
| Example A28 | Light-emitting device 1 | Blue semiconductor light emitting diode element | Production example 5r | — | Production example 11g | — |
| Example A29 | Light-emitting device 1 | Blue semiconductor light emitting diode element | Production example 1r | — | — | — |
| Example A30 | Light-emitting device 1 | Blue semiconductor light emitting diode element | — | — | Production example 1g | — |
| Example A31 | Light-emitting device 1 | Blue semiconductor light emitting diode element | — | — | — | Production example 1b |
| Comparative Example A1 | Light-emitting device 1 | Blue semiconductor light emitting diode element | Comparative Production example 1r | — | Comparative Production example 1g | — |
| Comparative Example A2 | Light-emitting device 1 | Blue semiconductor light emitting diode element | Comparative Production example 2r | — | Comparative Production example 2g | — |
| Comparative Example A3 | Light-emitting device 1 | Blue semiconductor light emitting diode element | Comparative Production example 3r | — | Comparative Production example 3g | — |
| Comparative Example A4 | Light-emitting device 1 | Blue semiconductor light emitting diode element | Comparative Production example 4r | — | Comparative Production example 4g | — |
| Comparative Example A5 | Light-emitting device 1 | Blue semiconductor light emitting diode element | Comparative Production example 5r | — | Comparative Production example 5g | — |
| Comparative Example A6 | Light-emitting device 1 | Blue semiconductor light emitting diode element | Comparative Production example 6r | — | Comparative Production example 6g | — |

| | Fabrication method of light emitting device | | | | | |
|---|---|---|---|---|---|---|
| | Mixing ratio of various phosphors | | | | Phosphor/resin weight mixing ratio | |
| Example | Red phosphor | Yellow phosphor | Green phosphor | Blue phosphor | Phosphor mixture | Resin |
| Example A1 | 0.117 | — | 0.883 | — | 1.000 | 101.8 |
| Example A2 | 0.112 | — | 0.888 | — | 1.000 | 90.5 |
| Example A3 | 0.100 | — | 0.900 | — | 1.000 | 78.1 |
| Example A4 | 0.116 | — | 0.884 | — | 1.000 | 103.3 |
| Example A5 | 0.106 | — | 0.894 | — | 1.000 | 77.0 |
| Example A6 | 0.129 | — | 0.871 | — | 1.000 | 73.7 |
| Example A7 | 0.112 | — | 0.888 | — | 1.000 | 35.0 |
| Example A8 | 0.115 | — | 0.885 | — | 1.000 | 34.9 |
| Example A9 | 0.141 | — | 0.859 | — | 1.000 | 42.6 |
| Example A10 | 0.123 | — | 0.877 | — | 1.000 | 39.5 |
| Example A11 | 0.120 | — | 0.880 | — | 1.000 | 161.7 |
| Example A12 | 0.123 | — | 0.877 | — | 1.000 | 123.2 |
| Example A13 | 0.127 | — | 0.873 | — | 1.000 | 104.3 |
| Example A14 | 0.120 | — | 0.880 | — | 1.000 | 39.5 |
| Example A15 | 0.122 | — | 0.878 | — | 1.000 | 16.5 |
| Example A16 | 0.117 | — | 0.883 | — | 1.000 | 23.1 |
| Example A17 | 0.128 | — | 0.872 | — | 1.000 | 99.1 |
| Example A18 | 0.124 | — | 0.876 | — | 1.000 | 38.0 |
| Example A19 | 0.117 | — | 0.883 | — | 1.000 | 99.7 |
| Example A20 | 0.130 | — | 0.870 | — | 1.000 | 35.0 |
| Example A21 | — | 1.000 | — | — | 1.000 | 176.0 |
| Example A22 | — | 1.000 | — | — | 1.000 | 57.1 |
| Example A23 | 0.076 | 0.323 | 0.601 | — | 1.000 | 123.9 |
| Example A24 | 0.076 | 0.323 | 0.600 | — | 1.000 | 42.2 |
| Example A25 | 0.064 | — | 0.358 | 0.577 | 1.000 | 33.0 |
| Example A26 | 0.062 | — | 0.368 | 0.570 | 1.000 | 11.1 |
| Example A27 | 0.111 | — | 0.889 | — | 1.000 | 103.7 |
| Example A28 | 0.110 | — | 0.890 | — | 1.000 | 76.6 |
| Example A29 | 1.000 | — | — | — | 1.000 | 99.9 |

TABLE 6-continued

| | | | | | | |
|---|---|---|---|---|---|---|
| Example A30 | — | — | 1.000 | — | 1.000 | 13.2 |
| Example A31 | — | — | — | 1.000 | 1.000 | 11.7 |
| Comparative Example A1 | 0.114 | — | 0.886 | — | 1.000 | 98.8 |
| Comparative Example A2 | 0.128 | — | 0.872 | — | 1.000 | 77.5 |
| Comparative Example A3 | 0.112 | — | 0.888 | — | 1.000 | 157.9 |
| Comparative Example A4 | 0.124 | — | 0.876 | — | 1.000 | 113.3 |
| Comparative Example A5 | 0.135 | — | 0.865 | — | 1.000 | 36.2 |
| Comparative Example A6 | 0.118 | — | 0.882 | — | 1.000 | 18.0 |

TABLE 7

| | Structure of light emitting device | | Characteristics of light emitting device | | | |
|---|---|---|---|---|---|---|
| | Excitation light energy from light emitting element | Bandgap energy of semiconductor particle phosphor shell part | Chromaticity point | | Brightness | Color rendering property index |
| Example | [eV] | [eV] | u' | v' | [%] | (Ra) |
| Example A1 | 2.76 | 2.70 | 0.1999 | 0.3967 | 100.0% | 46.4 |
| Example A2 | 2.76 | 2.70 | 0.2008 | 0.4020 | 98.9% | 66.2 |
| Example A3 | 2.76 | 2.70 | 0.2005 | 0.4073 | 101.4% | 81.9 |
| Example A4 | 2.76 | 2.70 | 0.1996 | 0.3965 | 103.3% | 46.9 |
| Example A5 | 2.76 | 2.70 | 0.1977 | 0.3991 | 88.3% | 57.4 |
| Example A6 | 2.76 | 2.70 | 0.2000 | 0.3970 | 79.4% | 42.4 |
| Example A7 | 2.76 | 2.70 | 0.1977 | 0.3992 | 47.0% | 53.6 |
| Example A8 | 2.76 | 2.70 | 0.2008 | 0.4020 | 49.0% | 61.1 |
| Example A9 | 2.76 | 2.70 | 0.2184 | 0.3907 | 45.0% | 64.2 |
| Example A10 | 2.76 | 2.70 | 0.1996 | 0.3968 | 45.8% | 48.0 |
| Example A11 | 2.76 | 2.70 | 0.2006 | 0.3958 | 135.3% | 46.9 |
| Example A12 | 2.76 | 2.70 | 0.2040 | 0.3932 | 111.2% | 41.6 |
| Example A13 | 2.76 | 2.72 | 0.2050 | 0.3915 | 95.7% | 33.9 |
| Example A14 | 2.76 | 2.72 | 0.2003 | 0.3965 | 44.7% | 46.6 |
| Example A15 | 2.76 | 2.72 | 0.2021 | 0.3951 | 22.6% | 41.4 |
| Example A16 | 2.76 | 2.72 | 0.1965 | 0.4004 | 29.0% | 53.8 |
| Example A17 | 2.76 | 2.72 | 0.2001 | 0.3961 | 96.1% | 43.4 |
| Example A18 | 2.76 | 2.72 | 0.2031 | 0.3943 | 47.2% | 42.4 |
| Example A19 | 2.76 | 2.27 | 0.2002 | 0.3967 | 79.5% | 50.4 |
| Example A20 | 2.76 | 2.27 | 0.2012 | 0.3949 | 41.7% | 37.2 |
| Example A21 | 2.76 | 2.70 | 0.2416 | 0.3835 | 144.7% | 40.3 |
| Example A22 | 2.76 | 2.70 | 0.2307 | 0.3936 | 73.0% | 40.8 |
| Example A23 | 2.76 | 2.70 | 0.2167 | 0.3922 | 99.4% | 73.5 |
| Example A24 | 2.76 | 2.70 | 0.2120 | 0.3967 | 47.6% | 75.9 |
| Example A25 | 2.76 | 2.70 | 0.2013 | 0.4032 | 68.6% | 36.3 |
| Example A26 | 2.76 | 2.70 | 0.1993 | 0.4057 | 29.0% | 45.2 |
| Example A27 | 2.76 | 2.70 | 0.1980 | 0.3990 | 68.2% | 54.7 |
| Example A28 | 2.76 | 2.70 | 0.1989 | 0.3976 | 105.8% | 52.8 |
| Example A29 | 2.76 | 2.70 | 0.4393 | 0.4454 | — | — |
| Example A30 | 2.76 | 2.70 | 0.0675 | 0.5455 | — | — |
| Example A31 | 2.76 | 2.70 | 0.1127 | 0.3095 | — | — |
| Comparative Example A1 | 2.76 | 3.56 | 0.1981 | 0.3986 | 76.8% | 51.9 |
| Comparative Example A2 | 2.76 | 3.56 | 0.2002 | 0.3960 | 60.2% | 40.3 |
| Comparative Example A3 | 2.76 | 3.56 | 0.2009 | 0.3960 | 98.8% | 45.9 |
| Comparative Example A4 | 2.76 | 3.56 | 0.2010 | 0.3953 | 78.1% | 40.2 |
| Comparative Example A5 | 2.76 | 3.39 | 0.2013 | 0.3947 | 29.4% | 33.6 |
| Comparative Example A6 | 2.76 | 3.39 | 0.1996 | 0.3967 | 19.3% | 46.0 |

Examples A2 to A31, Comparative Examples A1 to A6

Light Emitting Devices Including Various Phosphors, and Blue Luminescent Semiconductor Diode Element A method of producing a light emitting device including various semiconductor phosphor microparticles, and a blue luminescent semiconductor diode element will be described. Light emitting devices of Examples A2 to A31 and Comparative examples A1 to A6 were fabricated in a similar manner as that of Example A1 except for the kind and the quantity of various phosphors and the quantity of the silicone resin. Concretely, similarly to Example A1, various phosphors were mixed in a weight ratio shown in "Weight mixing ratio of various phosphors" of Table 6, to obtain a phosphor mixture. Then the phosphor mixture and the silicone resin were mixed in a mixing ratio shown in "Phosphor/resin weight mixing ratio" of Table 6, to obtain mold resin.

Next, using the mold resin obtained above, a blue semiconductor light emitting diode element having an InGaN semiconductor active layer having an emission peak wavelength of 450 nm was sealed, and a light emitting device of Examples A2 to A31, and Comparative examples A1 to A6 having the structure as shown in FIG. 1 was fabricated. The light emitting devices produced in these methods were evaluated, and chromaticity point, luminous efficiency and color rendering property index shown in Table 7 were determined.

Examples B1 to B4, Comparative Examples B1 to B2

Light Emitting Devices Including Various Phosphors, and UV Luminescent Semiconductor Diode Element A method of producing a light emitting device including various semiconductor phosphor microparticles, and a UV luminescent semiconductor diode element will be described. Light emitting devices of Examples B1 to B4 and Comparative examples B1 to B2 were fabricated in a similar manner as that of Example A1 except for the kind and the quantity of various phosphors, the quantity of the silicone resin and use of a UV luminescent semiconductor diode element as a light emitting element. Concretely, similarly to Example A1, various phosphors were mixed in a weight ratio shown in "Weight mixing ratio of various phosphors" of Table 8, to obtain a phosphor mixture. Then the phosphor mixture and the silicone resin were mixed in a mixing ratio shown in "Phosphor/resin weight mixing ratio" of Table 8, to obtain mold resin.

Next, using the mold resin obtained above, a UV semiconductor light emitting diode element having an InGaN semiconductor active layer having emission peak wavelength of 380 nm was sealed, and light emitting devices of Examples B1 to B4, and Comparative examples B1 to B2 having the structure as shown in FIG. 1 were fabricated. The light emitting devices produced in these methods were evaluated, and chromaticity point, luminous efficiency and color rendering property index shown in Table 9 were determined.

TABLE 8

| | Configuration of light emitting device | | | | | |
|---|---|---|---|---|---|---|
| | | | Synthetic method of phosphor for use | | | |
| Example | Structure | Light emitting element | Red phosphor | Yellow phosphor | Green phosphor | Blue phosphor |
| Example B1 | Light emitting device 1 | UV semiconductor light emitting diode element | Production example 1r | — | Production example 1g | Production example 1b |
| Example B2 | Light emitting device 1 | UV semiconductor light emitting diode element | Production example 7r | — | Production example 7g | Production example 7b |
| Example B3 | Light emitting device 1 | UV semiconductor light emitting diode element | Production example 19r | — | Production example 19g | Production example 19b |
| Example B4 | Light emitting device 1 | UV semiconductor light emitting diode element | Production example 20r | — | Production example 20g | Production example 20b |
| Comparative Example B1 | Light emitting device 1 | UV semiconductor light emitting diode element | Comparative Production example 1r | — | Comparative Production example 1g | Comparative Production example 1b |
| Comparative Example B2 | Light emitting device 1 | UV semiconductor light emitting diode element | Comparative Production example 5r | — | Comparative Production example 5g | Comparative Production example 5b |

| | Fabrication method of light emitting device | | | | | |
|---|---|---|---|---|---|---|
| | Mixing ratio of various phosphors | | | | Phosphor/resin weight mixing ratio | |
| Example | Red phosphor | Yellow phosphor | Green phosphor | Blue phosphor | Phosphor mixture | Resin |
| Example B1 | 0.039 | — | 0.117 | 0.844 | 1.000 | 11.7 |
| Example B2 | 0.039 | — | 0.129 | 0.832 | 1.000 | 3.9 |
| Example B3 | 0.045 | — | 0.112 | 0.843 | 1.000 | 10.9 |
| Example B4 | 0.038 | — | 0.085 | 0.877 | 1.000 | 4.9 |
| Comparative Example B1 | 0.040 | — | 0.065 | 0.895 | 1.000 | 11.9 |
| Comparative Example B2 | 0.045 | — | 0.084 | 0.871 | 1.000 | 4.5 |

TABLE 9

| | Structure of light emitting device | | Characteristics of light emitting device | | | |
|---|---|---|---|---|---|---|
| | Excitation light energy from light emitting element | Bandgap energy of semiconductor particle phosphor shell part | Chromaticity point | | Brightness | Color rendering property index |
| Example | [eV] | [eV] | u' | v' | [%] | (Ra) |
| Example B1 | 3.26 | 2.70 | 0.2037 | 0.4157 | 85.9% | −1.8 |
| Example B2 | 3.26 | 2.70 | 0.2016 | 0.4189 | 34.2% | 6.5 |
| Example B3 | 3.26 | 2.86 | 0.2049 | 0.4152 | 76.6% | −14.3 |
| Example B4 | 3.26 | 2.86 | 0.2048 | 0.4196 | 35.0% | −10.2 |
| Comparative Example B1 | 3.26 | 3.56 | 0.2064 | 0.4193 | 51.5% | −25.5 |
| Comparative Example B2 | 3.26 | 3.39 | 0.2065 | 0.4191 | 30.4% | −31.9 |

Examples C1 to C2, Comparative Examples C1 to C2

Light Emitting Devices Including Various Phosphors, and Blue Luminescent Semiconductor Laser Diode Element A method of producing a light emitting device including various semiconductor phosphor microparticles, and a blue luminescent semiconductor laser diode element will be described. Light emitting devices of Examples C1 to C2 and Comparative examples C1 to C2 were fabricated in a similar manner as that of Example A1 except for the kind and the quantity of various phosphors, the quantity of the silicone resin and use of a blue luminescent semiconductor laser diode element as a light emitting element. Concretely, similarly to Example A1, various phosphors were mixed in a weight ratio shown in "Weight mixing ratio of various phosphors" of Table 10, to obtain a phosphor mixture. Then the phosphor mixture and the silicone resin were mixed in a mixing ratio shown in "Phosphor/resin weight mixing ratio" of Table 10, to obtain mold resin.

Next, using the mold resin obtained above, a blue semiconductor light emitting laser diode element having an InGaN semiconductor active layer having emission peak wavelength of 450 nm was sealed, and light emitting devices of Examples C1 to C2 and Comparative examples C1 to C2 having the structure as shown in FIG. 2 were fabricated, The light emitting devices produced in these methods were evaluated, and chromaticity point, luminous efficiency and color rendering property index shown in Table 11 were determined

TABLE 10

| | Configuration of light emitting device | | | | | |
|---|---|---|---|---|---|---|
| | | | Synthetic method of phosphor for use | | | |
| Example | Structure | Light emitting element | Red phosphor | Yellow phosphor | Green phosphor | Blue phosphor |
| Example C1 | Light emitting device 21 | Blue semiconductor light emitting laser diode element | Production example 1r | — | Production example 1g | — |
| Example C2 | Light emitting device 21 | Blue semiconductor light emitting laser diode element | Production example 7r | — | Production example 7g | — |
| Comparative Example C1 | Light emitting device 21 | Blue semiconductor light emitting laser diode element | Comparative Production example 1r | — | Comparative Production example 1g | — |
| Comparative Example C2 | Light emitting device 21 | Blue semiconductor light emitting laser diode element | Comparative Production example 5r | — | Comparative Production example 5g | — |

| | Fabrication method of light emitting device | | | | | |
|---|---|---|---|---|---|---|
| | Mixing ratio of various phosphors | | | | Phosphor/resin weight mixing ratio | |
| Example | Red phosphor | Yellow phosphor | Green phosphor | Blue phosphor | Phosphor mixture | Resin |
| Example C1 | 0.113 | — | 0.887 | — | 1.000 | 90.9 |
| Example C2 | 0.108 | — | 0.892 | — | 1.000 | 31.4 |
| Comparative Example C1 | 0.109 | — | 0.891 | — | 1.000 | 88.3 |
| Comparative Example C2 | 0.130 | — | 0.870 | — | 1.000 | 32.3 |

TABLE 11

| | Structure of light emitting device | | Characteristics of light emitting device | | | |
|---|---|---|---|---|---|---|
| | Excitation light energy from light emitting element | Bandgap energy of semiconductor particle phosphor shell part | Chromaticity point | | Brightness | Color rendering property index |
| Example | [eV] | [eV] | u' | v' | [%] | (Ra) |
| Example C1 | 2.76 | 2.70 | 0.1997 | 0.3982 | 52.2% | 47.0 |
| Example C2 | 2.76 | 2.70 | 0.1977 | 0.4005 | 24.3% | 52.8 |
| Comparative Example C1 | 2.76 | 3.56 | 0.1978 | 0.4002 | 37.7% | 51.6 |
| Comparative Example C2 | 2.76 | 3.39 | 0.2011 | 0.3963 | 15.8% | 34.7 |

Examples D1 to D4, Comparative Examples D1 to D2

Light Emitting Devices Including Various Phosphors, and UV Luminescent Semiconductor Laser Diode Element A method of producing a light emitting device including various semiconductor phosphor microparticles, and a UV luminescent semiconductor laser diode element will be described. Light emitting devices of Examples D1 to D4 and Comparative examples D1 to D2 were fabricated in a similar manner as that of Example A1 except for the kind and the quantity of various phosphors, the quantity of the silicone resin and use of a UV luminescent semiconductor laser diode element as a light emitting element. Concretely, similarly to Example A1, various phosphors were mixed in a weight ratio shown in “Weight mixing ratio of various phosphors” of Table 12, to obtain a phosphor mixture. Then the phosphor mixture and the silicone resin were mixed in a mixing ratio shown in “Phosphor/resin weight mixing ratio” of Table 12, to obtain mold resin.

Next, using the mold resin obtained above, a UV semiconductor light emitting laser diode element having an InGaN semiconductor active layer having emission peak wavelength of 380 nm was sealed, and light emitting devices of Examples D1 to D4 and Comparative examples D1 to D2 having the structure as shown in FIG. 2 were fabricated, The light emitting devices produced in these methods were evaluated, and chromaticity point, luminous efficiency and color rendering property index shown in Table 13 were determined.

TABLE 12

| | Configuration of light emitting device | | | | | |
|---|---|---|---|---|---|---|
| | | | Synthetic method of phosphor for use | | | |
| Example | Structure | Light emitting element | Red phosphor | Yellow phosphor | Green phosphor | Blue phosphor |
| Example D1 | Light emitting device 21 | UV semiconductor light emitting laser diode element | Production example 1r | — | Production example 1g | Production example 1b |
| Example D2 | Light emitting device 21 | UV semiconductor light emitting laser diode element | Production example 7r | — | Production example 7g | Production example 7b |
| Example D3 | Light emitting device 21 | UV semiconductor light emitting laser diode element | Production example 19r | — | Production example 19g | Production example 19b |
| Example D4 | Light emitting device 21 | UV semiconductor light emitting laser diode element | Production example 20r | — | Production example 20g | Production example 20b |
| Comparative Example D1 | Light emitting device 21 | UV semiconductor light emitting laser diode element | Comparative Production example 1r | — | Comparative Production example 1g | Comparative Production example 1b |
| Comparative Example D2 | Light emitting device 21 | UV semiconductor light emitting laser diode element | Comparative Production example 5r | — | Comparative Production example 5g | Comparative Production example 5b |

| | Fabrication method of light emitting device | | | | | |
|---|---|---|---|---|---|---|
| | Mixing ratio of various phosphors | | | | Phosphor/resin weight mixing ratio | |
| Example | Red phosphor | Yellow phosphor | Green phosphor | Blue phosphor | Phosphor mixture | Resin |
| Example D1 | 0.039 | — | 0.106 | 0.855 | 1.000 | 11.8 |
| Example D2 | 0.039 | — | 0.129 | 0.832 | 1.000 | 3.9 |
| Example D3 | 0.045 | — | 0.117 | 0.838 | 1.000 | 10.8 |
| Example D4 | 0.038 | — | 0.085 | 0.877 | 1.000 | 4.9 |
| Comparative Example D1 | 0.040 | — | 0.073 | 0.887 | 1.000 | 11.8 |
| Comparative Example D2 | 0.045 | — | 0.084 | 0.871 | 1.000 | 4.5 |

TABLE 13

| | Structure of light emitting device | | Characteristics of light emitting device | | | |
|---|---|---|---|---|---|---|
| | Excitation light energy from light emitting element | Bandgap energy of semiconductor particle phosphor shell part | Chromaticity point | | Brightness | Color rendering property index |
| Example | [eV] | [eV] | u' | v' | [%] | (Ra) |
| Example D1 | 3.26 | 2.70 | 0.2044 | 0.4162 | 84.3% | −6.6 |
| Example D2 | 3.26 | 2.70 | 0.2016 | 0.4189 | 34.2% | 6.5 |
| Example D3 | 3.26 | 2.86 | 0.2047 | 0.4148 | 77.3% | −12.2 |
| Example D4 | 3.26 | 2.86 | 0.2048 | 0.4196 | 35.0% | −10.2 |
| Comparative Example D1 | 3.26 | 3.56 | 0.2058 | 0.4190 | 51.6% | −21.4 |
| Comparative Example D2 | 3.26 | 3.39 | 0.2065 | 0.4191 | 20.6% | −31.9 |

Examples E1 to E27, Comparative Examples E1 to E6

Light Emitting Devices Including Various Phosphors, and Blue Organic Electroluminescence Element A method of producing a light emitting device including various semiconductor phosphor microparticle, and a organic electroluminescence element will be described. Light emitting devices of Examples E1 to E27 and Comparative examples E1 to E6 were fabricated in a similar manner as that of Example A1 except for the kind and the quantity of various phosphors, the quantity of the silicone resin and use of a blue organic electroluminescence element as a light emitting element. Concretely, similarly to Example A1, various phosphors were mixed in a weight ratio shown in "Weight mixing ratio of various phosphors" of Table 14, to obtain a phosphor mixture. Then the phosphor mixture and the silicone resin were mixed in a mixing ratio shown in "Phosphor/resin weight mixing ratio" of Table 14, to obtain mold resin.

Next, using the mold resin obtained above, a blue organic electroluminescence element having emission peak wavelength of 455 nm was sealed, and light emitting devices of Examples E1 to E27 and Comparative examples E1 to E6 having the structure as shown in FIG. 3 were fabricated. The light emitting devices produced in these methods were evaluated, and chromaticity point, luminous efficiency and color rendering property index shown in Table 15 were determined.

TABLE 14

| | Configuration of light emitting device | | | | | |
|---|---|---|---|---|---|---|
| | | | Synthetic method of phosphor for use | | | |
| Example | Structure | Light emitting element | Red phosphor | Yellow phosphor | Green phosphor | Blue phosphor |
| Example E1 | Light emitting device 41 | Blue organic electro-luminescence element | Production example 1r | — | Production example 1g | — |
| Example E2 | Light emitting device 41 | Blue organic electro-luminescence element | Production example 2r | — | Production example 2g | — |
| Example E3 | Light emitting device 41 | Blue organic electro-luminescence element | Production example 3r | — | Production example 3g | — |
| Example E4 | Light emitting device 41 | Blue organic electro-luminescence element | Production example 4r | — | Production example 4g | — |
| Example E5 | Light emitting device 41 | Blue organic electro-luminescence element | Production example 5r | — | Production example 5g | — |
| Example E6 | Light emitting device 41 | Blue organic electro-luminescence element | Production example 6r | — | Production example 6g | — |
| Example E7 | Light emitting device 41 | Blue organic electro-luminescence element | Production example 7r | — | Production example 7g | — |
| Example E8 | Light emitting device 41 | Blue organic electro-luminescence element | Production example 8r | — | Production example 8g | — |
| Example E9 | Light emitting device 41 | Blue organic electro-luminescence element | Production example 9r | — | Production example 9g | — |
| Example E10 | Light emitting device 41 | Blue organic electro-luminescence element | Production example 10r | — | Production example 10g | — |
| Example E11 | Light emitting device 41 | Blue organic electro-luminescence element | Production example 11r | — | Production example 11g | — |
| Example E12 | Light emitting device 41 | Blue organic electro-luminescence element | Production example 12r | — | Production example 12g | — |
| Example E13 | Light emitting device 41 | Blue organic electro-luminescence element | Production example 13r | — | Production example 13g | — |
| Example E14 | Light emitting device 41 | Blue organic electro-luminescence element | Production example 14r | — | Production example 14g | — |
| Example E15 | Light emitting device 41 | Blue organic electro-luminescence element | Production example 15r | — | Production example 15g | — |
| Example E16 | Light emitting device 41 | Blue organic electro-luminescence element | Production example 16r | — | Production example 16g | — |

TABLE 14-continued

| | | | | | | |
|---|---|---|---|---|---|---|
| Example E17 | Light emitting device 41 | Blue organic electro-luminescence element | Production example 17r | — | Production example 17g | — |
| Example E18 | Light emitting device 41 | Blue organic electro-luminescence element | Production example 18r | — | Production example 18g | — |
| Example E19 | Light emitting device 41 | Blue organic electro-luminescence element | Production example 21r | — | Production example 1g | — |
| Example E20 | Light emitting device 41 | Blue organic electro-luminescence element | Production example 22r | — | Production example 7g | — |
| Example E21 | Light emitting device 41 | Blue organic electro-luminescence element | Production example 1r | — | Production example 1g | Production example 1b |
| Example E22 | Light emitting device 41 | Blue organic electro-luminescence element | Production example 7r | — | Production example 7g | Production example 7b |
| Example E23 | Light emitting device 41 | Blue organic electro-luminescence element | Production example 1r | — | Production example 7g | — |
| Example E24 | Light emitting device 41 | Blue organic electro-luminescence element | Production example 5r | — | Production example 11g | — |
| Example E25 | Light emitting device 41 | Blue organic electro-luminescence element | Production example 1r | — | — | — |
| Example E26 | Light emitting device 41 | Blue organic electro-luminescence element | — | — | Production example 1g | — |
| Example E27 | Light emitting device 41 | Blue organic electro-luminescence element | — | — | — | Production example 1b |
| Comparative Example E1 | Light emitting device 41 | Blue organic electro-luminescence element | Comparative Production example 1r | — | Comparative Production example 1g | — |
| Comparative Example E2 | Light emitting device 41 | Blue organic electro-luminescence element | Comparative Production example 2r | — | Comparative Production example 2g | — |
| Comparative Example E3 | Light emitting device 41 | Blue organic electro-luminescence element | Comparative Production example 3r | — | Comparative Production example 3g | — |
| Comparative Example E4 | Light emitting device 41 | Blue organic electro-luminescence element | Comparative Production example 4r | — | Comparative Production example 4g | — |
| Comparative Example E5 | Light emitting device 41 | Blue organic electro-luminescence element | Comparative Production example 5r | — | Comparative Production example 5g | — |
| Comparative Example E6 | Light emitting device 41 | Blue organic electro-luminescence element | Comparative Production example 6r | — | Comparative Production example 6g | — |

| | Fabrication method of light emitting device | | | | | |
|---|---|---|---|---|---|---|
| | Mixing ratio of various phosphors | | | | Phosphor/resin weight mixing ratio | |
| Example | Red phosphor | Yellow phosphor | Green phosphor | Blue phosphor | Phosphor mixture | Resin |
| Example E1 | 0.122 | — | 0.878 | — | 1.000 | 123.6 |
| Example E2 | 0.114 | — | 0.886 | — | 1.000 | 114.7 |
| Example E3 | 0.101 | — | 0.899 | — | 1.000 | 103.9 |
| Example E4 | 0.121 | — | 0.879 | — | 1.000 | 125.4 |
| Example E5 | 0.114 | — | 0.886 | — | 1.000 | 96.7 |
| Example E6 | 0.134 | — | 0.866 | — | 1.000 | 89.4 |
| Example E7 | 0.122 | — | 0.878 | — | 1.000 | 43.9 |
| Example E8 | 0.117 | — | 0.883 | — | 1.000 | 44.0 |
| Example E9 | 0.099 | — | 0.901 | — | 1.000 | 43.4 |
| Example E10 | 0.129 | — | 0.871 | — | 1.000 | 48.3 |
| Example E11 | 0.124 | — | 0.876 | — | 1.000 | 195.1 |
| Example E12 | 0.121 | — | 0.879 | — | 1.000 | 143.4 |
| Example E13 | 0.123 | — | 0.877 | — | 1.000 | 118.9 |
| Example E14 | 0.125 | — | 0.875 | — | 1.000 | 47.9 |
| Example E15 | 0.123 | — | 0.877 | — | 1.000 | 19.6 |
| Example E16 | 0.129 | — | 0.871 | — | 1.000 | 29.3 |
| Example E17 | 0.133 | — | 0.867 | — | 1.000 | 119.8 |
| Example E18 | 0.123 | — | 0.877 | — | 1.000 | 44.8 |
| Example E19 | 0.122 | — | 0.878 | — | 1.000 | 121.6 |
| Example E20 | 0.133 | — | 0.867 | — | 1.000 | 41.6 |
| Example E21 | 0.078 | — | 0.503 | 0.419 | 1.000 | 61.5 |
| Example E22 | 0.076 | — | 0.490 | 0.434 | 1.000 | 20.6 |
| Example E23 | 0.119 | — | 0.881 | — | 1.000 | 129.7 |
| Example E24 | 0.116 | — | 0.884 | — | 1.000 | 94.4 |
| Example E25 | 1.000 | — | — | — | 1.000 | 116.5 |
| Example E26 | — | — | 1.000 | — | 1.000 | 14.9 |
| Example E27 | — | — | — | 1.000 | 1.000 | 16.9 |
| Comparative Example E1 | 0.123 | — | 0.877 | — | 1.000 | 123.1 |
| Comparative Example E2 | 0.133 | — | 0.867 | — | 1.000 | 93.3 |

TABLE 14-continued

| | | | | | | | |
|---|---|---|---|---|---|---|---|
| Comparative Example E3 | 0.115 | — | 0.885 | — | 1.000 | 189.7 |
| Comparative Example E4 | 0.126 | — | 0.874 | — | 1.000 | 135.0 |
| Comparative Example E5 | 0.138 | — | 0.862 | — | 1.000 | 42.8 |
| Comparative Example E6 | 0.124 | — | 0.876 | — | 1.000 | 21.9 |

TABLE 15

| | Structure of light emitting device | | Characteristics of light emitting device | | | |
|---|---|---|---|---|---|---|
| | Excitation light energy from light emitting element | Bandgap energy of semiconductor particle phosphor shell part | Chromaticity point | | Brightness | Color rendering property index |
| Example | [eV] | [eV] | u' | v' | [%] | (Ra) |
| Example E1 | 2.73 | 2.70 | 0.1937 | 0.4069 | 66.4% | 50.4 |
| Example E2 | 2.73 | 2.70 | 0.1931 | 0.4074 | 65.4% | 70.9 |
| Example E3 | 2.73 | 2.70 | 0.1927 | 0.4076 | 66.0% | 86.4 |
| Example E4 | 2.73 | 2.70 | 0.1936 | 0.4068 | 68.5% | 50.8 |
| Example E5 | 2.73 | 2.70 | 0.1936 | 0.4064 | 58.3% | 60.3 |
| Example E6 | 2.73 | 2.70 | 0.1937 | 0.4071 | 53.2% | 46.4 |
| Example E7 | 2.73 | 2.70 | 0.1937 | 0.4065 | 31.7% | 56.0 |
| Example E8 | 2.73 | 2.70 | 0.1932 | 0.4076 | 33.4% | 65.8 |
| Example E9 | 2.73 | 2.70 | 0.1926 | 0.4080 | 31.8% | 85.3 |
| Example E10 | 2.73 | 2.70 | 0.1938 | 0.4065 | 31.2% | 52.3 |
| Example E11 | 2.73 | 2.70 | 0.1937 | 0.4066 | 88.4% | 52.1 |
| Example E12 | 2.73 | 2.70 | 0.1936 | 0.4071 | 74.7% | 50.3 |
| Example E13 | 2.73 | 2.72 | 0.1936 | 0.4072 | 65.1% | 43.6 |
| Example E14 | 2.73 | 2.72 | 0.1937 | 0.4069 | 30.6% | 51.2 |
| Example E15 | 2.73 | 2.72 | 0.1936 | 0.4072 | 15.8% | 47.8 |
| Example E16 | 2.73 | 2.72 | 0.1938 | 0.4064 | 19.7% | 54.9 |
| Example E17 | 2.73 | 2.72 | 0.1939 | 0.4068 | 63.9% | 47.8 |
| Example E18 | 2.73 | 2.72 | 0.1937 | 0.4069 | 32.6% | 50.2 |
| Example E19 | 2.73 | 2.27 | 0.1937 | 0.4065 | 52.7% | 55.5 |
| Example E20 | 2.73 | 2.27 | 0.1939 | 0.4070 | 28.4% | 42.6 |
| Example E21 | 2.73 | 2.70 | 0.1929 | 0.4100 | 49.9% | 47.2 |
| Example E22 | 2.73 | 2.70 | 0.1928 | 0.4100 | 21.8% | 53.1 |
| Example E23 | 2.73 | 2.70 | 0.1936 | 0.4066 | 46.2% | 57.6 |
| Example E24 | 2.73 | 2.70 | 0.1936 | 0.4066 | 69.1% | 56.2 |
| Example E25 | 2.73 | 2.70 | 0.5020 | 0.4604 | — | — |
| Example E26 | 2.73 | 2.70 | 0.0726 | 0.5458 | — | — |
| Example E27 | 2.73 | 2.70 | 0.1141 | 0.3090 | — | — |
| Comparative Example E1 | 2.73 | 3.56 | 0.1937 | 0.4065 | 50.3% | 54.5 |
| Comparative Example E2 | 2.73 | 3.56 | 0.1938 | 0.4070 | 39.9% | 44.6 |
| Comparative Example E3 | 2.73 | 3.56 | 0.1935 | 0.4071 | 66.1% | 51.0 |
| Comparative Example E4 | 2.73 | 3.56 | 0.1936 | 0.4072 | 51.9% | 45.5 |
| Comparative Example E5 | 2.73 | 3.39 | 0.1939 | 0.4073 | 20.1% | 39.0 |
| Comparative Example E6 | 2.73 | 3.39 | 0.1937 | 0.4068 | 12.9% | 49.7 |

<<Examination by Difference in Bandgap of Shell Part Material>>

In the following, influence of the difference in material of shell part of the semiconductor phosphor microparticle on the luminous efficiency of the light emitting device will be examined.

Figure 20:
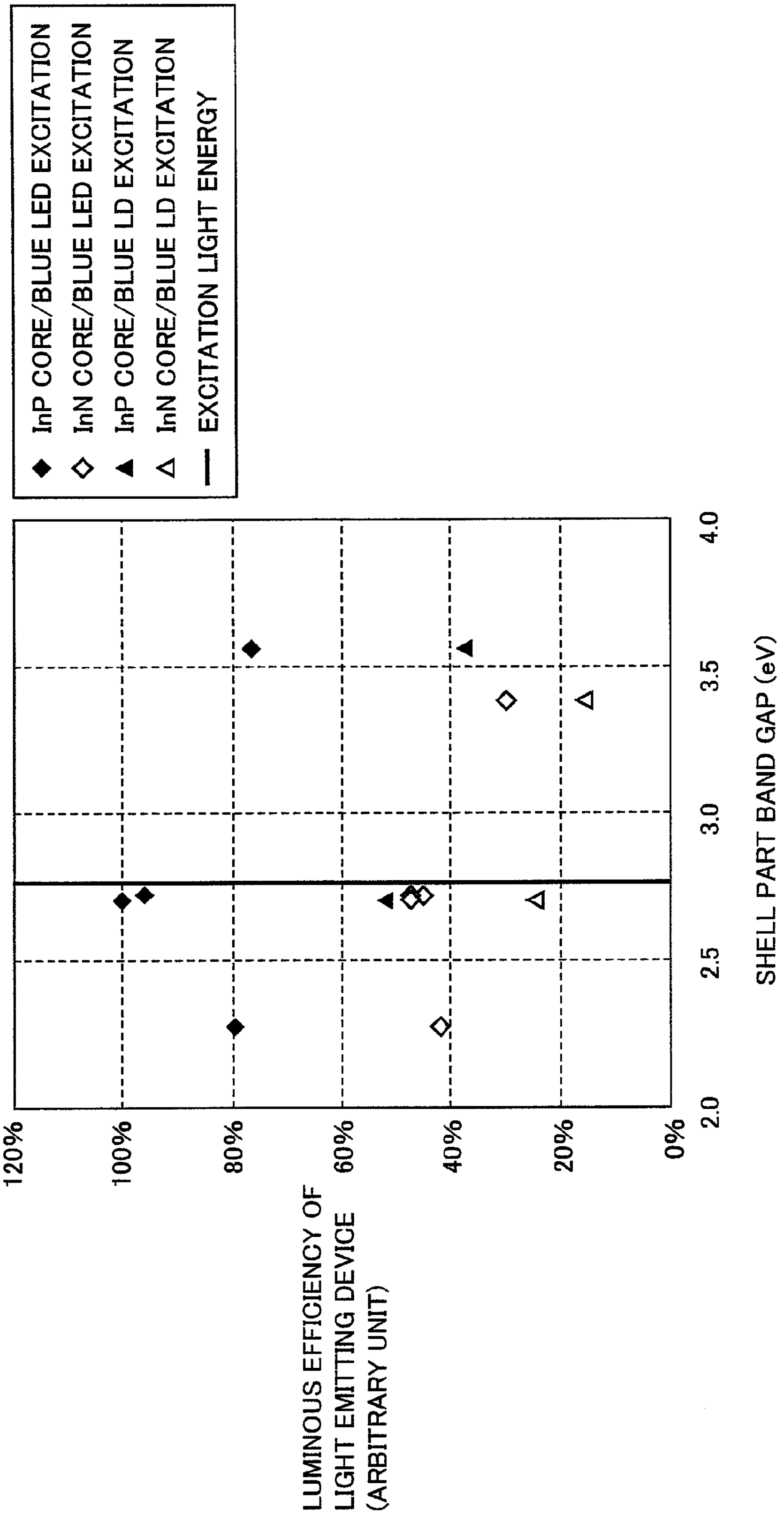
FIG. 20 is a graph showing shell part bandgap energy and luminous efficiency in a light emitting device of the present invention.
Figure 21:
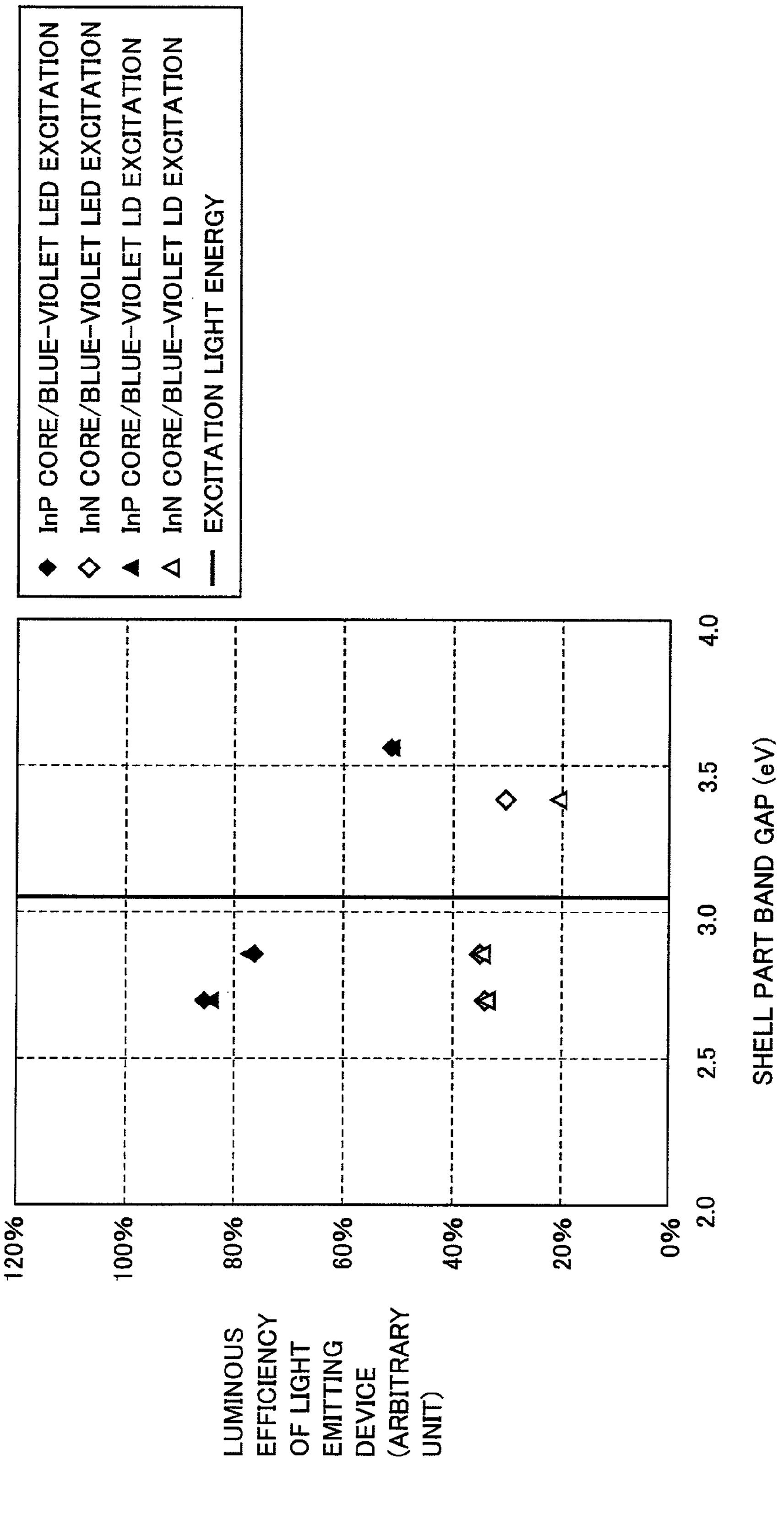
FIG. 21 is a graph showing shell part bandgap energy and luminous efficiency in a light emitting device of the present invention.
Figure 22:
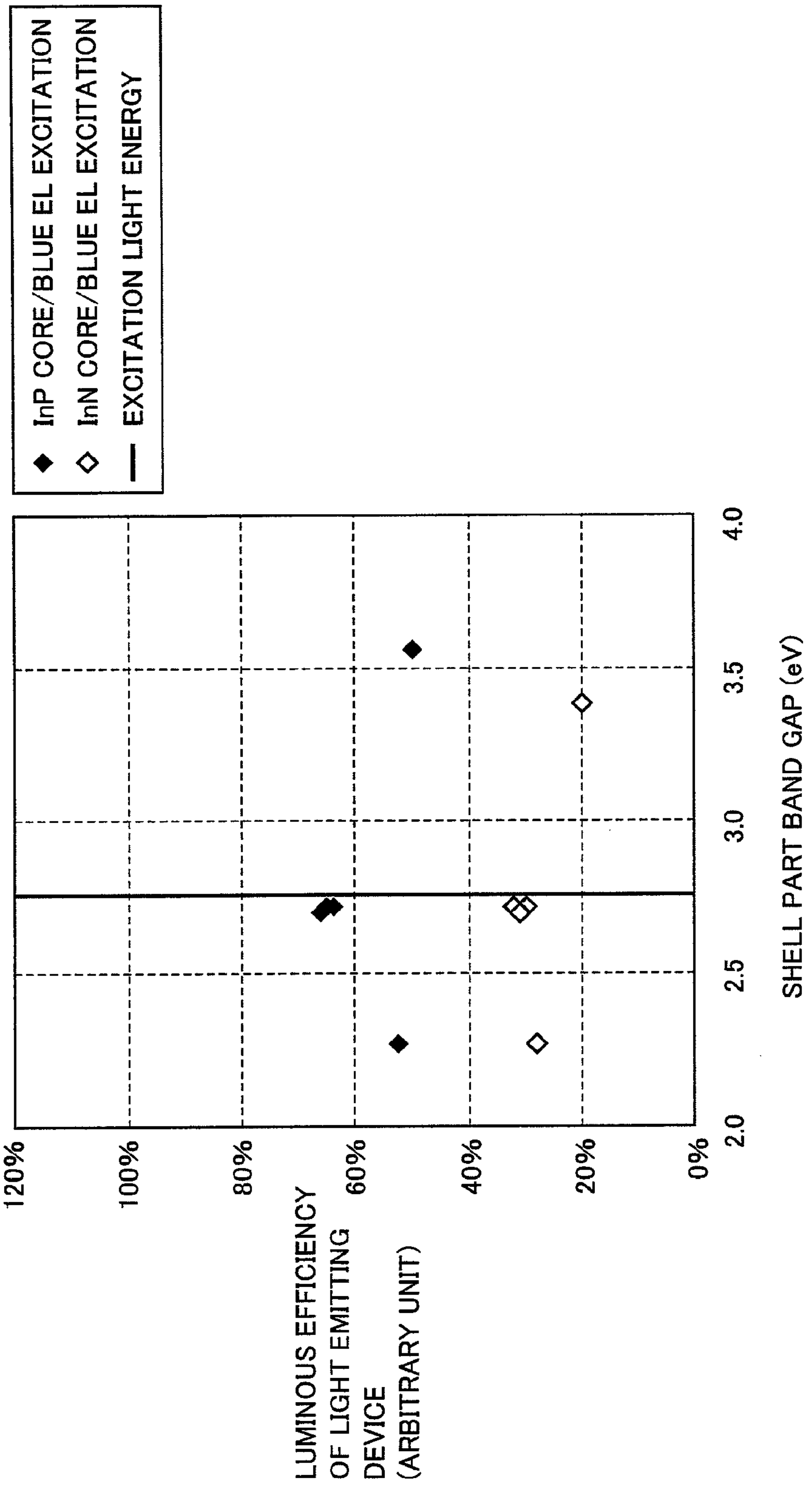
FIG. 22 is a graph showing shell part bandgap energy and luminous efficiency in a light emitting device of the present invention.

FIG. 20, FIG. 21 and FIG. 22 are charts showing relations of brightness of light emitting devices 1, 21, 41 using various semiconductor phosphor microparticles having a core/shell structure. The horizontal axis represents bandgap energy of shell part of semiconductor phosphor microparticle, and the vertical axis plots relative value of luminous efficiency of light emitting device. Here, as an excitation light source, a blue semiconductor light emitting diode element and a blue semiconductor light emitting laser diode element are used in FIG. 20, a UV semiconductor light emitting diode element and a UV semiconductor light emitting laser diode element are used in FIG. 21, and a blue electroluminescence element is used in FIG. 22. The straight line in the drawing represents energy of excitation light emitted from the light source. In every case of FIG. 20 to FIG. 22, it is found that luminous efficiency is high when bandgap energy of a shell part material is smaller than excitation light energy of the light source. This is attributable to the fact that concentration quenching of the semiconductor phosphor microparticle can be suppressed by absorbing excitation light in the shell part having a larger volume than the core part. This is because efficient absorption of excitation light becomes possible and concentration can be decreased.

<<Examination of Influence of Small Bandgap of Shell Part Material>>

In the following, characteristics of a light emitting device using a semiconductor phosphor microparticle having small bandgap energy of shell part will be examined.

Example A1 and Example A19 will be compared. The light emitting devices of Example A1 and Example A19 are fabricated in the same condition except for the shell part material of the red semiconductor phosphor microparticle. The shell part material of the red semiconductor phosphor microparticle is a ZnSe material in Example A1, and is a GaP material in Example A19. It can be seen that luminous efficiency of the light emitting device of Example A1 is 100.0%, while luminous efficiency of the light emitting device of Example A19 significantly decreases to 79.5%.

Example A7 and Example A20 will be compared. The light emitting devices of Example A7 and Example A20 are fabricated in the same condition except for the shell part material of the red semiconductor phosphor microparticle. The shell part material of the red semiconductor phosphor microparticle is a ZnSe material in Example A7, and is a GaP material in Example A20. It can be seen that luminous efficiency of the light emitting device of Example A7 is 47.0%, while luminous efficiency of the light emitting device of Example A20 significantly decreases to 41.7%.

This is attributable to the fact that when the red semiconductor phosphor microparticle whose shell material is a GaP material is used, luminescence of the blue semiconductor phosphor microparticle is absorbed by the GaP shell part of the red phosphor. At this time, due to the loss arising by absorption of the blue luminescence in the red phosphor, luminous efficiency of the light emitting device decreases. That is, from the view point of luminous efficiency of the light emitting device, bandgap energy of the shell part of the semiconductor phosphor microparticle is preferably larger than the bandgap energy of the core part of every semiconductor phosphor microparticle included in the light emitting device.

<<Examination of Difference in Core Part Material>>

In the following, influence of the difference in material of the core part on luminous efficiency of the light emitting device of the present invention will be examined.

Figure 23:
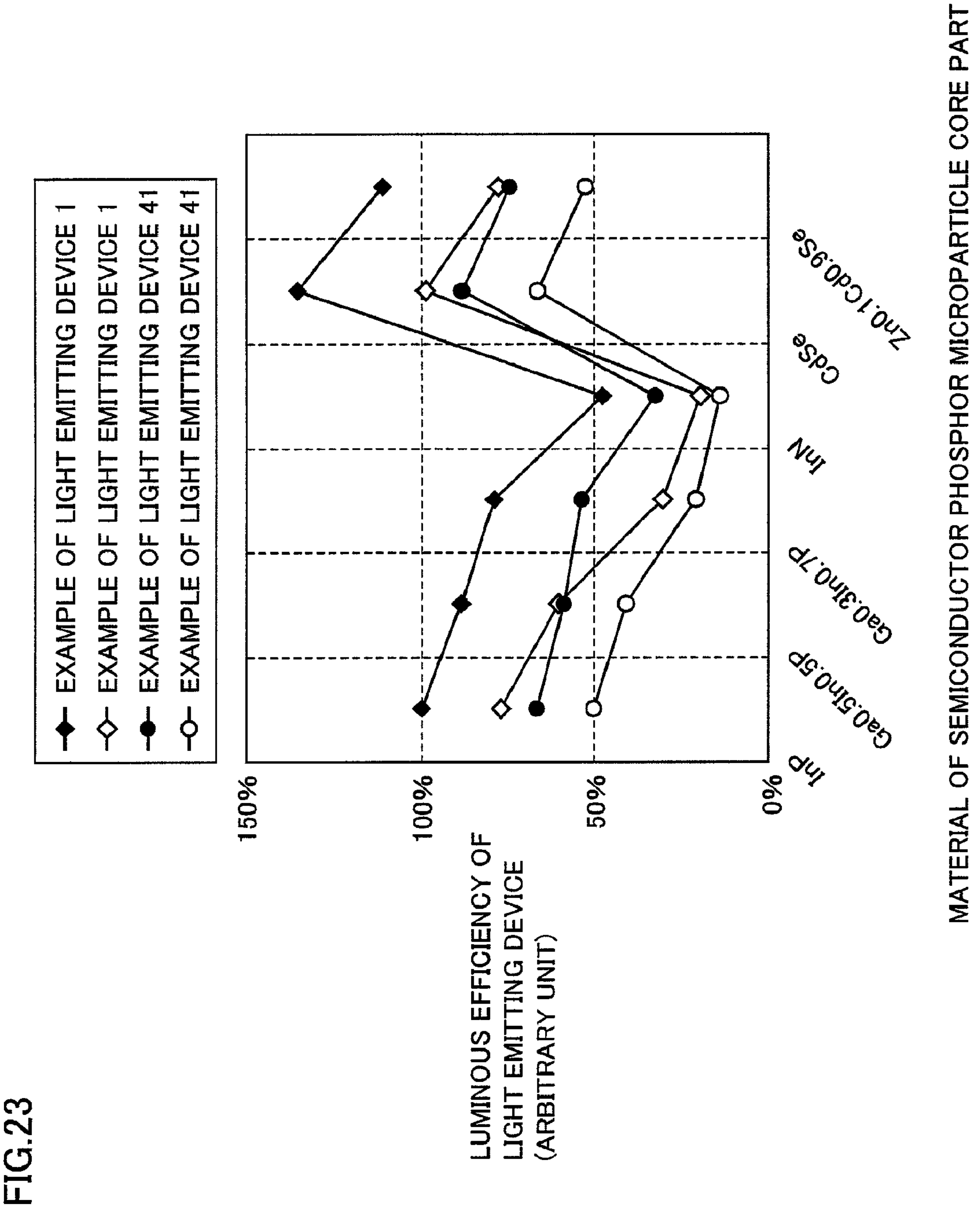
FIG. 23 is a graph showing a core part material and luminous efficiency in a light emitting device of the present invention.

FIG. 23 is a chart showing relation of brightness of light emitting devices 1, 41 using semiconductor phosphor microparticles whose shell material is ZnS and ZnSe, respectively. The horizontal axis represents core part material of semiconductor phosphor microparticle, and the vertical axis plots relative value of luminous efficiency of light emitting device. As can be seen from FIG. 23, in every case where the material of the core part is InP, InGaP, InN, InGaN, CdSe, or ZnCdSe, it can be seen that luminous efficiency is higher in the case of using a semiconductor phosphor microparticle of a ZnSe material that absorbs excitation light as the material of the shell part than using a Zns material that allows transmission of excitation light. From the above, it is demonstrated that when the shell part of the semiconductor phosphor microparticle absorbs excitation light, the effect of improving luminous efficiency by suppressing concentration quenching is obtained in the core part material of any semiconductor phosphor microparticle.

<<Examination of Emission Half-Value Width of Semiconductor Phosphor Microparticle>>

In the following, influence of an emission half-value width of the semiconductor phosphor microparticle on color rendering property index Ra value of the light emitting device of the present invention will be examined.

Figure 24:
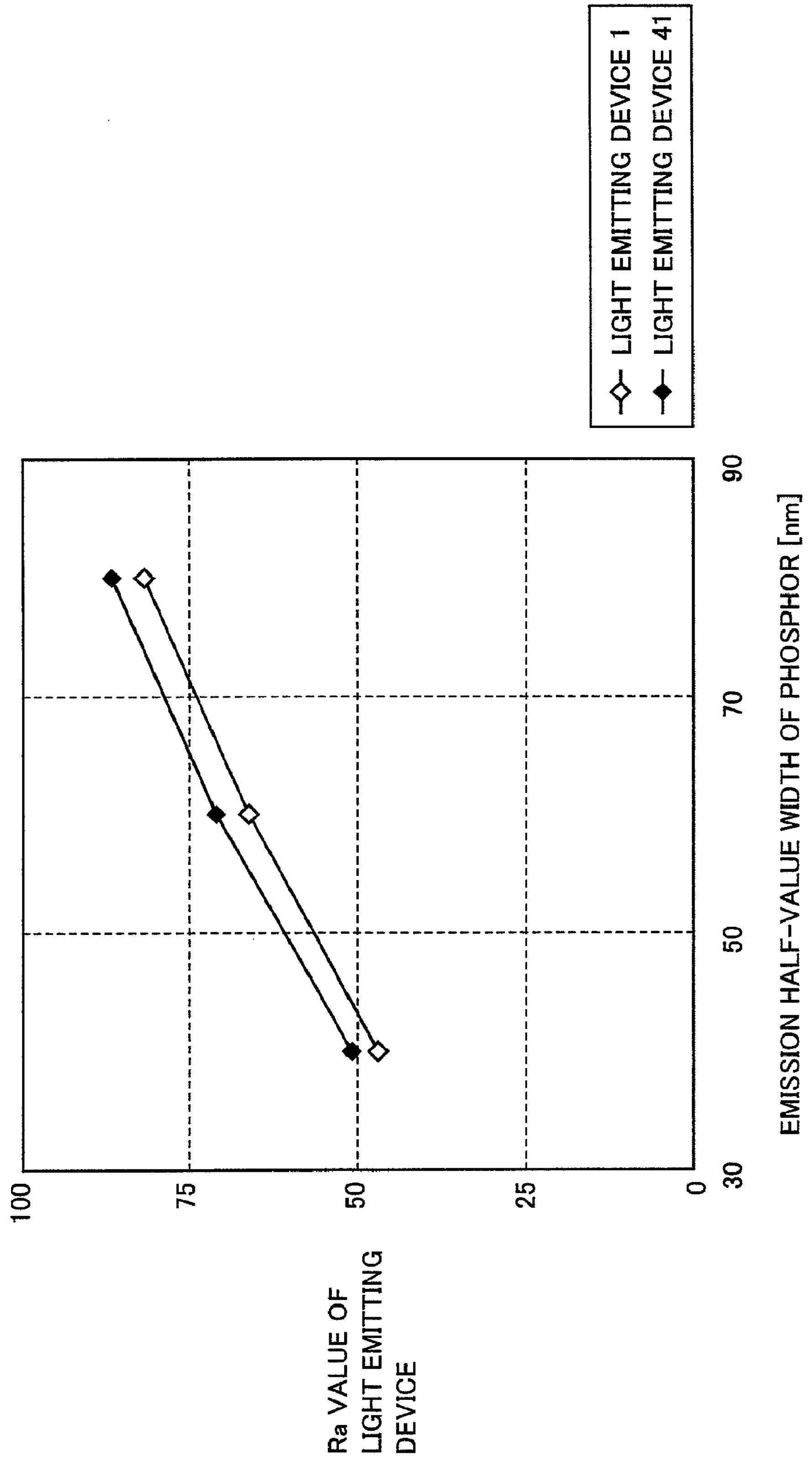
FIG. 24 is a graph showing a half-value width and a color rendering property index Ra of a phosphor in a light emitting device of the present invention.

FIG. 24 is a chart plotting Production examples A1, A2, A3 of light emitting device 1 including red and green luminescent two kinds of InP/ZnSe semiconductor phosphor microparticles and a blue semiconductor light emitting diode element, and Production examples E1, E2, E3 of light emitting device 41 including red and green luminescent two kinds of InP/ZnSe semiconductor phosphor microparticles and a blue luminescent organic electroluminescence element. The horizontal axis plots an emission half-value width of InP/ZnSe semiconductor phosphor microparticle, and the vertical axis plots color rendering property index Ra value of light emitting device.

As can been seen from FIG. 24, it is found that as the emission half-value width of semiconductor phosphor microparticle increases, color rendering property index Ra value of the of the light emitting device improves. This is attributable to the fact that the emission spectrum of the light emitting device comes closer to that of the natural white light that is gentle with no peaks and troughs as the emission half-value width of semiconductor phosphor microparticle increases.

<<Number of Phosphor and Ra Value and Luminous Efficiency>>

In the following, influence of the number of the semiconductor phosphor microparticles forming the light emitting device of the present invention on color rendering property index Ra value and luminous efficiency of the light emitting device will be examined.

Figure 25:
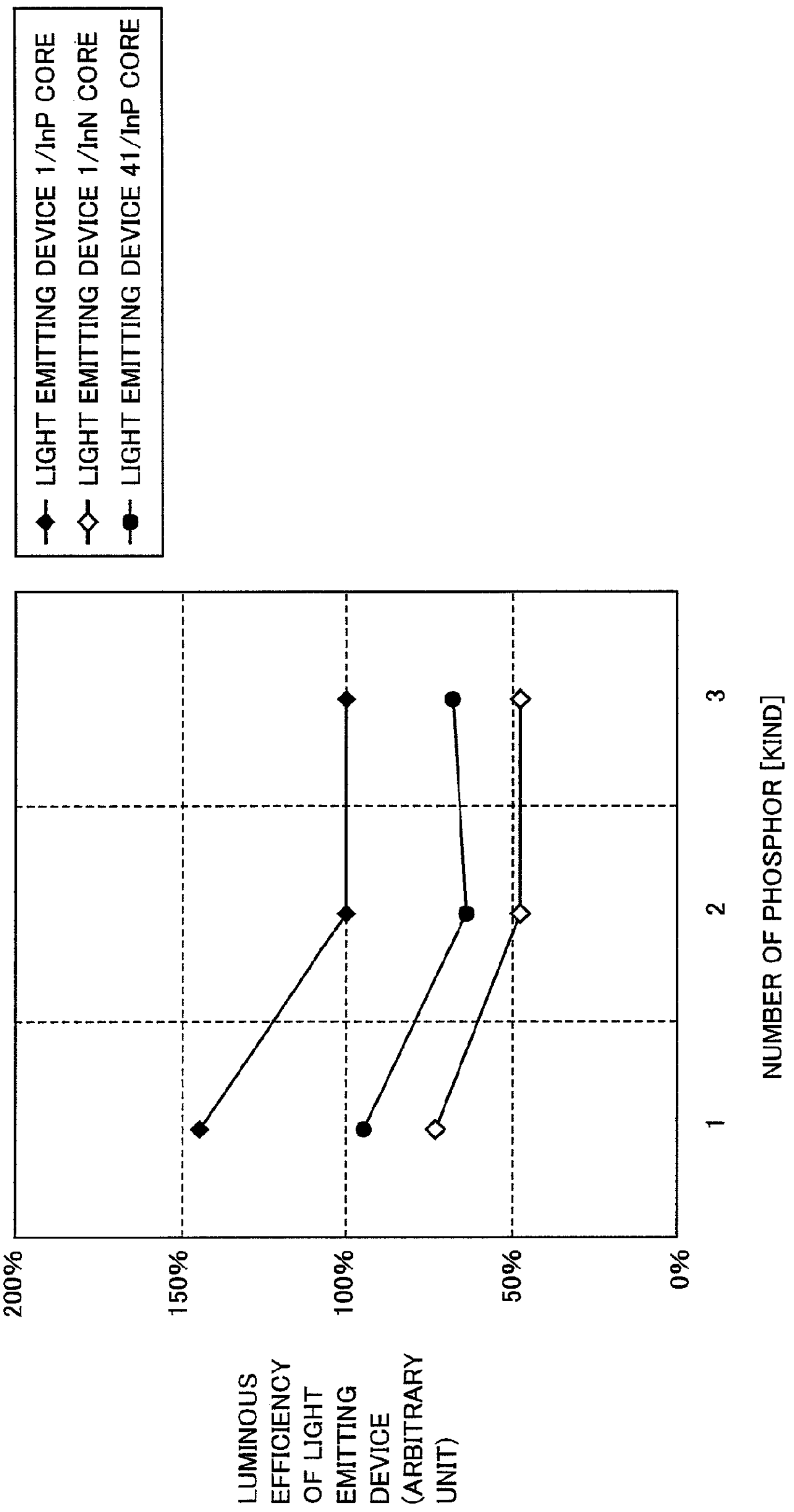
FIG. 25 is a graph showing the number of phosphor and luminous efficiency in a light emitting device of the present invention.
Figure 26:
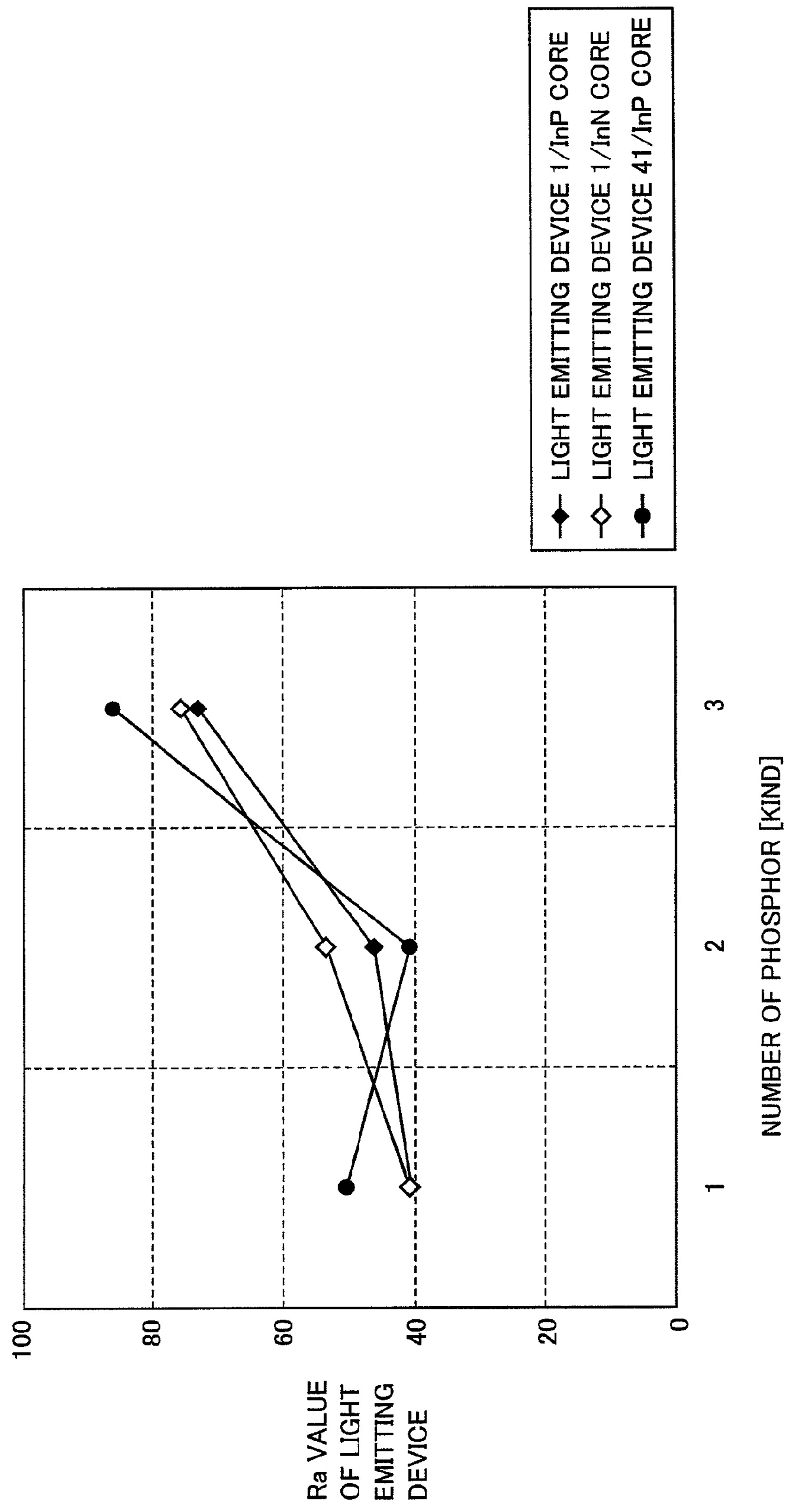
FIG. 26 is a graph showing the number of phosphor and color rendering property index Ra in a light emitting device of the present invention.

FIG. 25 and FIG. 26 are charts plotting light emitting devices 1 and 41 including semiconductor phosphor microparticle having an InP core and an InN core, and a blue semiconductor light emitting element or a blue organic electroluminescence element. In FIG. 25, the horizontal axis represents number of phosphors, and the vertical axis represents relative value of luminous efficiency of the light emitting device. In FIG. 26, the horizontal axis represents number of phosphors, and the vertical axis represents color rendering property index Ra value of the light emitting device.

As can be seen from FIG. 25, as the number of kinds of the semiconductor phosphor microparticles increases, luminous efficiency of the light emitting device decreases. This is attributable to the fact that as the number of kinds of the phosphors increases, emission and absorption between phosphors are repeated, so that the energy loss in the phosphors increases. Also in FIG. 26, the tendency that color rendering property index Ra value of the light emitting device increases as the number of kinds of the semiconductor phosphor microparticles increases is also observed. This is attributable to the fact that the emission spectrum of the light emitting device comes closer to that of the natural white light that is gentle with no peaks and troughs as the number of kinds of the phosphor increases.

<<Difference in Characteristics of Light Emitting Device by Difference in Light Source>>

In the following, influence of the kind of light source forming the light emitting device of the present invention on characteristics of the light emitting device will be examined.

Any of the light emitting devices fabricated in Example A1, Example C1, and Example E1 are light emitting devices including a semiconductor phosphor microparticle of Production example 1r, or Production example 1g. Light sources forming the light emitting devices of Example A1, Example C1, and Example E1 differ in that they are a blue semiconductor light emitting diode element, a blue semiconductor light emitting laser diode element, and a blue organic electroluminescence element, respectively. In other words, they correspond to light emitting device 1 in the example shown in FIG. 1, light emitting device 21 in the example shown in FIG. 2, and light emitting device 41 in the example shown in FIG. 3, respectively. Difference in characteristics of the light emitting device by difference in light source was observed.

Light emitting device 1 of Example A1 was excellent in that it had the highest luminous efficiency. This is because the blue semiconductor light emitting diode element having the highest luminous efficiency among other light sources was used. In general, a blue semiconductor light emitting diode element has a feature that a light source having high luminous efficiency can be fabricated more easily compared with other light sources. Therefore, Example A1 is excellent in that a light emitting device having high luminous efficiency can be fabricated.

Light emitting device 21 of Example C1 was excellent in that it had the highest brightness and light output. This is because the blue semiconductor light emitting laser diode element is a point source, and shows the highest light output. Therefore, Example C1 is excellent in that a light emitting device realizing high brightness and light output can be fabricated.

In light emitting device 41 of Example E1, a surface light emitting device could be fabricated. This is because, the organic electroluminescence element is a surface-emitting light emitting element, in contrast to the foregoing semiconductor light emitting element of point luminescence. In other words, Example E1 is excellent in that a surface-emitting light emitting device can be fabricated.

<Fabrication of Image Display Device>

In the following, a method of producing an image display device including a light emitting element, and a semiconductor phosphor microparticle of a core/shell structure having a shell part absorbing at least a part of the light emitted by the light emitting element will be described. In the following examples, for measuring chromaticity point, color reproducibility and brightness of an image display device, a luminescence measuring system MCPD-7000 (available from OTSUKA ELECTRONICS CO. LTD.) was used.

Example AA1

Image Display Device 101)

In Example AA1, image display device 101 having a structure shown in FIG. 5 was fabricated by using light emitting device 1 of Example A1 as a backlight light source, and wavelength conversion part 104 having a color filter having transmissivity shown in FIG. 7. That is, light emitting device 1 described in Example A1 combining a red luminescent semiconductor phosphor microparticle and a green luminescent semiconductor phosphor microparticle that are respectively synthesized in Production examples 1r, 1g, with a blue semiconductor light emitting diode element was used as a backlight. By combining light emitting device 1, with wavelength conversion part 104 including liquid crystal and a color filter, image display device 101 of Example CE1 was fabricated. Image display device 101 fabricated in this method was evaluated, and an NTSC ratio of 105.8% was observed. Brightness of the image display device in the following examples was evaluated as a relative value, relative to brightness of image display device 101 in Example AA1 as 100%.

Examples AA2 to AA28, Comparative Examples AA1 to AA6, Examples AB1 to AB4, Comparative Examples AB1 to AB2, Examples AC1 to AC2, Comparative Examples AC1 to AC2, Examples AD1 to AD4, Comparative Examples AD1 to AD2

Image Display Device 101

Image display device 101 having a structure shown in FIG. 5 including white light emitting device 1 containing various semiconductor phosphor microparticles and a semiconductor light emitting element, and wavelength conversion part 104 having a color filter of transmissivity shown in FIG. 7 will be described.

Image display devices 101 of Examples AA2 to AA28, Comparative examples AA1 to AA6, Examples AB1 to AB4, Comparative examples AB1 to AB2, Examples AC1 to AC2, Comparative examples AC1 to AC2, Examples AD1 to AD4, and Comparative examples AD1 to AD2 were fabricated in a similar manner as Example AA1 except for the light emitting device.

That is, as shown in Table 16, by providing wavelength conversion part 104 having a color filter by using light emitting devices 1 fabricated in Examples A2 to A28, Comparative examples A1 to A6, Examples B1 to B4, Comparative examples B1 to B2, Examples C1 to C2, Comparative examples C1 to C2, Examples D1 to D4, and Comparative examples D1 to D2, image display devices 101 of Examples AA2 to AA28, Comparative examples AA1 to AA6, Examples AB1 to AB4, Comparative examples AB1 to AB2, Examples AC1 to AC2, Comparative examples AC1 to AC2, Examples AD1 to AD4, and Comparative examples AD1 to AD2 were fabricated. Evaluation of image display devices 101 fabricated in the present method revealed NTSC ratios and brightnesses as shown in Table 17.

TABLE 16

| | Configuration of image display device | | |
|---|---|---|---|
| Example | Structure of image display device | Light emitting device | Wavelength conversion part |
| Example AA1 | Image display device 101 | Example A1 | Color filter |
| Example AA2 | Image display device 101 | Example A2 | Color filter |
| Example AA3 | Image display device 101 | Example A3 | Color filter |
| Example AA4 | Image display device 101 | Example A4 | Color filter |
| Example AA5 | Image display device 101 | Example A5 | Color filter |
| Example AA6 | Image display device 101 | Example A6 | Color filter |
| Example AA7 | Image display device 101 | Example A7 | Color filter |
| Example AA8 | Image display device 101 | Example A8 | Color filter |
| Example AA9 | Image display device 101 | Example A9 | Color filter |
| Example AA10 | Image display device 101 | Example A10 | Color filter |
| Example AA11 | Image display device 101 | Example A11 | Color filter |
| Example AA12 | Image display device 101 | Example A12 | Color filter |
| Example AA13 | Image display device 101 | Example A13 | Color filter |
| Example AA14 | Image display device 101 | Example A14 | Color filter |
| Example AA15 | Image display device 101 | Example A15 | Color filter |
| Example AA16 | Image display device 101 | Example A16 | Color filter |
| Example AA17 | Image display device 101 | Example A17 | Color filter |
| Example AA18 | Image display device 101 | Example A18 | Color filter |
| Example AA19 | Image display device 101 | Example A19 | Color filter |
| Example AA20 | Image display device 101 | Example A20 | Color filter |
| Example AA21 | Image display device 101 | Example A21 | Color filter |
| Example AA22 | Image display device 101 | Example A22 | Color filter |
| Example AA23 | Image display device 101 | Example A23 | Color filter |
| Example AA24 | Image display device 101 | Example A24 | Color filter |
| Example AA25 | Image display device 101 | Example A25 | Color filter |
| Example AA26 | Image display device 101 | Example A26 | Color filter |
| Example AA27 | Image display device 101 | Example A27 | Color filter |
| Example AA28 | Image display device 101 | Example A28 | Color filter |
| Comparative | Image display device 101 | Comparative | Color filter |

TABLE 16-continued

| | Configuration of image display device | | |
|---|---|---|---|
| Example | Structure of image display device | Light emitting device | Wavelength conversion part |
| Example AA1 | | Example A1 | |
| Comparative Example AA2 | Image display device 101 | Comparative Example A2 | Color filter |
| Comparative Example AA3 | Image display device 101 | Comparative Example A3 | Color filter |
| Comparative Example AA4 | Image display device 101 | Comparative Example A4 | Color filter |
| Comparative Example AA5 | Image display device 101 | Comparative Example A5 | Color filter |
| Comparative Example AA6 | Image display device 101 | Comparative Example A6 | Color filter |
| Example AB1 | Image display device 101 | Example B1 | Color filter |
| Example AB2 | Image display device 101 | Example B2 | Color filter |
| Example AB3 | Image display device 101 | Example B3 | Color filter |
| Example AB4 | Image display device 101 | Example B4 | Color filter |
| Comparative Example AB1 | Image display device 101 | Comparative Example B1 | Color filter |
| Comparative Example AB2 | Image display device 101 | Comparative Example B2 | Color filter |
| Example AC1 | Image display device 101 | Example C1 | Color filter |
| Example AC2 | Image display device 101 | Example C2 | Color filter |
| Comparative Example AC1 | Image display device 101 | Comparative Example C1 | Color filter |
| Comparative Example AC2 | Image display device 101 | Comparative Example C2 | Color filter |
| Example AD1 | Image display device 101 | Example D1 | Color filter |
| Example AD2 | Image display device 101 | Example D2 | Color filter |
| Example AD3 | Image display device 101 | Example D3 | Color filter |
| Example AD4 | Image display device 101 | Example D4 | Color filter |
| Comparative Example AD1 | Image display device 101 | Comparative Example D1 | Color filter |
| Comparative Example AD2 | Image display device 101 | Comparative Example D2 | Color filter |

TABLE 17

| | Structure of luminescent device | | Characteristics of image display device | | | | | | | | | |
|---|---|---|---|---|---|---|---|---|---|---|---|---|
| | Excitation light energy from light emitting element | Bandgap energy of semiconductor phosphor micro-particle shell part | Red chromaticity point | | Green chromaticity point | | Blue chromaticity point | | White chromaticity point | | NTSC ratio | Bright-ness |
| Example | [eV] | [eV] | u' | v' | u' | v' | u' | v' | u' | v' | [%] | [%] |
| Example AA1 | 2.76 | 2.70 | 0.5057 | 0.5179 | 0.0735 | 0.5739 | 0.1589 | 0.1986 | 0.1903 | 0.4399 | 105.8% | 100.0% |
| Example AA2 | 2.76 | 2.70 | 0.4775 | 0.5221 | 0.0925 | 0.5687 | 0.1562 | 0.1993 | 0.1903 | 0.4400 | 93.5% | 95.6% |
| Example AA3 | 2.76 | 2.70 | 0.4589 | 0.5244 | 0.1101 | 0.5663 | 0.1574 | 0.1926 | 0.1903 | 0.4399 | 86.2% | 94.1% |
| Example AA4 | 2.76 | 2.70 | 0.5046 | 0.5180 | 0.0735 | 0.5746 | 0.1603 | 0.1961 | 0.1904 | 0.4399 | 106.3% | 103.2% |
| Example AA5 | 2.76 | 2.70 | 0.4974 | 0.5187 | 0.0832 | 0.5754 | 0.1659 | 0.1832 | 0.1902 | 0.4400 | 106.0% | 85.9% |
| Example AA6 | 2.76 | 2.70 | 0.5170 | 0.5161 | 0.0726 | 0.5735 | 0.1578 | 0.2007 | 0.1902 | 0.4400 | 108.0% | 79.5% |
| Example AA7 | 2.76 | 2.70 | 0.5087 | 0.5170 | 0.0811 | 0.5753 | 0.1644 | 0.1864 | 0.1900 | 0.4402 | 108.4% | 45.9% |
| Example AA8 | 2.76 | 2.70 | 0.4901 | 0.5202 | 0.0895 | 0.5682 | 0.1545 | 0.2025 | 0.1903 | 0.4400 | 96.3% | 47.6% |
| Example AA9 | 2.76 | 2.70 | 0.4647 | 0.5242 | 0.1167 | 0.5636 | 0.1637 | 0.1750 | 0.2112 | 0.4249 | 89.6% | 41.7% |
| Example AA10 | 2.76 | 2.70 | 0.5122 | 0.5166 | 0.0783 | 0.5756 | 0.1646 | 0.1863 | 0.1919 | 0.4388 | 110.1% | 45.0% |
| Example AA11 | 2.76 | 2.70 | 0.5080 | 0.5174 | 0.0765 | 0.5750 | 0.1629 | 0.1897 | 0.1924 | 0.4385 | 108.3% | 133.9% |
| Example AA12 | 2.76 | 2.70 | 0.5032 | 0.5185 | 0.0732 | 0.5729 | 0.1587 | 0.1978 | 0.1943 | 0.4371 | 105.2% | 111.6% |
| Example AA13 | 2.76 | 2.72 | 0.5086 | 0.5178 | 0.0667 | 0.5726 | 0.1561 | 0.2042 | 0.1944 | 0.4370 | 106.1% | 97.6% |
| Example AA14 | 2.76 | 2.72 | 0.5057 | 0.5179 | 0.0748 | 0.5737 | 0.1594 | 0.1973 | 0.1909 | 0.4395 | 105.8% | 44.6% |
| Example AA15 | 2.76 | 2.72 | 0.5107 | 0.5172 | 0.0721 | 0.5728 | 0.1573 | 0.2011 | 0.1922 | 0.4386 | 106.3% | 22.7% |
| Example AA16 | 2.76 | 2.72 | 0.5118 | 0.5164 | 0.0811 | 0.5755 | 0.1644 | 0.1870 | 0.1886 | 0.4412 | 109.1% | 28.3% |
| Example AA17 | 2.76 | 2.72 | 0.5179 | 0.5158 | 0.0745 | 0.5752 | 0.1622 | 0.1919 | 0.1916 | 0.4390 | 110.7% | 95.4% |
| Example AA18 | 2.76 | 2.72 | 0.5135 | 0.5167 | 0.0759 | 0.5735 | 0.1608 | 0.1931 | 0.1945 | 0.4370 | 108.6% | 46.8% |
| Example AA19 | 2.76 | 2.27 | 0.5080 | 0.5172 | 0.0807 | 0.5751 | 0.1649 | 0.1848 | 0.1927 | 0.4382 | 108.8% | 77.7% |
| Example AA20 | 2.76 | 2.27 | 0.5201 | 0.5157 | 0.0690 | 0.5742 | 0.1582 | 0.2006 | 0.1915 | 0.4391 | 109.7% | 42.0% |
| Example AA21 | 2.76 | 2.70 | 0.3727 | 0.5369 | 0.2174 | 0.5592 | 0.1963 | 0.0923 | 0.2464 | 0.3996 | 49.0% | 110.8% |
| Example AA22 | 2.76 | 2.70 | 0.3686 | 0.5366 | 0.2030 | 0.5624 | 0.1955 | 0.0958 | 0.2331 | 0.4092 | 52.0% | 55.6% |
| Example AA23 | 2.76 | 2.70 | 0.4491 | 0.5259 | 0.1267 | 0.5686 | 0.1731 | 0.1582 | 0.2104 | 0.4255 | 87.5% | 89.4% |
| Example AA24 | 2.76 | 2.70 | 0.4540 | 0.5247 | 0.1281 | 0.5703 | 0.1764 | 0.1513 | 0.2068 | 0.4281 | 90.2% | 42.1% |
| Example AA25 | 2.76 | 2.70 | 0.5071 | 0.5189 | 0.0699 | 0.5593 | 0.1369 | 0.2320 | 0.1903 | 0.4400 | 94.3% | 70.1% |
| Example AA26 | 2.76 | 2.70 | 0.5104 | 0.5181 | 0.0777 | 0.5611 | 0.1411 | 0.2214 | 0.1904 | 0.4399 | 96.9% | 29.0% |
| Example AA27 | 2.76 | 2.70 | 0.5047 | 0.5176 | 0.0819 | 0.5751 | 0.1646 | 0.1858 | 0.1903 | 0.4400 | 107.4% | 66.5% |
| Example AA28 | 2.76 | 2.70 | 0.4980 | 0.5189 | 0.0781 | 0.5749 | 0.1626 | 0.1906 | 0.1903 | 0.4399 | 105.2% | 104.5% |
| Comparative Example AA1 | 2.76 | 3.56 | 0.5104 | 0.5168 | 0.0799 | 0.5753 | 0.1642 | 0.1871 | 0.1903 | 0.4400 | 109.0% | 75.1% |
| Comparative Example AA2 | 2.76 | 3.56 | 0.5154 | 0.5164 | 0.0700 | 0.5741 | 0.1579 | 0.2013 | 0.1903 | 0.4400 | 108.2% | 60.6% |
| Comparative Example AA3 | 2.76 | 3.56 | 0.4978 | 0.5193 | 0.0718 | 0.5725 | 0.1561 | 0.2042 | 0.1904 | 0.4399 | 102.4% | 99.7% |
| Comparative Example AA4 | 2.76 | 3.56 | 0.5066 | 0.5180 | 0.0683 | 0.5732 | 0.1558 | 0.2058 | 0.1903 | 0.4400 | 105.0% | 79.3% |
| Comparative Example AA5 | 2.76 | 3.39 | 0.5193 | 0.5160 | 0.0649 | 0.5734 | 0.1548 | 0.2083 | 0.1903 | 0.4399 | 108.0% | 30.0% |
| Comparative Example AA6 | 2.76 | 3.39 | 0.5080 | 0.5175 | 0.0735 | 0.5744 | 0.1599 | 0.1969 | 0.1903 | 0.4399 | 106.9% | 19.2% |
| Example AB1 | 3.26 | 2.70 | 0.5090 | 0.5203 | 0.0633 | 0.5297 | 0.1024 | 0.2835 | 0.1903 | 0.4399 | 73.5% | 91.1% |
| Example AB2 | 3.26 | 2.70 | 0.5128 | 0.5197 | 0.0702 | 0.5315 | 0.1038 | 0.2779 | 0.1903 | 0.4400 | 75.2% | 35.5% |

TABLE 17-continued

| Example | Structure of luminescent device: Excitation light energy from light emitting element [eV] | Bandgap energy of semiconductor phosphor micro-particle shell part [eV] | Characteristics of image display device: Red chromaticity point u' | Red chromaticity point v' | Green chromaticity point u' | Green chromaticity point v' | Blue chromaticity point u' | Blue chromaticity point v' | White chromaticity point u' | White chromaticity point v' | NTSC ratio [%] | Bright-ness [%] |
|---|---|---|---|---|---|---|---|---|---|---|---|---|
| Example AB3 | 3.26 | 2.86 | 0.5197 | 0.5188 | 0.0564 | 0.5271 | 0.0992 | 0.2907 | 0.1903 | 0.4399 | 73.4% | 82.4% |
| Example AB4 | 3.26 | 2.86 | 0.5056 | 0.5211 | 0.0658 | 0.5194 | 0.0941 | 0.2961 | 0.1902 | 0.4399 | 66.0% | 37.2% |
| Comparative Example AB1 | 3.26 | 3.56 | 0.5152 | 0.5198 | 0.0568 | 0.5139 | 0.0893 | 0.3061 | 0.1903 | 0.4399 | 64.1% | 55.9% |
| Comparative Example AB2 | 3.26 | 3.39 | 0.5230 | 0.5186 | 0.0523 | 0.5140 | 0.0886 | 0.3079 | 0.1903 | 0.4400 | 65.3% | 33.3% |
| Example AC1 | 2.76 | 2.70 | 0.5058 | 0.5182 | 0.0733 | 0.5767 | 0.1647 | 0.1908 | 0.1904 | 0.4399 | 108.5% | 52.1% |
| Example AC2 | 2.76 | 2.70 | 0.5088 | 0.5173 | 0.0812 | 0.5780 | 0.1708 | 0.1776 | 0.1904 | 0.4399 | 111.4% | 23.6% |
| Comparative Example AC1 | 2.76 | 3.56 | 0.5105 | 0.5171 | 0.0799 | 0.5781 | 0.1704 | 0.1786 | 0.1904 | 0.4399 | 111.9% | 36.8% |
| Comparative Example AC2 | 2.76 | 3.39 | 0.5195 | 0.5163 | 0.0646 | 0.5763 | 0.1602 | 0.2012 | 0.1903 | 0.4400 | 110.8% | 16.1% |
| Example AD1 | 3.26 | 2.70 | 0.5091 | 0.5204 | 0.0619 | 0.5267 | 0.0998 | 0.2881 | 0.1903 | 0.4399 | 71.5% | 89.8% |
| Example AD2 | 3.26 | 2.70 | 0.5128 | 0.5197 | 0.0702 | 0.5315 | 0.1038 | 0.2779 | 0.1903 | 0.4400 | 75.2% | 35.5% |
| Example AD3 | 3.26 | 2.86 | 0.5196 | 0.5187 | 0.0570 | 0.5286 | 0.1005 | 0.2883 | 0.1904 | 0.4399 | 74.4% | 83.0% |
| Example AD4 | 3.26 | 2.86 | 0.5056 | 0.5211 | 0.0658 | 0.5194 | 0.0941 | 0.2961 | 0.1902 | 0.4399 | 66.0% | 37.2% |
| Comparative Example AD1 | 3.26 | 3.56 | 0.5151 | 0.5197 | 0.0585 | 0.5163 | 0.0911 | 0.3024 | 0.1904 | 0.4399 | 65.7% | 55.7% |
| Comparative Example AD2 | 3.26 | 3.39 | 0.5230 | 0.5186 | 0.0523 | 0.5140 | 0.0886 | 0.3079 | 0.1903 | 0.4400 | 65.3% | 22.5% |

Example BA1

Image Display Device 121

In Example BA1, image display device 121 having a structure shown in FIG. 8 using a blue luminescent semiconductor diode element as light emitting element 122 which is a backlight light source, and including wavelength conversion part 123 using a wavelength conversion member containing semiconductor phosphor microparticles synthesized in Production examples 1r, 1g in place of a color filter will be described.

That is, by sealing and solidifying the red luminescent semiconductor phosphor microparticle and the green luminescent semiconductor phosphor microparticle synthesized in Production examples 1r, 1g in silicone resin, a wavelength conversion member containing the semiconductor phosphor microparticles was fabricated. By using such a wavelength conversion member in place of a color filter, and combining a blue luminescent semiconductor diode element, image display device 121 of Example BA1 was fabricated. Evaluation of image display device 121 fabricated in this method revealed that an NTSC ratio was 129.4%, and brightness was 104.0%.

Examples BA2 to BA12, Comparative examples BA1 to BA8

Image Display Device 121

Image display device 121 having a structure shown in FIG. 8 using a semiconductor light emitting element selected from a blue luminescent semiconductor diode element, a UV luminescent semiconductor diode element, a blue luminescent semiconductor laser diode element, and a UV luminescent semiconductor laser diode element as light emitting element 122 which is a backlight light source, and including wavelength conversion part 123 using a wavelength conversion member containing a semiconductor phosphor microparticle synthesized in Production examples 2r to 22r, 2y to 22y, 2g to 20g, 2b to 20b, and Comparative production examples 1r to 6r, 1y to 6y, 1g to 6g, 1b to 6b in place of a color filter will be described.

Image display devices 121 of Examples BA2 to BA12, and Comparative examples BA1 to BA8 were fabricated in a method similar to that of Example BA1 except for the light emitting device and the semiconductor phosphor microparticle contained in the wavelength conversion member. That is, as shown in Table 18, as a light emitting device, a blue luminescent semiconductor diode element, a UV luminescent semiconductor diode element, a blue luminescent semiconductor laser diode element, or a UV luminescent semiconductor laser diode element were used. Also by sealing and solidifying semiconductor phosphor microparticles synthesized in Production examples 2r to 22r, 2y to 22y, 2g to 20g, 2b to 20b, and Comparative production examples 1r to 6r, 1y to 6y, 1g to 6g, 1b to 6b in silicone resin, wavelength conversion members containing the semiconductor phosphor microparticles were fabricated. Except for this, image display devices 121 of Examples BA2 to BA12, and Comparative examples BA1 to BA8 were fabricated in a method similar to that of Example BA1. Evaluation of image display devices 121 fabricated in this method revealed the NTSC ratios and brightnesses shown in Table 19.

TABLE 18

| Example | Configuration of image display device: Structure of image display device | Light emitting device | Wavelength conversion part |
|---|---|---|---|
| Example BA1 | Image display device 121 | Blue luminescent semiconductor diode element | Wavelength conversion member containing production examples 1r, 1g |
| Example BA2 | Image display device 121 | Blue luminescent semiconductor diode element | Wavelength conversion member containing Production examples 7r, 7g |
| Example BA3 | Image display device 121 | Blue-violet luminescent semiconductor diode element | Wavelength conversion member containing Production examples 1r, 1g, 1b |
| Example BA4 | Image display device 121 | Blue-violet luminescent semiconductor diode element | Wavelength conversion member containing Production examples 7r, 7g, 7b |
| Example BA5 | Image display device 121 | Blue-violet luminescent semiconductor diode element | Wavelength conversion member containing Production examples 19r, 19g, 19b |
| Example BA6 | Image display device 121 | Blue-violet luminescent semiconductor diode element | Wavelength conversion member containing Production examples 20r, 20g, 20b |
| Example BA7 | Image display device 121 | Blue luminescent semiconductor laser diode element | Wavelength conversion member containing Production examples 1r, 1g |
| Example BA8 | Image display device 121 | Blue luminescent semiconductor laser diode element | Wavelength conversion member containing Production examples 7r, 7g |
| Example BA9 | Image display device 121 | Blue-violet luminescent semiconductor laser diode element | Wavelength conversion member containing Production examples 1r, 1g, 1b |
| Example BA10 | Image display device 121 | Blue-violet luminescent semiconductor laser diode element | Wavelength conversion member containing Production examples 7r, 7g, 7b |
| Example BA11 | Image display device 121 | Blue-violet luminescent semiconductor laser diode element | Wavelength conversion member containing Production examples 19r, 19g, 19b |
| Example BA12 | Image display device 121 | Blue-violet luminescent semiconductor laser diode element | Wavelength conversion member containing Production examples 20r, 20g, 20b |
| Comparative Example BA1 | Image display device 121 | Blue luminescent semiconductor diode element | Wavelength conversion member containing Production examples 1r, 1g |
| Comparative Example BA2 | Image display device 121 | Blue luminescent semiconductor diode element | Wavelength conversion member containing Production examples 5r, 5g |
| Comparative Example BA3 | Image display device 121 | Blue-violet luminescent semiconductor diode element | Wavelength conversion member containing Comparative production examples 1r, 1g, 1b |
| Comparative Example BA4 | Image display device 121 | Blue-violet luminescent semiconductor diode element | Wavelength conversion member containing Comparative production examples 5r, 5g, 5b |
| Comparative Example BA5 | Image display device 121 | Blue luminescent semiconductor laser diode element | Wavelength conversion member containing Comparative production examples 1r, 1g |
| Comparative Example BA6 | Image display device 121 | Blue luminescent semiconductor laser diode element | Wavelength conversion member containing Comparative production examples 5r, 5g |
| Comparative Example BA7 | Image display device 121 | Blue-violet luminescent semiconductor laser diode element | Wavelength conversion member containing Comparative production examples 1r, 1g, 1b |
| Comparative Example BA8 | Image display device 121 | Blue-violet luminescent semiconductor laser diode element | Wavelength conversion member containing Comparative production examples 5r, 5g, 5b |

TABLE 19

| | Structure of luminescent device | | Characteristics of image display device | | | | | | | | | |
|---|---|---|---|---|---|---|---|---|---|---|---|---|
| | Excitation light energy from light emitting element | Bandgap energy of semiconductor phosphor micro-particle shell part | Red chromaticity point | | Green chromaticity point | | Blue chromaticity point | | White chromaticity point | | NTSC ratio | Bright-ness |
| Example | [eV] | [eV] | u' | v' | u' | v' | u' | v' | u' | v' | [%] | [%] |
| Example BA1 | 2.76 | 2.70 | 0.4995 | 0.5168 | 0.0658 | 0.5764 | 0.1971 | 0.0929 | 0.1903 | 0.4399 | 129.4% | 104.0% |
| Example BA2 | 2.76 | 2.70 | 0.5059 | 0.5269 | 0.0767 | 0.5867 | 0.1978 | 0.0918 | 0.1903 | 0.4400 | 131.5% | 48.1% |
| Example BA3 | 3.26 | 2.70 | 0.5063 | 0.5214 | 0.0666 | 0.5739 | 0.1027 | 0.2700 | 0.1903 | 0.4400 | 84.4% | 90.6% |
| Example BA4 | 3.26 | 2.70 | 0.5006 | 0.5175 | 0.0764 | 0.5837 | 0.1030 | 0.2658 | 0.1903 | 0.4400 | 85.3% | 35.7% |
| Example BA5 | 3.26 | 2.86 | 0.5134 | 0.5291 | 0.0570 | 0.5837 | 0.1001 | 0.2750 | 0.1904 | 0.4399 | 88.8% | 81.7% |
| Example BA6 | 3.26 | 2.86 | 0.5026 | 0.5296 | 0.0799 | 0.5718 | 0.0895 | 0.3028 | 0.1903 | 0.4399 | 72.6% | 36.5% |
| Example BA7 | 2.76 | 2.70 | 0.5164 | 0.5182 | 0.0662 | 0.5811 | 0.2074 | 0.0749 | 0.1903 | 0.4400 | 140.4% | 54.1% |
| Example BA8 | 2.76 | 2.70 | 0.5137 | 0.5246 | 0.0776 | 0.5767 | 0.2043 | 0.0749 | 0.1903 | 0.4400 | 136.0% | 24.8% |
| Example BA9 | 3.26 | 2.70 | 0.5117 | 0.5275 | 0.0673 | 0.5817 | 0.1033 | 0.2696 | 0.1903 | 0.4400 | 87.7% | 90.5% |
| Example BA10 | 3.26 | 2.70 | 0.5042 | 0.5103 | 0.0766 | 0.5914 | 0.1012 | 0.2699 | 0.1903 | 0.4399 | 86.8% | 35.7% |
| Example BA11 | 3.26 | 2.86 | 0.5157 | 0.5282 | 0.0572 | 0.5774 | 0.1013 | 0.2740 | 0.1903 | 0.4399 | 87.7% | 81.7% |
| Example BA12 | 3.26 | 2.86 | 0.4995 | 0.5285 | 0.0805 | 0.5824 | 0.0898 | 0.3048 | 0.1904 | 0.4399 | 74.2% | 36.5% |
| Comparative Example BA1 | 2.76 | 3.56 | 0.5193 | 0.5172 | 0.0754 | 0.5751 | 0.2000 | 0.0931 | 0.1903 | 0.4400 | 132.5% | 74.0% |
| Comparative Example BA2 | 2.76 | 3.39 | 0.5305 | 0.5255 | 0.0585 | 0.5868 | 0.2013 | 0.0921 | 0.1903 | 0.4400 | 144.0% | 32.4% |
| Comparative Example BA3 | 3.26 | 3.56 | 0.5161 | 0.5247 | 0.0760 | 0.5812 | 0.0837 | 0.3184 | 0.1903 | 0.4399 | 73.9% | 55.7% |
| Comparative Example BA4 | 3.26 | 3.39 | 0.5347 | 0.5170 | 0.0764 | 0.5857 | 0.0858 | 0.3060 | 0.1904 | 0.4399 | 81.8% | 22.3% |

TABLE 19-continued

| | Structure of luminescent device | | Characteristics of image display device | | | | | | | | | |
|---|---|---|---|---|---|---|---|---|---|---|---|---|
| | Excitation light energy from light emitting element | Bandgap energy of semiconductor phosphor micro-particle shell part | Red chromaticity point | | Green chromaticity point | | Blue chromaticity point | | White chromaticity point | | NTSC ratio | Bright-ness |
| Example | [eV] | [eV] | u' | v' | u' | v' | u' | v' | u' | v' | [%] | [%] |
| Comparative Example BA5 | 2.76 | 3.56 | 0.5169 | 0.5118 | 0.0763 | 0.5824 | 0.2094 | 0.0748 | 0.1903 | 0.4400 | 137.3% | 39.1% |
| Comparative Example BA6 | 2.76 | 3.39 | 0.5383 | 0.5334 | 0.0588 | 0.5953 | 0.2072 | 0.0744 | 0.1903 | 0.4399 | 154.2% | 16.7% |
| Comparative Example BA7 | 3.26 | 3.56 | 0.5121 | 0.5171 | 0.0766 | 0.5763 | 0.0838 | 0.3231 | 0.1903 | 0.4399 | 70.4% | 56.3% |
| Comparative Example BA8 | 3.26 | 3.39 | 0.5269 | 0.5206 | 0.0774 | 0.5758 | 0.0852 | 0.3050 | 0.1904 | 0.4399 | 77.7% | 22.0% |

Example CE1

Image Display Device 151

In Example CE1, by using light emitting device 41 of Example E1 as a backlight light source, and using wavelength conversion part 104 having a color filter of the transmissivity shown in FIG. 7, image display device 151 having a structure shown in FIG. 11 was fabricated. That is, light emitting device 41 of Example E1 in which a red luminescent semiconductor phosphor microparticle and a green luminescent semiconductor phosphor microparticle respectively synthesized in Production examples 1r and 1g were combined with a blue luminescent organic electroluminescence element, was used as a backlight. By combining such light emitting device 41 with wavelength conversion part 104 including liquid crystal and a color filter, image display device 151 of Example CE1 was fabricated. Image display device 151 fabricated in the present method was evaluated, to reveal that an NTSC ratio was 99.4% and brightness was 64.1%.

Examples CE2 to CE4, Comparative Examples CE1 to CE2

Image Display Device 151

Image display device 151 having a structure shown in FIG. 11 including white light emitting device 41 made up of various semiconductor phosphor microparticles and a blue luminescent organic electroluminescence element, and wavelength conversion part 104 having a color filter of the transmissivity shown in FIG. 7 will be described.

Except for the light emitting device, image display devices 151 of Examples CE2 to CE4, and Comparative examples CE1 to CE2 were fabricated in a method similar to that of Example CE1. That is, as shown in Table 20, by using light emitting devices fabricated in Examples E2 to A27, and Comparative examples E1 to E6 as a backlight light source, and including wavelength conversion part 104 having a color filter, image display devices 151 of Examples CE2 to CE4, and Comparative example CE1 to CE2 were fabricated. Evaluation of image display devices 151 fabricated in the present method revealed the NTSC ratios and brightnesses shown in Table 21.

TABLE 20

| | Configuration of image display device | | |
|---|---|---|---|
| Example | Structure of image display device | Light emitting device | Wavelength conversion part |
| Example CE1 | Image display device 151 | Example E1 | Color filter |
| Example CE2 | Image display device 151 | Example E7 | Color filter |
| Example CE3 | Image display device 151 | Example E21 | Color filter |
| Example CE4 | Image display device 151 | Example E23 | Color filter |
| Comparative Example CE1 | Image display device 151 | Comparative Example E1 | Color filter |
| Comparative Example CE2 | Image display device 151 | Comparative Example E5 | Color filter |

TABLE 21

| | Structure of luminescent device | | Characteristics of image display device | | | | | | | | | |
|---|---|---|---|---|---|---|---|---|---|---|---|---|
| | Excitation light energy from light emitting element | Bandgap energy of semiconductor phosphor micro-particle shell part | Red chromaticity point | | Green chromaticity point | | Blue chromaticity point | | White chromaticity point | | NTSC ratio | Bright-ness |
| Example | [eV] | [eV] | u' | v' | u' | v' | u' | v' | u' | v' | [%] | [%] |
| Example CE1 | 2.73 | 2.70 | 0.5056 | 0.5175 | 0.0716 | 0.5662 | 0.1478 | 0.2167 | 0.1903 | 0.4400 | 99.4% | 64.1% |
| Example CE2 | 2.73 | 2.70 | 0.5089 | 0.5166 | 0.0783 | 0.5676 | 0.1521 | 0.2069 | 0.1903 | 0.4399 | 101.8% | 30.4% |
| Example CE3 | 2.73 | 2.70 | 0.3722 | 0.5362 | 0.1948 | 0.5531 | 0.1751 | 0.1361 | 0.2263 | 0.4140 | 49.9% | 75.1% |
| Example CE4 | 2.73 | 2.70 | 0.4415 | 0.5261 | 0.1175 | 0.5632 | 0.1548 | 0.1962 | 0.1904 | 0.4399 | 78.9% | 61.9% |
| Comparative Example CE1 | 2.73 | 3.56 | 0.5105 | 0.5164 | 0.0771 | 0.5677 | 0.1518 | 0.2077 | 0.1903 | 0.4399 | 102.2% | 46.9% |
| Comparative Example CE2 | 2.73 | 3.39 | 0.5191 | 0.5156 | 0.0636 | 0.5657 | 0.1445 | 0.2248 | 0.1903 | 0.4399 | 101.6% | 20.9% |

Example DE1

Image Display Device 161

In Example DE1, image display device 161 having a structure shown in FIG. 12 using a blue luminescent organic electroluminescence element as a backlight light source, and including wavelength conversion part 123 using a wavelength conversion member containing semiconductor phosphor microparticles synthesized in Production examples 1r, 1g in place of a color filter will be described. That is, by sealing and solidifying the red luminescent semiconductor phosphor microparticle and the green luminescent semiconductor phosphor microparticle respectively synthesized in Production examples 1r, 1g in silicone resin, a wavelength conversion member containing semiconductor phosphor microparticles was fabricated. By combining wavelength conversion part 123 using such a wavelength conversion member in place of a color filter, with light emitting element 162 using a blue luminescent organic electroluminescence element, image display device 161 of Example DE1 was fabricated. Image display device 161 fabricated in the present method was evaluated, to reveal that an NTSC ratio was 117.3%, and brightness was 66.4%.

Example DE2, Comparative Examples DE1 to DE2

Image Display Device 161

Image display device 161 having a structure shown in FIG. 12 using a blue luminescent organic electroluminescence element as light emitting element 162 which is a backlight light source, and including wavelength conversion part 123 using a wavelength conversion member containing semiconductor phosphor microparticles synthesized in Production examples 2r to 22r, 2y to 22y, 2g to 20g, 2b to 20b, and Comparative production examples 1r to 6r, 1y to 6y, 1g to 6g, 1b to 6b in place of a color filter will be described.

Image display devices 161 of Example DE2, and Comparative examples DE1 to DE2 were fabricated by using a method similar to that of Example DE1 except for the light emitting device and semiconductor phosphor microparticles contained in the wavelength conversion member. That is, as shown in Table 22, as the light emitting device, a blue luminescent organic electroluminescence element was used. Further, by sealing and solidifying semiconductor phosphor microparticles synthesized in Production examples 2r to 22r, 2y to 22y, 2g to 20g, 2b to 20b, and Comparative production examples 1r to 6r, 1y to 6y, 1g to 6g, 1b to 6b in silicone resin, a wavelength conversion member containing semiconductor phosphor microparticles was fabricated. Except for this, in a method similar to that of Example DE1, image display devices 161 of Example DE2 and Comparative examples DE1 to DE2 were fabricated. Evaluation of image display devices 161 fabricated in the present method revealed an NTSC ratio and brightness as shown in Table 23.

TABLE 22

| | Configuration of image display device | | |
|---|---|---|---|
| Example | Structure of image display device | Light emitting device | Wavelength conversion part |
| Example DE1 | Image display device 161 | Blue organic EL element | Wavelength conversion member containing Production examples 1r, 1g |
| Example DE2 | Image display device 161 | Blue organic EL element | Wavelength conversion member containing Production examples 7r, 7g |
| Comparative Example DE1 | Image display device 161 | Blue organic EL element | Wavelength conversion member containing Comparative production examples 1r, 1g |
| Comparative Example DE2 | Image display device 161 | Blue organic EL element | Wavelength conversion member containing Comparative production examples 5r, 5g |

TABLE 23

| | Structure of luminescent device | | Characteristics of image display device | | | | | | | | | |
|---|---|---|---|---|---|---|---|---|---|---|---|---|
| | Excitation light energy from light emitting element | Bandgap energy of semiconductor phosphor microparticle shell part | Red chromaticity point | | Green chromaticity point | | Blue chromaticity point | | White chromaticity point | | NTSC ratio | Brightness |
| Example | [eV] | [eV] | u' | v' | u' | v' | u' | v' | u' | v' | [%] | [%] |
| Example DE1 | 2.73 | 2.70 | 0.5071 | 0.5239 | 0.0663 | 0.5793 | 0.1753 | 0.1530 | 0.1904 | 0.4399 | 117.3% | 66.4% |
| Example DE2 | 2.73 | 2.70 | 0.5125 | 0.5231 | 0.0772 | 0.5807 | 0.1753 | 0.1530 | 0.1903 | 0.4399 | 117.5% | 31.7% |
| Comparative Example DE1 | 2.73 | 3.56 | 0.5148 | 0.5227 | 0.0760 | 0.5807 | 0.1753 | 0.1530 | 0.1903 | 0.4399 | 117.4% | 47.2% |
| Comparative Example DE2 | 2.73 | 3.39 | 0.5232 | 0.5215 | 0.0580 | 0.5785 | 0.1753 | 0.1530 | 0.1903 | 0.4400 | 120.5% | 20.1% |

Example EE1

Image Display Device 171

In Example EE1, image display device 171 having a structure shown in FIG. 13 was fabricated by using light emitting device 41 of Example E1 as a backlight light source, and using wavelength conversion part 172 having a color filter of the transmissivity shown in FIG. 7. That is, light emitting device 41 described in Example E1 combining the red luminescent semiconductor phosphor microparticle and the green luminescent semiconductor phosphor microparticle synthesized in Production examples 1r, 1g, with a blue luminescent organic electroluminescence element was used as a backlight. By combining light emitting device 41 with wavelength conversion part 172 made up of liquid crystal and a color filter, image display device 171 of Example CE1 was fabricated. Image display device 171 fabricated in the present method was evaluated, to reveal that an NTSC ratio was 98.7%, and brightness was 63.9%.

TABLE 24

| Example | Configuration of image display device: Structure of image display device | Light emitting device | Wavelength conversion part |
|---|---|---|---|
| Example EE1 | Image display device 171 | Example E1 | Color filter |
| Example EE2 | Image display device 171 | Example E7 | Color filter |
| Comparative Example EE1 | Image display device 171 | Comparative Example E1 | Color filter |
| Comparative Example EE2 | Image display device 171 | Comparative Example E5 | Color filter |

TABLE 25

| | Structure of luminescent device | | Characteristics of image display device | | | | | | | | | |
|---|---|---|---|---|---|---|---|---|---|---|---|---|
| | Excitation light energy from light emitting element | Bandgap energy of semiconductor phosphor microparticle shell part | Red chromaticity point | | Green chromaticity point | | Blue chromaticity point | | White chromaticity point | | NTSC ratio | Brightness |
| Example | [eV] | [eV] | u' | v' | u' | v' | u' | v' | u' | v' | [%] | [%] |
| Example EE1 | 2.73 | 2.70 | 0.5094 | 0.5148 | 0.0719 | 0.5670 | 0.1486 | 0.2177 | 0.1884 | 0.4365 | 98.7% | 63.9% |
| Example EE2 | 2.73 | 2.70 | 0.5090 | 0.5188 | 0.0781 | 0.5717 | 0.1510 | 0.2069 | 0.1902 | 0.4431 | 102.6% | 30.2% |
| Comparative Example EE1 | 2.73 | 3.56 | 0.5075 | 0.5145 | 0.0775 | 0.5727 | 0.1517 | 0.2082 | 0.1889 | 0.4384 | 102.7% | 45.7% |
| Comparative Example EE1 | 2.73 | 3.39 | 0.5143 | 0.5167 | 0.0637 | 0.5696 | 0.1455 | 0.2269 | 0.1909 | 0.4437 | 101.9% | 20.6% |

Example EE2, Comparative Examples EE1 to EE2

Image Display Device 171

Image display device 171 having a structure shown in FIG. 13 including white light emitting device 41 made up of various semiconductor phosphor microparticles and a blue luminescent organic electroluminescence element, and wavelength conversion part 172 having a color filter of the transmissivity shown in FIG. 7 will be described.

Using a method similar to that of Example EE1 except for the light emitting device, image display devices 171 of Example EE, and Comparative examples EE1 to EE2 were fabricated. That is, as shown in Table 24, image display devices 171 of Examples CE2 to CE4, and Comparative examples CE1 to CE2 were fabricated by using light emitting devices fabricated in Examples E2 to A27, and Comparative examples E1 to E6 as a backlight light source, and providing wavelength conversion part 172 having a color filter. Evaluation of image display devices 171 fabricated in the present method revealed an NTSC ratio and brightness as shown in Table 25.

Example FE1

Image Display Device 181

In Example FE1, image display device 181 having a structure shown in FIG. 15 using a blue luminescent organic electroluminescence element as light emitting element 162 which is a backlight light source, and including wavelength conversion part 182 using a wavelength conversion member containing semiconductor phosphor microparticles synthesized in Production examples 1r, 1g in place of a color filter will be described.

That is, by sealing and solidifying the red luminescent semiconductor phosphor microparticle and the green luminescent semiconductor phosphor microparticle, respectively synthesized in Production examples 1r, 1g in a silicone resin, wavelength conversion member 186 containing semiconductor phosphor microparticles was fabricated. By combining wavelength conversion member 186 with a blue luminescent organic electroluminescence element, image display device 181 of Example FE1 was fabricated. Image display device 181 fabricated in the present method was evaluated, to reveal that an NTSC ratio was 117.3% and brightness was 66.4%.

Examples FE2 to FE24, Comparative Examples FE1 to FE2

Image Display Device 181

Image display device 181 having a structure shown in FIG. 15 using a blue luminescent organic electroluminescence element as light emitting element 162 which is a backlight light source, and wavelength conversion part 182 using a wavelength conversion member containing semiconductor phosphor microparticles synthesized in Production examples 2r to 22r, 2y to 22y, 2g to 20g, 2b to 20b, and Comparative production examples 1r to 6r, 1y to 6y, 1g to 6g, 1b to 6b in place of a color filter will be described.

Image display devices 181 of Examples FE2 to FE24, and Comparative example FE1 to FE2 were fabricated in a similar manner as that of Example FE1 except for the light emitting device and semiconductor phosphor microparticles contained in the wavelength conversion member. That is, as shown in Table 26, as light emitting element 162, a blue luminescent organic electroluminescence element was used. By sealing and solidifying semiconductor phosphor microparticles synthesized in Production examples 2r to 22r, 2y to 22y, 2g to 20g, 2b to 20b, and Comparative production examples it to 6r, 1y to 6y, 1g to 6g, 1b to 6b in silicone resin, a wavelength conversion member containing semiconductor phosphor microparticles were fabricated. Except for this, image display devices 181 of Examples FE2 to FE24, and Comparative examples FE1 to FE2 were fabricated in a manner similar to that of Example FE1. Evaluation of image display devices 181 fabricated in the present method revealed an NTSC ratio and brightness as shown in Table 27.

TABLE 26

| | Configuration of image display device | | |
|---|---|---|---|
| Example | Structure of image display device | Light emitting device | Wavelength conversion part |
| Example FE1 | Image display device 181 | Example E1 | Wavelength conversion member containing Production examples 1r, 1g |
| Example FE2 | Image display device 181 | Example E2 | Wavelength conversion member containing Production examples 2r, 2g |
| Example FE3 | Image display device 181 | Example E3 | Wavelength conversion member containing Production examples 3r, 3g |
| Example FE4 | Image display device 181 | Example E4 | Wavelength conversion member containing Production examples 4r, 4g |
| Example FE5 | Image display device 181 | Example E5 | Wavelength conversion member containing Production examples 5r, 5g |
| Example FE6 | Image display device 181 | Example E6 | Wavelength conversion member containing Production examples 6r, 6g |
| Example FE7 | Image display device 181 | Example E7 | Wavelength conversion member containing Production examples 7r, 7g |
| Example FE8 | Image display device 181 | Example E8 | Wavelength conversion member containing Production examples 8r, 8g |
| Example FE9 | Image display device 181 | Example E9 | Wavelength conversion member containing Production examples 9r, 9g |
| Example FE10 | Image display device 181 | Example E10 | Wavelength conversion member containing Production examples 10r, 10g |
| Example FE11 | Image display device 181 | Example E11 | Wavelength conversion member containing Production examples 11r, 11g |
| Example FE12 | Image display device 181 | Example E12 | Wavelength conversion member containing Production examples 12r, 12g |
| Example FE13 | Image display device 181 | Example E13 | Wavelength conversion member containing Production examples 13r, 13g |
| Example FE14 | Image display device 181 | Example E14 | Wavelength conversion member containing Production examples 14r, 14g |
| Example FE15 | Image display device 181 | Example E15 | Wavelength conversion member containing Production examples 15r, 15g |
| Example FE16 | Image display device 181 | Example E16 | Wavelength conversion member containing Production examples 16r, 16g |
| Example FE17 | Image display device 181 | Example E17 | Wavelength conversion member containing Production examples 17r, 17g |
| Example FE18 | Image display device 181 | Example E18 | Wavelength conversion member containing Production examples 18r, 18g |
| Example FE19 | Image display device 181 | Example E19 | Wavelength conversion member containing Production examples 21r, 21g |
| Example FE20 | Image display device 181 | Example E20 | Wavelength conversion member containing Production examples 22r, 22g |
| Example FE21 | Image display device 181 | Example E25 | Wavelength conversion member containing Production examples 1r, 1g, 1b |
| Example FE22 | Image display device 181 | Example E26 | Wavelength conversion member containing Production examples 7r, 7g, 7b |
| Example FE23 | Image display device 181 | Example E27 | Wavelength conversion member containing Production examples 1r, 7g |
| Example FE24 | Image display device 181 | Example E28 | Wavelength conversion member containing Production examples 5r, 11g |
| Comparative Example FE1 | Image display device 181 | Comparative Example E1 | Comparative Wavelength conversion member containing Comparative production examples 1r, 1g |
| Comparative Example FE2 | Image display device 181 | Comparative Example E2 | Comparative Wavelength conversion member containing Comparative production examples 2r, 2g |
| Comparative Example FE3 | Image display device 181 | Comparative Example E3 | Comparative Wavelength conversion member containing Comparative production examples 3r, 3g |
| Comparative Example FE4 | Image display device 181 | Comparative Example E4 | Comparative Wavelength conversion member containing Comparative production examples 4r, 4g |
| Comparative Example FE5 | Image display device 181 | Comparative Example E5 | Comparative Wavelength conversion member containing Comparative production examples 5r, 5g |
| Comparative Example FE6 | Image display device 181 | Comparative Example E6 | Wavelength conversion member containing Comparative production examples 6r, 6g |

TABLE 27

| | Structure of luminescent device | | Characteristics of image display device | | | | | | | | | |
|---|---|---|---|---|---|---|---|---|---|---|---|---|
| | Excitation light energy from light emitting element | Bandgap energy of semiconductor phosphor micro-particle shell part | Red chromaticity point | | Green chromaticity point | | Blue chromaticity point | | White chromaticity point | | NTSC ratio | Bright-ness |
| Example | [eV] | [eV] | u' | v' | u' | v' | u' | v' | u' | v' | [%] | [%] |
| Example FE1 | 2.73 | 2.70 | 0.5103 | 0.5251 | 0.0657 | 0.5762 | 0.1758 | 0.1518 | 0.1904 | 0.4399 | 117.3% | 66.4% |
| Example FE2 | 2.73 | 2.70 | 0.4478 | 0.5347 | 0.0805 | 0.5705 | 0.1750 | 0.1527 | 0.1904 | 0.4399 | 96.2% | 65.4% |
| Example FE3 | 2.73 | 2.70 | 0.4001 | 0.5450 | 0.1103 | 0.5536 | 0.1749 | 0.1533 | 0.1903 | 0.4400 | 74.0% | 66.0% |
| Example FE4 | 2.73 | 2.70 | 0.5059 | 0.5228 | 0.0663 | 0.5822 | 0.1763 | 0.1525 | 0.1903 | 0.4399 | 116.9% | 68.5% |
| Example FE5 | 2.73 | 2.70 | 0.5025 | 0.5239 | 0.0774 | 0.5803 | 0.1736 | 0.1540 | 0.1903 | 0.4399 | 112.7% | 58.3% |
| Example FE6 | 2.73 | 2.70 | 0.5194 | 0.5174 | 0.0676 | 0.5782 | 0.1766 | 0.1527 | 0.1903 | 0.4400 | 119.0% | 53.2% |
| Example FE7 | 2.73 | 2.70 | 0.5176 | 0.5275 | 0.0773 | 0.5819 | 0.1750 | 0.1536 | 0.1903 | 0.4399 | 117.5% | 31.7% |
| Example FE8 | 2.73 | 2.70 | 0.4731 | 0.5241 | 0.0844 | 0.5673 | 0.1742 | 0.1530 | 0.1903 | 0.4399 | 100.7% | 33.4% |
| Example FE9 | 2.73 | 2.70 | 0.3986 | 0.5383 | 0.1079 | 0.5509 | 0.1752 | 0.1518 | 0.1903 | 0.4400 | 73.8% | 31.8% |
| Example FE10 | 2.73 | 2.70 | 0.5123 | 0.5278 | 0.0730 | 0.5816 | 0.1768 | 0.1523 | 0.1903 | 0.4399 | 117.3% | 31.2% |
| Example FE11 | 2.73 | 2.70 | 0.5135 | 0.5227 | 0.0698 | 0.5807 | 0.1770 | 0.1524 | 0.1903 | 0.4399 | 117.8% | 88.4% |
| Example FE12 | 2.73 | 2.70 | 0.5041 | 0.5282 | 0.0646 | 0.5755 | 0.1746 | 0.1536 | 0.1903 | 0.4399 | 115.5% | 74.7% |
| Example FE13 | 2.73 | 2.72 | 0.5117 | 0.5255 | 0.0570 | 0.5838 | 0.1755 | 0.1539 | 0.1903 | 0.4399 | 120.9% | 65.1% |
| Example FE14 | 2.73 | 2.72 | 0.5034 | 0.5234 | 0.0682 | 0.5782 | 0.1738 | 0.1528 | 0.1903 | 0.4399 | 114.9% | 30.6% |
| Example FE15 | 2.73 | 2.72 | 0.5175 | 0.5245 | 0.0660 | 0.5770 | 0.1764 | 0.1524 | 0.1903 | 0.4399 | 119.1% | 15.8% |
| Example FE16 | 2.73 | 2.72 | 0.5194 | 0.5248 | 0.0775 | 0.5768 | 0.1741 | 0.1526 | 0.1903 | 0.4399 | 116.9% | 19.7% |
| Example FE17 | 2.73 | 2.72 | 0.5253 | 0.5236 | 0.0699 | 0.5818 | 0.1763 | 0.1541 | 0.1903 | 0.4400 | 120.9% | 63.9% |
| Example FE18 | 2.73 | 2.72 | 0.5222 | 0.5219 | 0.0714 | 0.5815 | 0.1740 | 0.1544 | 0.1903 | 0.4400 | 119.5% | 32.6% |
| Example FE19 | 2.73 | 2.27 | 0.5106 | 0.5264 | 0.0762 | 0.5845 | 0.1763 | 0.1521 | 0.1904 | 0.4399 | 116.6% | 52.7% |
| Example FE20 | 2.73 | 2.27 | 0.5281 | 0.5196 | 0.0634 | 0.5773 | 0.1748 | 0.1538 | 0.1903 | 0.4399 | 122.0% | 28.4% |
| Example FE21 | 2.73 | 2.70 | 0.5106 | 0.5261 | 0.0665 | 0.5793 | 0.1046 | 0.2721 | 0.1903 | 0.4399 | 86.5% | 49.9% |
| Example FE22 | 2.73 | 2.70 | 0.5053 | 0.5161 | 0.0763 | 0.5873 | 0.1022 | 0.2672 | 0.1903 | 0.4400 | 86.8% | 21.8% |
| Example FE23 | 2.73 | 2.70 | 0.5030 | 0.5249 | 0.0767 | 0.5762 | 0.1763 | 0.1541 | 0.1903 | 0.4400 | 112.1% | 46.2% |
| Example FE24 | 2.73 | 2.70 | 0.5007 | 0.5204 | 0.0700 | 0.5848 | 0.1753 | 0.1527 | 0.1903 | 0.4399 | 114.9% | 69.1% |
| Comparative Example FE1 | 2.73 | 3.56 | 0.5104 | 0.5242 | 0.0659 | 0.5801 | 0.1752 | 0.1541 | 0.1903 | 0.4399 | 117.4% | 50.3% |
| Comparative Example FE2 | 2.73 | 3.56 | 0.5185 | 0.5182 | 0.0805 | 0.5733 | 0.1765 | 0.1529 | 0.1903 | 0.4399 | 114.6% | 39.9% |
| Comparative Example FE3 | 2.73 | 3.56 | 0.4966 | 0.5232 | 0.1098 | 0.5614 | 0.1758 | 0.1531 | 0.1904 | 0.4399 | 99.6% | 66.1% |
| Comparative Example FE4 | 2.73 | 3.56 | 0.5084 | 0.5267 | 0.0660 | 0.5856 | 0.1767 | 0.1519 | 0.1903 | 0.4399 | 118.8% | 51.9% |
| Comparative Example FE5 | 2.73 | 3.39 | 0.5277 | 0.5202 | 0.0771 | 0.5835 | 0.1754 | 0.1526 | 0.1903 | 0.4400 | 120.5% | 20.1% |
| Comparative Example FE6 | 2.73 | 3.39 | 0.5087 | 0.5244 | 0.0679 | 0.5836 | 0.1761 | 0.1538 | 0.1904 | 0.4399 | 117.3% | 12.9% |

<<Examination of Difference Depending on Bandgap of Shell Part Material>>

In the following, influence of difference in material of the shell part of the semiconductor phosphor microparticle on brightness of the image display device of the present invention will be examined.

Figure 27:
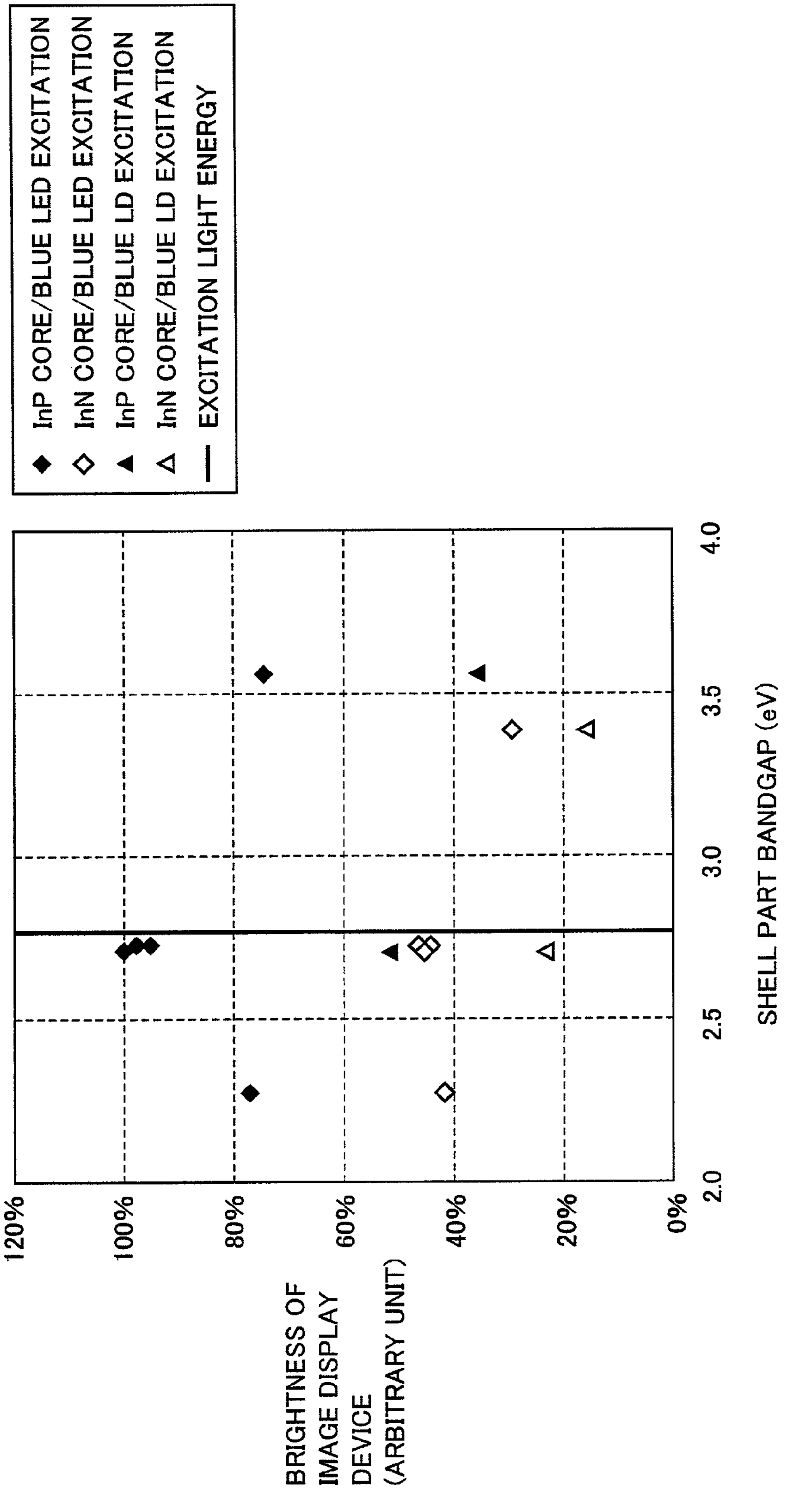
FIG. 27 is a graph showing shell part bandgap energy and brightness in an image display device of the present invention.
Figure 28:
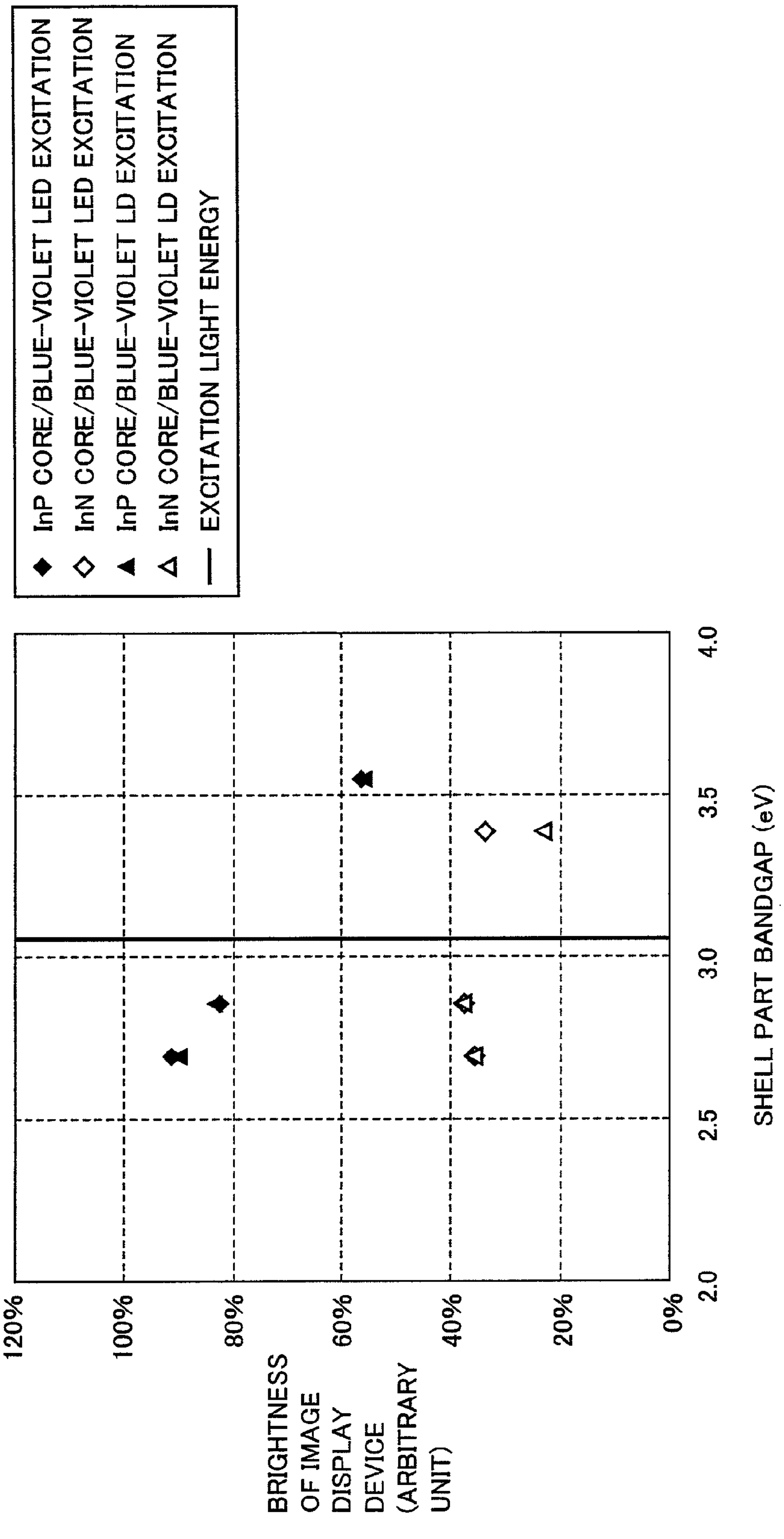
FIG. 28 is a graph showing shell part bandgap energy and brightness in an image display device of the present invention.
Figure 29:
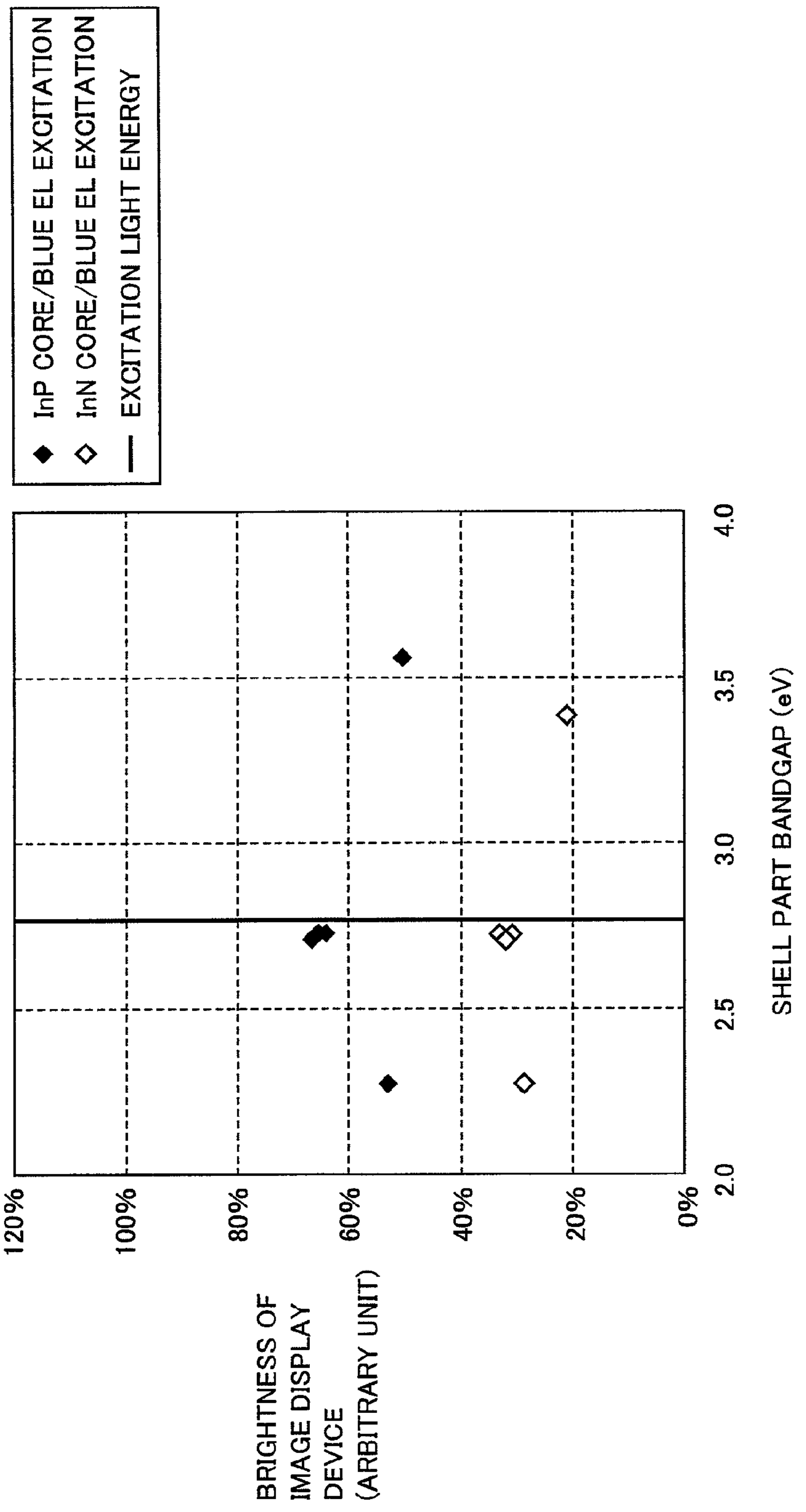
FIG. 29 is a graph showing shell part bandgap energy and brightness in an image display device of the present invention.

FIG. 27, FIG. 28 and FIG. 29 are graphs showing relation of brightness of image display devices 101, 181 using various semiconductor phosphor microparticles having a core/shell structure. In FIG. 27 to FIG. 29, the horizontal axis represents bandgap energy of the shell part material of the semiconductor phosphor microparticle, and the vertical axis plots a relative value of brightness of the image display device. Here, as an excitation light source of the image display device, a light emitting device including a blue semiconductor light emitting diode element and a blue semiconductor light emitting laser diode element is used in FIG. 27, and a light emitting device including a UV semiconductor light emitting diode element and a UV semiconductor light emitting laser diode element is used in FIG. 28, and a light emitting device including a blue electroluminescence element is used in FIG. 29. The straight line in the drawing represents energy of excitation light emitted from the light source. In every case of FIG. 27 to FIG. 29, it can be found that brightness of the image display device increases when bandgap energy of the shell part material is smaller than excitation light energy of the light source. This is attributable to the fact that concentration quenching of semiconductor phosphor microparticle can be suppressed by absorbing excitation light in the shell part having larger volume than the core part. This is because concentration can be decreased by the capability of efficient absorption of excitation light.

<<Examination of Influence when Bandgap of Shell Part Material is Small>>

In the following, characteristics of an image display device using a semiconductor phosphor microparticle having small bandgap energy of the shell part will be examined.

Example AA1 and Example AA19 will be compared. Image display devices of Example AA1 and Example AA19 were fabricated in the same condition except for the shell part material of the red semiconductor phosphor microparticle. As the shell part material of the red semiconductor phosphor microparticle, a ZnSe material was used in Example AA1, and a GaP material was used in Example AA19. At this time, it can be found that brightness of the image display device of AA19 significantly decreases to 77.7%, in contrast to the brightness of the image display device of Example A1 of 100.0%.

Example AA7 and Example AA20 will be compared. Image display devices of Example AA7 and Example AA20 were fabricated in the same condition except for the shell part material of the red semiconductor phosphor microparticle. As the shell part material of the red semiconductor phosphor microparticle, a ZnSe material was used in Example A1, and a GaP material was used in Example AA19. At this time, it can be found that brightness of the image display device of A20 significantly decreases to 42.0%, in contrast to the brightness of the image display device of Example AA7 of 45.9%.

This is attributable to the fact that when the red semiconductor phosphor microparticle in which the shell part material is a GaP material is used, the red phosphor absorbs luminescence of a blue semiconductor phosphor microparticle. At this time, brightness of the image display device decreases due to the loss arising by absorption of the blue luminescence in the red phosphor. That is, from the view point of brightness of the image display device, it is preferred that bandgap energy of the shell part of the semiconductor phosphor microparticle is larger than bandgap energy of the core part of any semiconductor phosphor microparticles contained in the image display device.

<<Examination of Difference in Core Part Material>>

In the following, influence of the difference in material of the core part on brightness of the image display device of the present invention will be examined.

Figure 30:
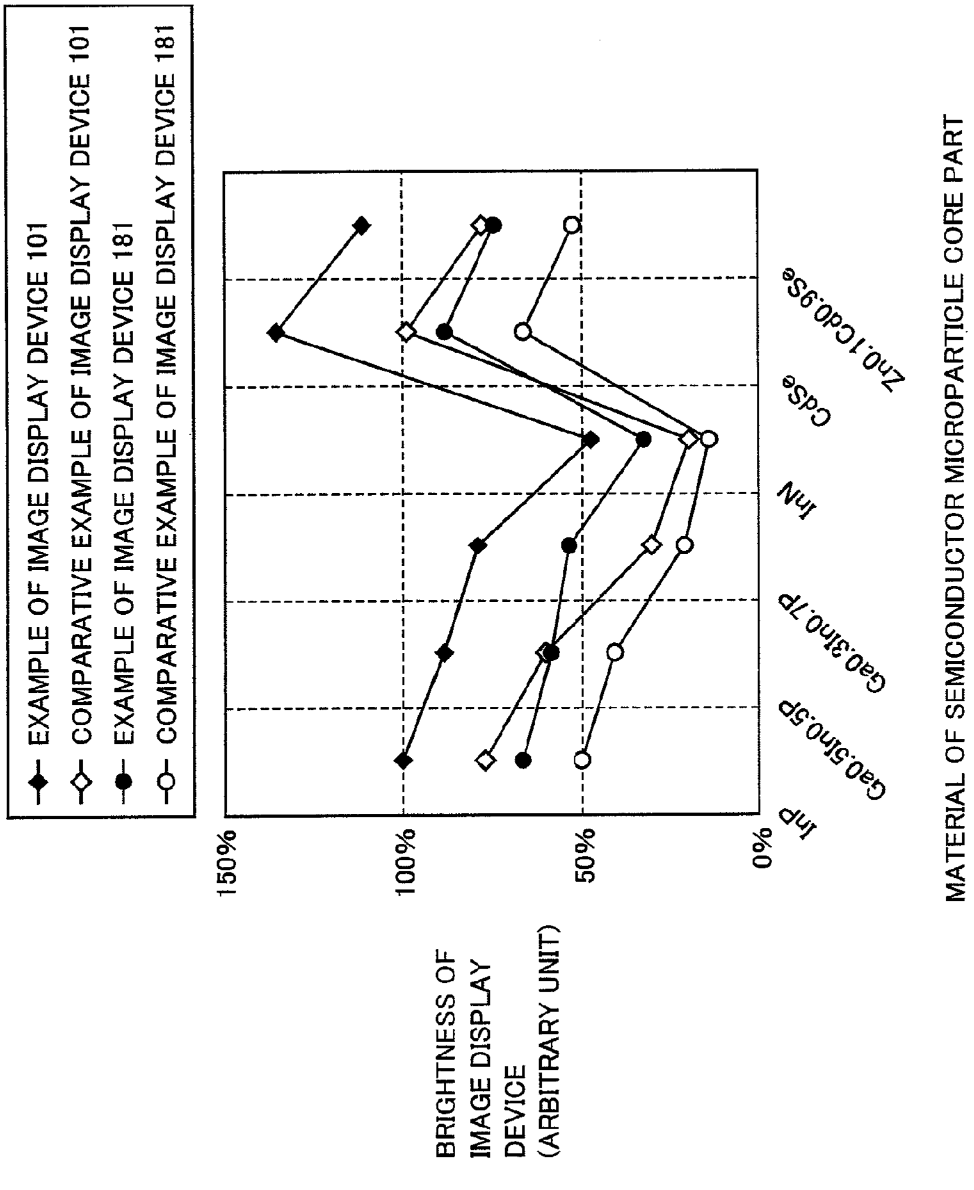
FIG. 30 is a graph showing a core part material and brightness in an image display device of the present invention.

FIG. 30 is a graph showing relation of brightness of image display device 101 and image display device 181 using a semiconductor phosphor microparticle whose shell part material is ZnS and ZnSe. The horizontal axis plots core part material of semiconductor phosphor microparticle, and the vertical axis plots relative value of brightness of image display device. As can be seen from FIG. 30, it is demonstrated that luminous efficiency is higher when ZnSe is used than ZnS is used as a material of the shell part in every case where the material of core part is InP, GaInP, InN, GaInN, CdSe, and ZnCdSe. It can be found that when the shell part of semiconductor phosphor microparticle absorbs excitation light, concentration quenching is suppressed and brightness of the image display device increases regardless of the core part material of the semiconductor phosphor microparticle.

<<Examination of Emission Half-Value Width of Semiconductor Phosphor Microparticle>>

In the following, influence of an emission half-value width of a semiconductor phosphor microparticle on an NTSC ratio of the image display device of the present invention will be examined.

Figure 31:
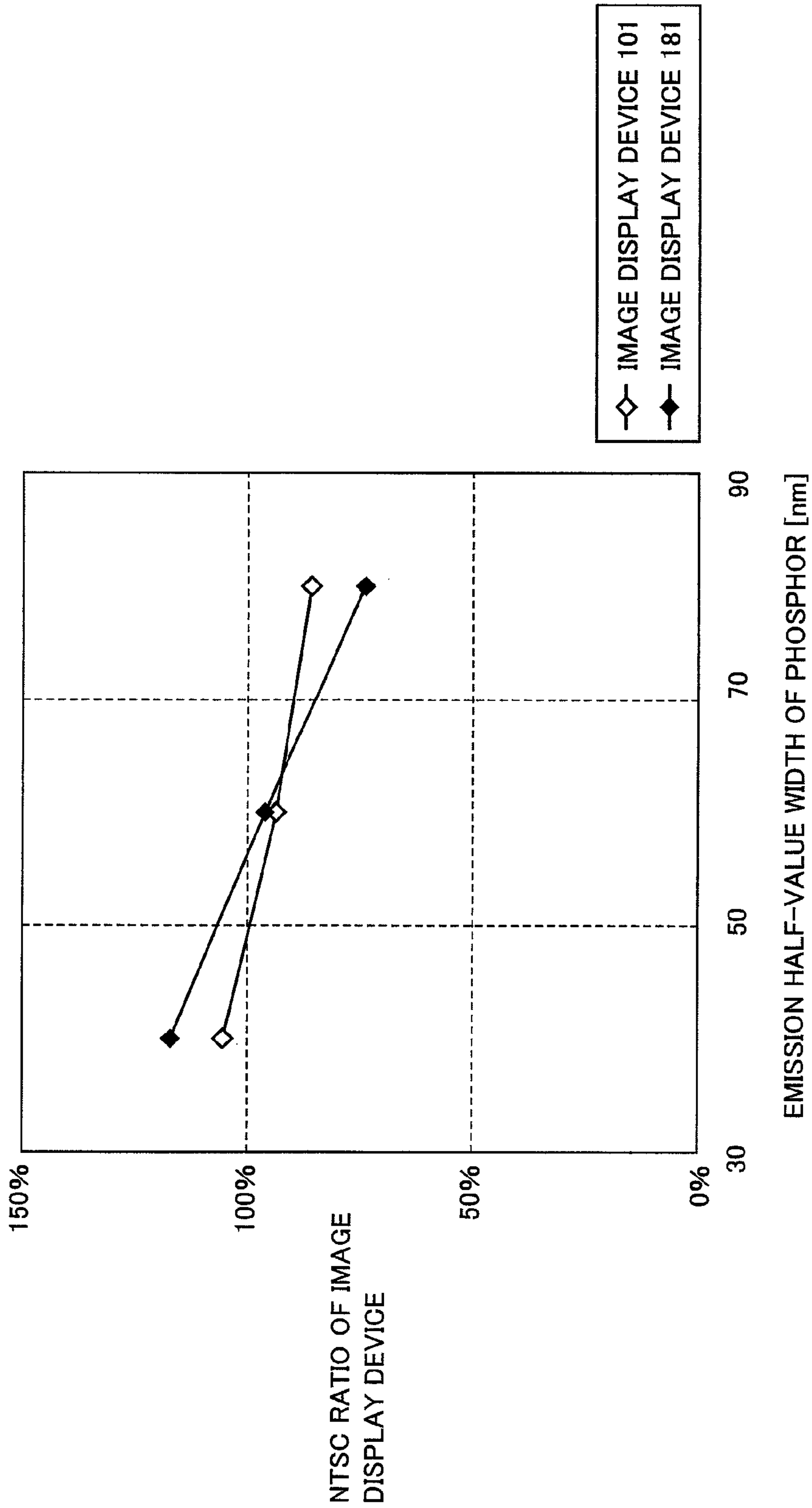
FIG. 31 is a graph showing a half-value width of phosphor and an NTSC ratio in an image display device of the present invention.

FIG. 31 is a graph plotting characteristics of image display device 101 including red and green luminescent two kinds of InP/ZnSe semiconductor phosphor microparticles and a blue semiconductor light emitting diode element, and image display device 181 including red and green luminescent two kinds of InP/ZnSe semiconductor phosphor microparticles, and a blue luminescent organic electroluminescence element. The horizontal axis plots an emission half-value width of InP/ZnSe semiconductor phosphor microparticle, and the vertical axis plots an NTSC ratio of image display device.

As seen in FIG. 31, it can be found that as the emission half-value width of the semiconductor phosphor microparticle increases, the NTSC ratio of the image display device decreases. This is attributable to the fact that color purity of each chromaticity point of red, green and blue of the image display device decreases as the emission half-value width of the semiconductor phosphor microparticle increases.

<<Examination of Number of Phosphors>>

In the following, influence of the number of semiconductor phosphor microparticle forming the light emitting device of the present invention on an NTSC ratio of the image display device will be examined.

Figure 32:
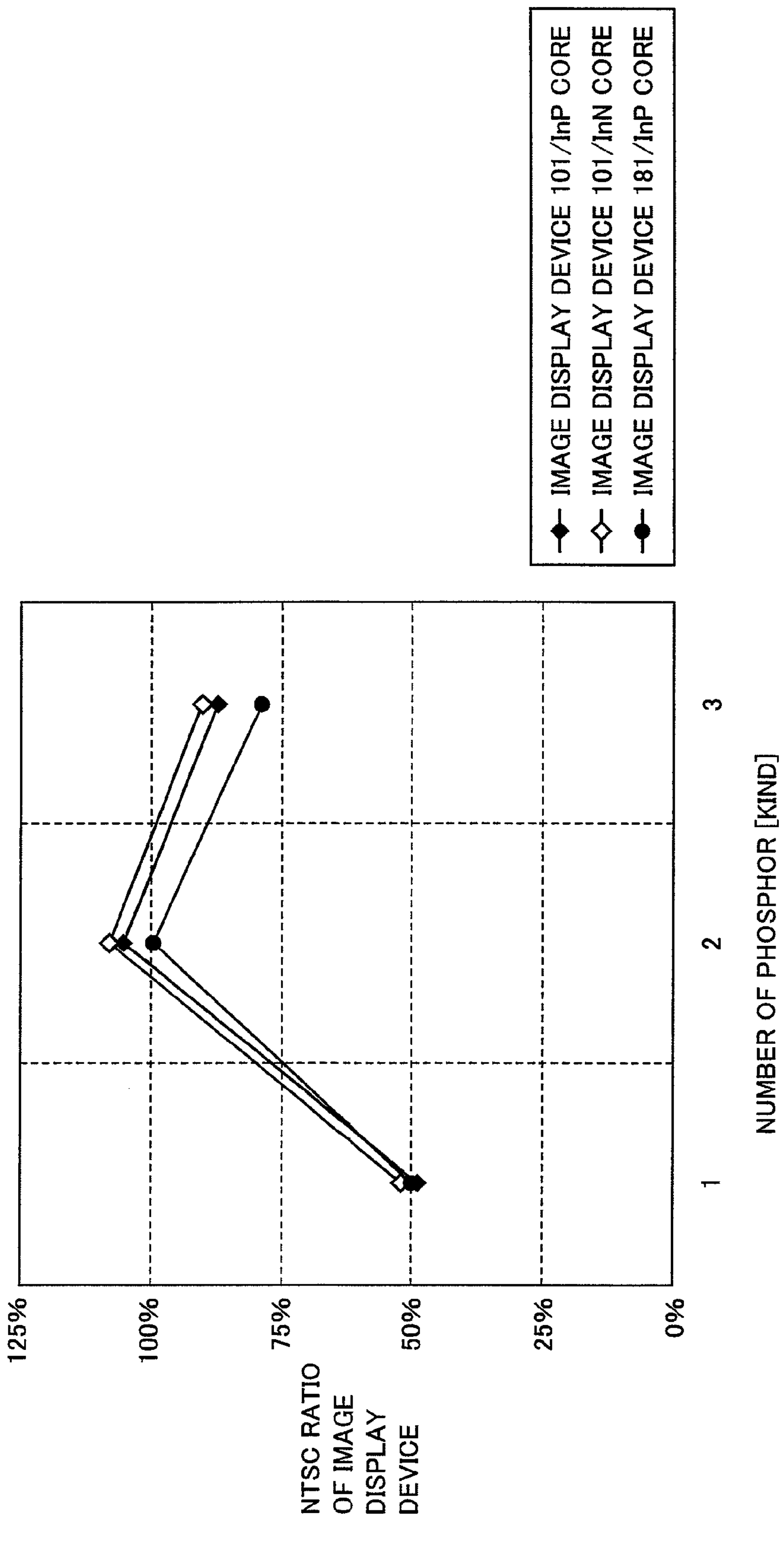
FIG. 32 is a graph showing the number of phosphor and an NTSC ratio in an image display device of the present invention.

FIG. 32 is a chart plotting characteristics of image display devices 101, 181 including a semiconductor phosphor microparticle having an InP core and an InN core, and a blue semiconductor light emitting element and a blue organic electroluminescence element. In FIG. 32, the horizontal axis represents number of phosphors, and vertical axis represents an NTSC ratio of image display device of light emitting device.

As can been seen from FIG. 32, the tendency that an NTSC ratio of image display device increases as the number of kinds of semiconductor phosphor microparticles increases. This is attributable to the fact that color purity of each chromaticity point of red, green and blue of the image display device increases as the number of kinds of phosphor increases.

While description has been made for the examples of the present invention, it is essentially contemplated that configurations of the above-described examples are appropriately combined.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A light emitting device comprising:

a light emitting element, and a semiconductor phosphor microparticle having a core/shell structure having a core part and a shell part that covers the core part and absorbs at least a part of the light emitted by the light emitting element, wherein the shell part of the semiconductor phosphor microparticle is ZnSe or SiC.

2. The light emitting device according to claim 1, wherein bandgap energy of the shell part of the semiconductor phosphor microparticle is smaller than light energy emitted from the light emitting element.

3. The light emitting device according to claim 1, wherein bandgap energy of the shell part of the semiconductor phosphor microparticle is larger than bandgap energy of the core part.

4. The light emitting device according to claim 1, including two or more kinds of semiconductor phosphor microparticles having different peak wavelengths of an emission spectrum.

5. The light emitting device according to claim 4, wherein bandgap energy of the shell part of the semiconductor phosphor microparticle is larger than bandgap energy of the core part of any of the semiconductor phosphor microparticles.

6. The light emitting device according to claim 1, wherein a half-value width of an emission spectrum of the core part of the semiconductor phosphor microparticle is 80 nm or more.

7. The light emitting device according to claim 1, wherein standard deviation of particle diameter distribution of the core part of the semiconductor phosphor microparticle is 20% or more of mean particle diameter of the core part of the semiconductor phosphor microparticle.

8. The light emitting device according to claim 1, wherein the core part of the semiconductor phosphor microparticle is a group II-VI semiconductor material or a group III-V semiconductor material.

9. The light emitting device according to claim 8, wherein the core part of the semiconductor phosphor microparticle is formed of ternary or higher mixed crystal.

10. The light emitting device according to claim 8, wherein the core part of the semiconductor phosphor microparticle is either of InP, InGaP, InN, and InGaN.

11. The light emitting device according to claim 1, wherein the semiconductor phosphor microparticle has a plurality of shell parts.

12. The light emitting device according to claim 1, wherein the semiconductor phosphor microparticle is covered with a translucent member.

13. The light emitting device according to claim 1, wherein the light emitting element is a semiconductor light emitting diode element or a semiconductor laser diode element.

14. The light emitting device according to claim 13, wherein the semiconductor light emitting diode element or the semiconductor laser diode element is formed of a GaN-based material.

15. The light emitting device according to claim 1, wherein the light emitting element is an organic electroluminescence element.

16. The light emitting device according to claim 13, wherein an emission spectrum of the light emitting element has a peak wavelength in the range of 420 to 480 nm.

17. The light emitting device according to claim 13, wherein an emission spectrum of the light emitting element has a peak wavelength in the range of 350 to 420 nm.

18. The light emitting device according to claim 1, including a blue luminescent light emitting element, and a red luminescent semiconductor phosphor microparticle and a green luminescent semiconductor phosphor microparticle.

19. The light emitting device according to claim 1, including a UV to blue-violet luminescent light emitting element, a blue luminescent semiconductor phosphor microparticle, a green luminescent semiconductor phosphor microparticle and a red luminescent semiconductor phosphor microparticle.

20. An image display device comprising:

a light emitting element, and a semiconductor phosphor microparticle having a core/shell structure having a core part and a shell part that covers the core part and absorbs at least a part of light emitted by the light emitting element, wherein the shell part of the semiconductor phosphor microparticle is ZnSe or SiC.

21. The image display device according to claim 20, wherein a half-value width of an emission spectrum of the core part of the semiconductor phosphor microparticle is 40 nm or less.

22. The image display device according to claim 20, wherein standard deviation of particle diameter distribution of the core part of the semiconductor phosphor microparticle is 15% or less of mean particle diameter of the core part of the semiconductor phosphor microparticle.

23. The image display device according to claim 20, comprising a white light emitting device including the light emitting element and the semiconductor phosphor microparticle, and a color filter.

24. The image display device according to claim 20, comprising the light emitting element, and a wavelength conversion member including the semiconductor phosphor microparticle.

25. A light emitting device comprising:

a light emitting element, and a semiconductor phosphor microparticle having a core/shell structure having a core part and a shell part that covers the core part and absorbs at least a part of the light emitted by the light emitting element, and including a UV to blue-violet luminescent light emitting element, a blue luminescent semiconductor phosphor microparticle, a green luminescent semiconductor phosphor microparticle and a red luminescent semiconductor phosphor microparticle.

* * * * *